US005563425A

United States Patent [19]
Saito et al.

[11] Patent Number: 5,563,425
[45] Date of Patent: Oct. 8, 1996

[54] PHOTOELECTRICAL CONVERSION DEVICE AND GENERATING SYSTEM USING THE SAME

[75] Inventors: Keishi Saito, Kyoto; Tatsuyuki Aoike, Nara; Masafumi Sano, Nara; Mitsuyuki Niwa, Nara; Ryo Hayashi, Nara; Masahiko Tonogaki, Tokyo, all of Japan

[73] Assignee: Canon Kabushiki Kaisha, Tokyo, Japan

[21] Appl. No.: 149,749

[22] Filed: Nov. 10, 1993

[30] Foreign Application Priority Data

Nov. 16, 1992 [JP] Japan ................................ 4-305221

[51] Int. Cl.$^6$ .......................... H01L 29/04; H01L 31/36; H01L 31/376
[52] U.S. Cl. ................. 257/53; 257/55; 257/56; 257/458; 257/656; 136/255; 136/258; 136/261
[58] Field of Search .................. 257/656, 458, 257/55, 56, 53, 76; 136/255, 261, 258

[56] References Cited

U.S. PATENT DOCUMENTS

| 4,398,054 | 8/1983 | Madan | 257/53 X |
|---|---|---|---|
| 4,471,155 | 9/1984 | Mohr et al. | 136/258 |
| 4,542,256 | 9/1985 | Wiedemann | 257/56 X |
| 4,782,376 | 11/1988 | Catalano | 357/30 |
| 4,816,082 | 3/1989 | Guha et al. | 136/249 |
| 4,954,182 | 9/1990 | Ovshinsky et al. | 257/55 X |
| 5,104,455 | 4/1992 | Yokota et al. | 136/249 |

FOREIGN PATENT DOCUMENTS

| 0500067 | 5/1982 | European Pat. Off. | H01L 31/075 |
|---|---|---|---|
| 0180781 | 5/1986 | European Pat. Off. | H01L 31/18 |
| 0092925 | 11/1993 | European Pat. Off. | H01L 31/06 |
| 59-204049 | 11/1984 | Japan | 257/55 |
| 60-93450 | 5/1985 | Japan | 257/55 |
| 60-140245 | 7/1985 | Japan | 257/55 |
| 60-140246 | 7/1985 | Japan | 257/55 |
| 60-140256 | 7/1985 | Japan | 257/55 |

OTHER PUBLICATIONS

Bragagnolo et al., "Optimum Deposition Conditions . . . System", Conf. Rec. 19th IEEE Photovoltaic Specialists Conf., 1987, pp. 878–883.
Yoshida et al., "Efficiency Improvement in Amorphous-–SiGe:H Solar . . . " Conf. Rec. 19th IEEE Photovoltaic Specialists Conf., 1987, pp. 1101–1106.
Hiroe et al., "Stability and Terrestrial Application . . . Cells", Conf. Rec. 19th IEEE Photovoltaic Specialists Conf., 1987, pp. 1111–1116.
Sato et al., "Preparation of High Quality a–SiGe:H Films . . . Cells", Conf. Rec., 19th IEEE Photovoltaic Specialiest Conf., 1988, pp. 73–78.

(List continued on next page.)

Primary Examiner—William Mintel
Attorney, Agent, or Firm—Fitzpatrick, Cella, Harper & Scinto

[57] ABSTRACT

An object of the present invention is to provide a photoelectrical conversion device in which recombination of carriers excited by light is prevented and the open voltage and the carrier range of positive holes are improved and to provide a generating system using the photoelectrical conversion device. The photoelectrical conversion device includes a p-layer, an i-layer, and an n-layer, wherein the photoelectrical conversion device being formed by stacking the p-layer, the i-layer and the n-layer each of which is made of non-single-crystal silicon semiconductor, the i-layer contains germanium atoms, the band gap of the i-layer is smoothly changed in a direction of the thickness of the i-layer, the minimum value of the band gap is positioned adjacent to the p-layer from the central position of the i-layer and both of a valence control agent to serve as a donor and another valence control agent to serve as an acceptor are doped into the i-layer. Further, at least either of the p-layer or the n-layer is formed into a stacked structure consisting of a layer mainly composed of group III elements of the periodic table and/or group V elements of the same and a layer containing the valence control agent and mainly composed of silicon atoms.

87 Claims, 22 Drawing Sheets

OTHER PUBLICATIONS

Guha et al., "A Novel Design for Amorphous Silicon Alloy Solar Cells", Conf. Rec., 20th IEEE Photovoltaic Specialists Conf., 1988, pp. 79–84.

Pawliliewicz et al., "Numerical Modeling of Multijunctions, ... Cells", Conf. Rec., 20th IEEE Photovoltaic Specialists Conf., 1988, pp. 251–255.

Pawlikiewicz et al., "Numerical Modeling of Multijunction, Amporphous Silicon Based P–I–N Solar Cells," The Conference Record of the Twentieth IEEE Photovoltaic Specialists Conference–1988, vol. I, Las Vegas Nevada, Sep. 26–30, 1988, pp. 251–253.

n-TYPE LAYER SIDE $E_c$ $\frac{1}{2} E_G$ $E_v$ $E_c$ $\frac{1}{2} E_G$ $E_v$

PHOTOELECTRICAL CONVERSION DEVICE AND GENERATING SYSTEM USING THE SAME

BACKGROUND OF THE INVENTION

1. Field of the Invention

The present invention relates to a photoelectrical conversion device made of non-single-crystal material and a generating system using the same.

More particularly, the present invention relates to a pin-type photoelectrical conversion device having an i-type layer, in which the band gap is changed, and a generating system using the same.

2. Related Background Art

Hithero, a variety of disclosures have been made about the structure of a pin-type photovoltaic device made of non-single-crystal silicon semiconductor material of a type have an i-layer containing silicon atoms and germanium atoms and including a changed band gap.

For example, the following suggestions have been made:

(1) "Optimum deposition conditions for a-(Si, Ge):H using a triode-configurated rf glow discharge system" J. A. Bragagnolo, P. Littlefield, A. Mastrovito and G. Storti, Conf. Rec. 19th IEEE Photovoltaic Specialist Conference-1987 pp. 878, (2) "Efficiency improvement in amorphous-SiGe:H solor cells and its application to tandem type solar cells" S. Yoshida, S. Yamanaka, M. Konagai and K. Takahashi, Conf. Rec. 19th IEEE Photovoltaic Specialists Conference-1987 pp. 1101, (3) "Stability and terrestrial application of a-Si tandem type solar cells", A. Hiroe, H. Yamagishi, H. Nishio, M. Kondo, and Y. Tawada, Conf. Rec. 19th IEEE Photovoltaic Specialists Conference-1987 pp. 1111, (4) "Preparation of high quality a-SiGe:H Films and its application to the high efficiency triple-junction amorphous solar cells" K. Sato, K. Kawabata, S. Terazono, H. Sasaki, M. Deguchi, T. Itagaki, H. Morikawa, M. Aiga and K. Fujikawa, Conf. Rec. 20th IEEE Photovoltaic Specialists Conference-1988 pp. 73, (5) U.S. Pat. No. 4,471,155, (6) U.S. Pat. No. 4,782,376, and (7) U.S. Pat. No. 4,816,082.

Theoretical research of the characteristics of the photovoltaic device having the changed band gap are disclosed in:

(8) "A novel design for amorphous silicon alloy solar cells" S. Guha, J. Yang, A. Pawlikiewicz, T. Glatfelter, R. Ross, and S. R. Ovshinsky, Conf. Rec. 20th IEEE Photovoltaic Specialists Conference-1988 pp. 79, and (9) "Numerical modeling of multijunction, amorphous silicon based P-I-N solar cells" A. H. Pawlikiewicz and S. Guha, Conf. Rec. 20th IEEE photovoltaic Specialists Conference-1988 pp. 251.

The foregoing conventional photovoltaic device has a layer having a changed band gap and inserted therein in order to prevent recombination of photovoltaic carriers occurring in the vicinity of the interface between a p-layer and an i-layer and that between an n-layer and the i-layer, to raise the open voltage level and to improve the carrier range of the positive holes.

There is a desire to improve the degree of recombination of the photovoltaic carriers, the open voltage level and the carrier range of the positive hole of the conventional photovoltaic device of the type containing silicon atoms and germanium atoms and having the changed band gap as described above.

Further, the conventional photovoltaic device encounters a problem that the conversion efficiency deteriorates if the photovoltaic device is irradiated with weak light.

What is worse, the conventional photovoltaic device has a problem that the photoelectrical conversion efficiency deteriorates if the conventional photovoltaic device having a deformed i-layer is annealed in a place where vibrations take place.

SUMMARY OF THE INVENTION

An object of the present invention is to provide a photovoltaic device capable of overcoming the foregoing conventional problems. That is, an object of the present invention is to provide a photovoltaic device in which recombination of carriers excited by light is prevented and the open voltage and the carrier range of positive holes are improved.

Another object of the present invention is to provide a photovoltaic device exhibiting an improved conversion efficiency even if the intensity of light for use to irradiate the photovoltaic device is weak.

Another object of the present invention is to provide a photovoltaic device, the photoelectrical conversion efficiency of which cannot easily deteriorate even the device is annealed while being vibrated for a long time.

Another object of the present invention is to provide a generating system using the photovoltaic device which achieve the foregoing objects.

The present invention was found as a result of energetic study performed to overcome the foregoing problems.

According to one aspect of the present invention, there is provided a photoelectrical conversion device comprising: a p-layer; an i-layer; and an n-layer, wherein the photoelectrical conversion device is formed by stacking the p-layer, the i-layer and the n-layer each of which is made of non-single-crystal silicon semiconductor, the i-layer contains germanium atoms, the band gap of the i-layer is smoothly changed in a direction of the thickness of the i-layer, the minimum value of the band gap is positioned adjacent to the p-layer and both of a valence control agent to serve as a donor and another valence control agent to serve as an acceptor are doped into the i-layer.

According to one aspect of the present invention, there is provided a photoelectrical conversion device comprising: a p-layer; an i-layer; and an n-layer, wherein the photoelectrical conversion device being formed by stacking the p-layer, the i-layer and the n-layer each of which is made of non-single-crystal silicon semiconductor, the i-layer contains germanium atoms, the band gap of the i-layer is smoothly changed in a direction of the thickness of the i-layer, the minimum value of the band gap is positioned adjacent to the p-layer and at least either of the p-layer or the n-layer is formed into a stacked structure consisting of a layer mainly composed of group III elements of the periodic table and/or group V elements of the same and a layer containing the valence control agent and mainly composed of silicon atoms.

According to one aspect of the present invention, there is provided a photoelectrical conversion device according to the present invention which comprises: a p-layer; an i-layer; and an n-layer, wherein the photoelectrical conversion device is formed by stacking the p-layer, the i-layer and the n-layer each of which is made of non-single-crystal silicon semiconductor, the i-layer contains germanium atoms, the band gap of the i-layer is smoothly changed in a direction of the thickness of the i-layer, the minimum value of the band gap is positioned adjacent to the p-layer, both of a valence control agent to serve as a donor and another valence control agent to serve as an acceptor are doped into the i-layer and at least either of the p-layer or the n-layer is formed into a stacked structure consisting of a layer mainly composed of group III elements of the periodic table and/or group V elements of the same and a layer containing the valence control agent and mainly composed of silicon atoms.

It is preferable that the thickness of the layer mainly composed of group III elements of the periodic table and/or group V elements of the same is 1 nm or less.

As a preferred aspect of the photovoltaic device according to the present invention, the maximum value of the band gap of the i-layer is present in at least any one of interfaces among the i-layer, the p-layer and the n-layer, and the region of the maximum value of the band gap is 1 to 30 nm.

As a preferred aspect of the photovoltaic device according to the present invention, the valence control agents to serve as the donor and the acceptor are a group III element of the periodic table and/or group V element and the valence control agents are distributed in the i-layer.

As a preferred aspect of the photovoltaic device according to the present invention, the i-layer contains oxygen atoms and/or nitrogen atoms.

As a preferred aspect of the photovoltaic device according to the present invention, the content of hydrogen to be contained in the i-layer is changed to correspond to the content of silicon atoms.

As a preferred aspect of the photovoltaic device according to the present invention, the i-layer is formed by causing microwave energy and RF energy to simultaneously act, at a degree of vacuum of internal pressure of 50 mTorr or lower, on a raw material gas including a silicon-atom-contained gas and a germanium-atom-contained gas, the microwave energy is smaller than microwave energy needed to completely decompose the raw material gas, and the RF energy is larger than the microwave energy. Further, it is preferable that the silicon-atom-contained gas and the germanium-atom-contained gas are mixed at a position of 5 m or shorter away from a deposition chamber.

The system using the photoelectrical conversion device according to the present invention comprises a photoelectrical conversion device according to the present invention, a control system that detects the voltage and/or an electric current of the photoelectrical conversion device to control electric power to be supplied to a battery and/or a load, and a battery for accumulating the electric power supplied from the photoelectrical conversion device and/or supplying the electric power to an external load.

Other and further objects, features and advantages of the invention will be appear more fully from the following description.

DETAILED DESCRIPTION OF THE PREFERRED EMBODIMENTS

The present invention will now be described with reference to the drawings.

Figure 1:
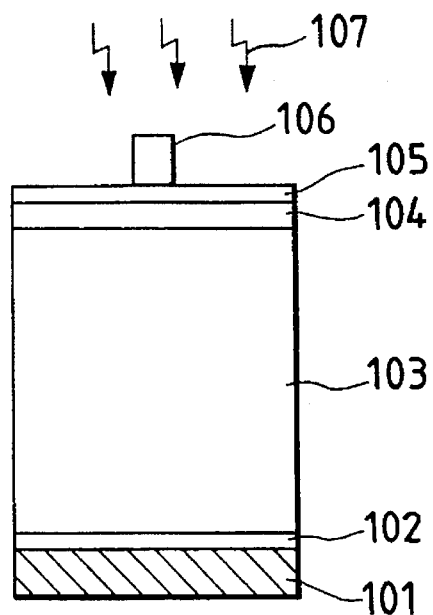
FIG. 1 is a schematic view which illustrates a layer structure of a photovoltaic device according to the present invention.

FIG. 1 is a schematic view which illustrates a photovoltaic device according to the present invention. Referring to FIG. 1, the photoelectric conversion device according to the present invention comprises a conductive substrate 101 having a light reflecting layer and a light reflection enhancing layer, a silicon non-single-crystal semiconductor layer 102 (hereinafter sometimes called an "n-layer") having a n-type conductivity, a non-single-crystal semiconductor layer 103 (hereinafter sometimes called an "i-layer") composed of silicon atoms and germanium atoms and having substantially i-type conductivity, a silicon non-single-crystal semiconductor layer 104 (hereinafter sometimes called a "p-layer") having p-type conductivity and a collecting electrode 106.

Figure 2:
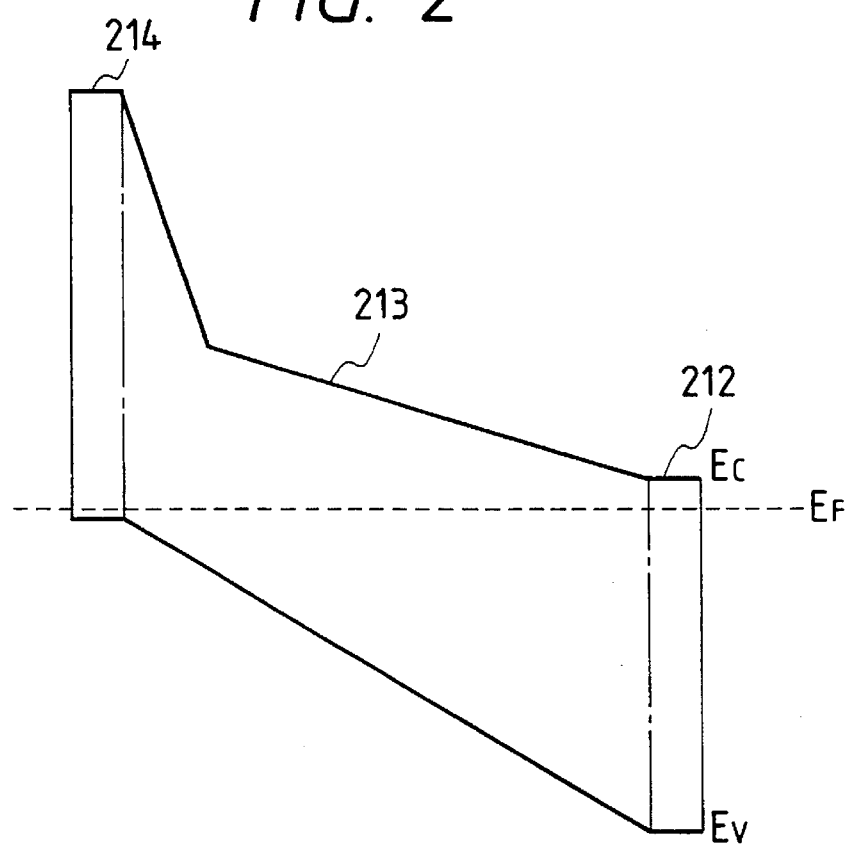
FIG. 2 is a schematic view which illustrates the band of a thermal equilibrium state of the photovoltaic device according to the present invention.

FIG. 2 is a schematic view which illustrates the band of an example of the photovoltaic device according to the present invention and having the layer structure as shown in FIG. 1 in a thermal equilibrium state. Referring to FIG. 2, symbols EF denote Fermi level, Ec denote a conductive band and Ev denote a valence band. FIG. 2 shows a joined state where an n-type silicon non-single-crystal semiconductor layer 212, a substantially i-type non-single-crystal semiconductor layer 213 composed of silicon atoms and germanium atoms and a p-type silicon non-single-crystal semiconductor layer 214 are joined up. In the i-layer, the minimum band gap is eccentrically present adjacently to the interface between the p-layer and the i-layer. Further, the electric field of the conductive band in the i-layer adjacent to the p-layer is enlarged. As a result, the separation between electrons and positive holes can be performed efficiently and recombination of the electrons and the positive holes occurring in the vicinity of the interface between the p-layer and the i-layer can be decreased. Further, the electric field of the valence band is enlarged in a direction from the i-layer toward the n-layer. Therefore, recombination of the electrons and the positive holes excited by light in the portion adjacent to the i-layer and the n-layer can be prevented.

By simultaneously adding a valence control agent to serve as a donor and a valence control agent to serve as an acceptor into the i-layer, the carrier ranges of the electron and the positive holes can be lengthened. In particular, addition of the valence control agent to a portion where the band gap is minimized by a relatively large quantity enables the carrier ranges of electrons and the positive holes to be effectively lengthened. As a result, the intense electric field adjacent to the interface between the p-layer and the i-layer and that adjacent to the interface between the n-layer and the i-layer can be used more effectively. Therefore, the efficiency of sampling electrons and positive holes excited in the i-layer by light can significantly be improved.

Further, defective levels (so called $D^-$ and $D^+$) can be compensated by the valence control agent in the vicinity of the interface between the p-layer and the i-layer and between the n-layer and the i-layer. As a result, hopping transmission occurring via the defective levels decreases the dark current (at the time of the reverse bias). In particular, an arrangement in which the valence control agent is contained in the vicinity of the interface by a quantity larger than that contained in the i-layer realizes reduction in the internal stress, such as distortion, occurring due to rapid change of the peculiar elements in the vicinity of the interface. As a result, the defective levels adjacent to the interface can be reduced. Therefore, the open voltage and the fill factor of the photovoltaic device can be improved.

Further, the valence control agent to serve as the donor and the valence control agent to serve as the acceptor are simultaneously contained in the i-layer so that durability against deterioration occurring due to light is improved. Although its mechanism has not been cleared, the following mechanism can be considered. That is, unbounded hands generated due to the light irradiation generally act as the center of recombination, causing the characteristics of the photovoltaic device. As contrasted with this, the arrangement of the present invention in which both of the valence control agent to serve as the donor and the valence control agent to serve as the acceptor are contained in such a manner that the two types of the agents are not completely activated.

If the unbonded hands are generated due to the light irradiation, they react with the valance control agent, which has not been activated so that the unbonded hands are compensated.

Even if the intensity of light applied to the photovoltaic device is unsatisfactory, the fact that the defective levels are compensated by the balance control agent lowers the possibility of trapping of electrons and positive holes excited by light. Further, a satisfactory large photovoltaic force can be generated due to the dark current which is generated at the time of the reverse bias. Therefore, an excellent photoelectrical conversion efficiency can be attained even if the intensity of light applied to the photovoltaic device is unsatisfactory.

Further, the photoelectric conversion efficiency of the photovoltaic device according to the present invention cannot easily deteriorate even if the photovoltaic device is annealed for a long time while being vibrated. Although the detailed mechanism of the foregoing phenomenon has not been cleared yet, the following consideration can be made. The arrangement in which the band gap is continuously changed causes a necessity of changing the elements to form the photovoltaic device. It leads to a fact that distortions are accumulated in the photovoltaic device. That is, many weak bonds are present in the photovoltaic device, the weak bonds in the i-type non-single-crystal semiconductor being broken due to vibrations. As a result, the unbonded hands are formed.

However, the simultaneous addition of the valance control agent to serve as the donor and the valence control agent to serve as the acceptor improves local flexibility. As a result, the deterioration of the photoelectrical conversion efficiency of the photovoltaic device can be prevented even if the photovoltaic device is annealed for a long time while being vibrated. Further, the local flexibility is improved because the donor and the acceptor, which are not activated, are usually triode-configurated. Therefore, a consideration can be made that the deterioration of the photoelectrical conversion efficiency of the photovoltaic device can be prevented even if the photovoltaic device is annealed for a long time while being vibrated. However, the quantities of the donor and the acceptor, which are not activated, must be reduced to certain quantities because they form the defects. It is preferable that the donor and the acceptor, which are not activated, be contained by 0.1 to 100 ppm.

The p-layer of the photovoltaic device according to the present invention is formed into stacked layer structure consisting of a layer (hereinafter called a "doping layer A") mainly containing group III elements of the periodic table and a layer (hereinafter called a "doping layer B") containing the valence control agent and mainly containing silicon atoms. As a result, the light permeability of the p-layer can be improved and the specific resistance of the same can be decreased. It is preferable that the portions, which are in contact with the p-layer and the i-layer, be layers (doping layers B) each of which contains the valence control agent and which mainly contain silicon layer. As a result, defects between the i-layer and the p-layer can be prevented. It is preferable that the thickness of the doping layer A be 0.01 to 1 nm. It is preferable that the content of hydrogen contained in the doping layer A be 5% or less. In addition, it is preferable to contain the valence control agent in the doping layer B by a quantity of 150 to 10000 ppm. The foregoing requirements for the p-layer must meet applies to the n-layer.

Figure 3:
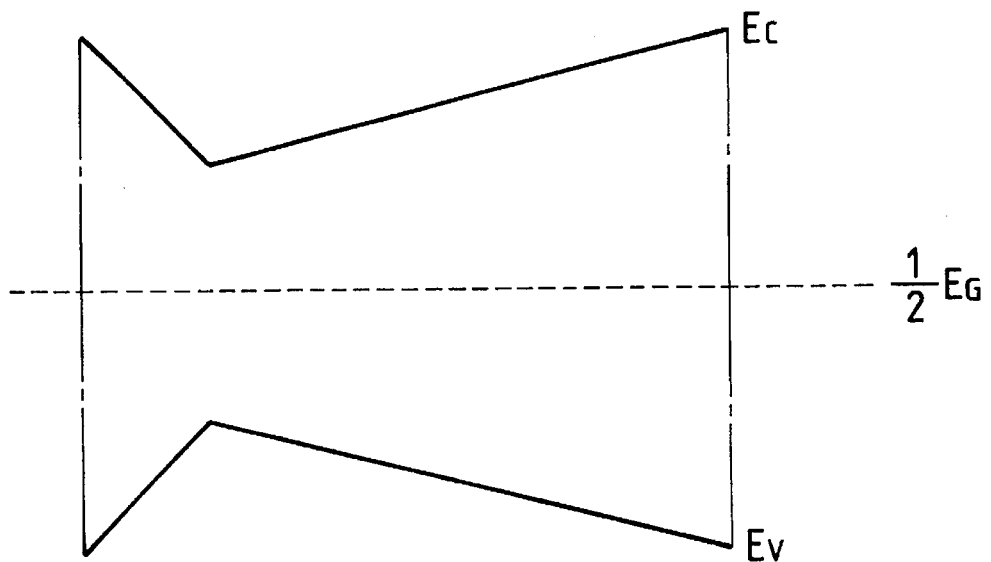
FIG. 3 is a schematic view which illustrates a change of the band gap of the photovoltaic device according to the present invention.
Figure 4:
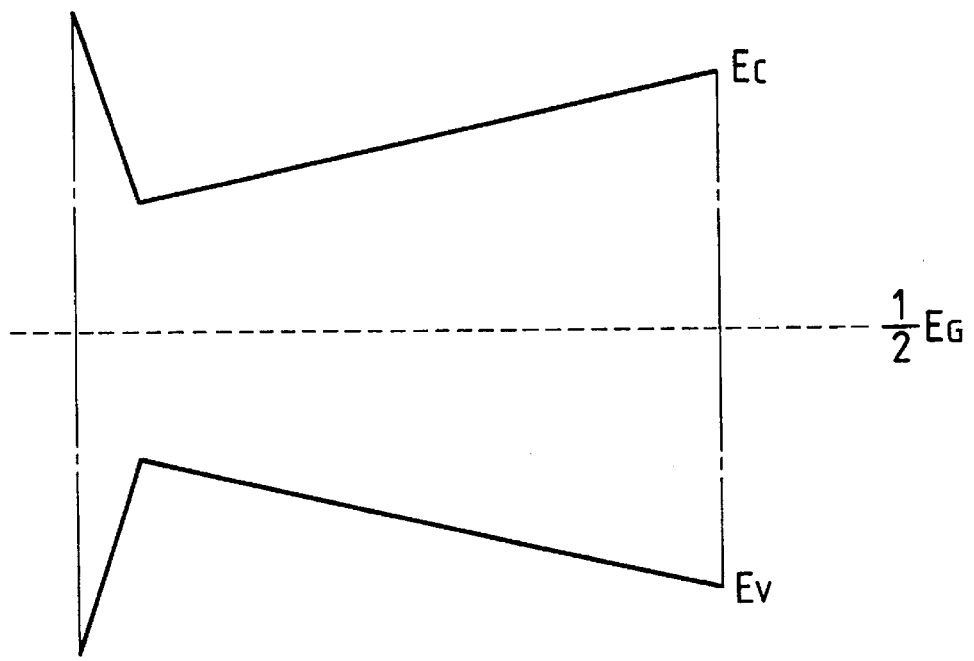
FIG. 4 is a schematic view which illustrates another change of the band gap of the photovoltaic device according to the present invention.

FIG. 3 is a schematic view which illustrates an example of the change of the band gap of the photovoltaic device according to the present invention. FIG. 3 shows the change of the band gap in the i-layer with reference to the half (Eg/2) of the band gap, wherein the right portion is the n-layer (omitted from illustration) and the left portion is the p-layer (omitted from illustration). FIG. 3 shows a structure in which the minimum value of the band gap is positioned adjacent to the p-layer and the maximum value of the band gap is present in contact with the p and n-layers. FIG. 4 is a schematic view which illustrates the change of the band gap shown similarly to that shown in FIG. 3. The structure shown in FIG. 4 is arranged in such a manner that the minimum value of the band gap is present adjacent to the p-layer (omitted from illustration) and the maximum value of the band gap is in contact with the p-layer. By employing the band gap structure shown in FIG. 4, the open voltage can be significantly raised.

FIGS. 5 to 11 respectively are schematic views which illustrate the changes of the band gap of a certain photovoltaic device including a region having the constant band gap, the region being present in the i-layer adjacent to the interface between the p-layer and the i-layer and/or the interface between the n-layer and the i-layer.

Figure 5:
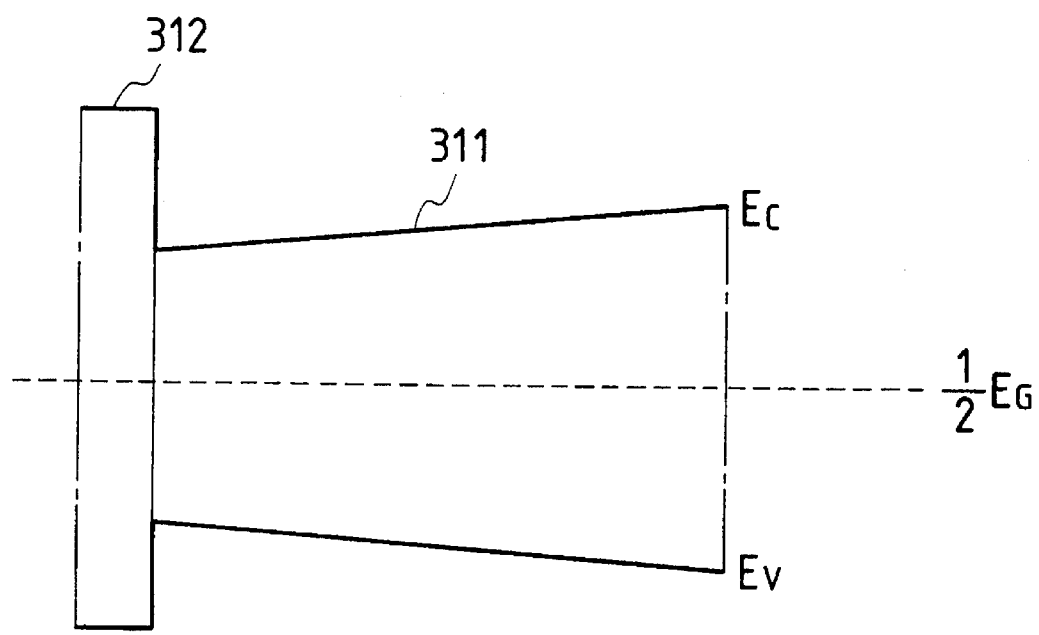
FIG. 5 is a schematic view which illustrates another change of the band gap of the photovoltaic device according to the present invention.

FIG. 5 illustrates an example of a structure in which a region 312 having a constant band gap is present in the i-layer adjacent to the p-layer and a region 311 is present in which the band gap is reduced from the position adjacent to the n-layer toward the p-layer. The minimum value of the band gap is present in the interface between the region 312 and the region 311. The bands between the regions 311 and 312 are connected discontinuously. By forming the region having the constant band gap, the dark current occurring due to the hopping transmission via the defective level at the time of the reverse bias of the photovoltaic device can be minimized. As a result, the open voltage of the photovoltaic device can be raised.

The thickness of the region 312 having the constant band gap is an essential factor. It is preferable that the thickness gap ranges from 1 to 30 nm. If the thickness of the region having the constant band gap is thinner than 1 nm, the dark current occurring due to the hopping transmission via the defective level cannot be prevented. Therefore, the open voltage of the photovoltaic device cannot be improved. If the thickness of the region having the constant band gap is thicker than 30 nm, the positive holes excited by light can easily be accumulated in the vicinity of the interface between the region 312 having the constant band gap and the region 311 having the changed band gap. Therefore, the efficiency of sampling the carriers excited by light deteriorates. That is, the short-circuit photoelectric current decreases.

Figure 6:
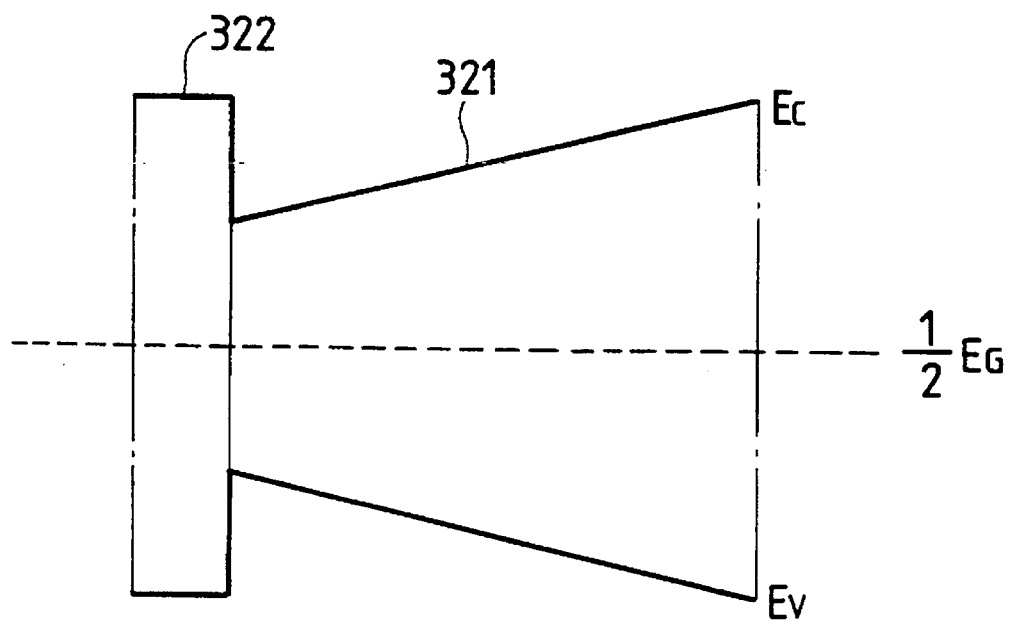
FIG. 6 is a schematic view which illustrates change of the band gap of the photovoltaic device according to the present invention.

FIG. 6 illustrates an example in which a region 322 having the constant band gap is formed in the interface between the p- and i-layers adjacent to the i-layer and the portion of a region 321 having the changed band gap adjacent to the interface between the n- and i-layers has the same band gap as that in the region 322.

Figure 7:
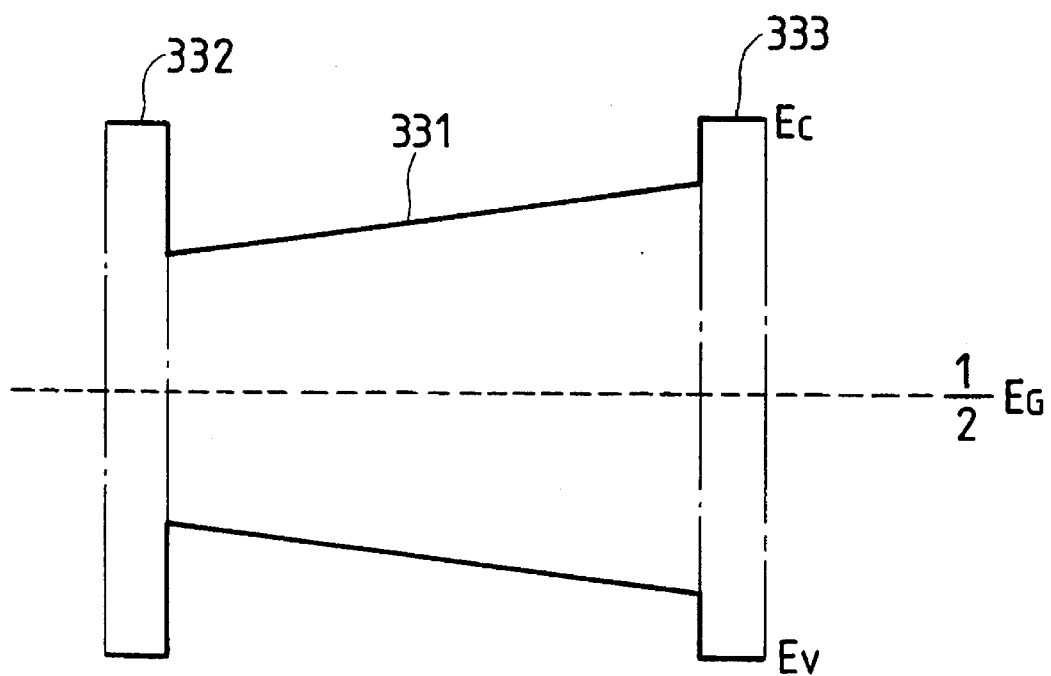
FIG. 7 is a schematic view which illustrates another change of the band gap of the photovoltaic device according to the present invention.

FIG. 7 illustrates an example in which regions 332 and 333 having constant band gaps are formed in the portions of the interface between the p- and i-layers and between the n- and i-layers adjacent to the i-layer. By forming the regions each having the constant band gap in the interfaces between the p- and i-layers and between the n- and i-layers adjacent to the i-layer, the dark current can further be reduced in the case where the reverse bias is applied to the photovoltaic device. Therefore, the open voltage of the photovoltaic device can be raised.

FIGS. 8 to 11 respectively illustrate examples of a photovoltaic device in which regions each having the constant band gap are formed in the interface between the p-layer and the i-layer and/or in the vicinity of the interface between the n-layer and the i-layer adjacent to the i-layer. Further, a region having the band gap, which is rapidly changed, is formed in a direction toward the interface between the p-layer and the i-layer or the interface between the n-layer and the i-layer.

Figure 8:
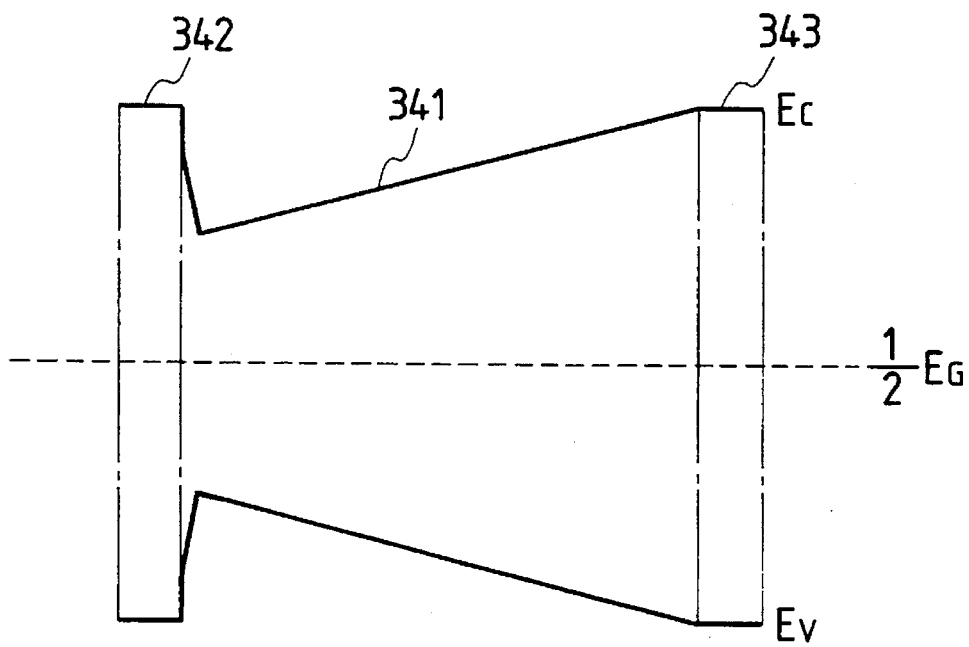
FIG. 8 is a schematic view which illustrates change of the band gap of the photovoltaic device according to the present invention.

FIG. 8 illustrates an example in which regions 342 and 343 each having the constant band gap are formed in the interface between the p-layer and the i-layer and the interface between the n-layer and the i-layer adjacent to the i-layer. Further, a region 341 having the changed band gap is formed. The region 341 has the minimum band gap position adjacent to the p-layer in such a manner that the band gap in the region 341 and the band gaps in the regions 342 and 343 are continued. By making the band gaps to be continued, electrons and the positive holes excited by light in the region of the i-layer having the changed band gap can efficiently be collected into the n- and p-layers.

In a case where the thickness of each of the regions 342 and 343 having constant band gaps is thinner than 5 nm, the region of the i-layer having the band gaps changed rapidly reduces the dark current when the reverse bias is applied to the photovoltaic device. Therefore, the open voltage of the photovoltaic device can be raised.

Figure 9:
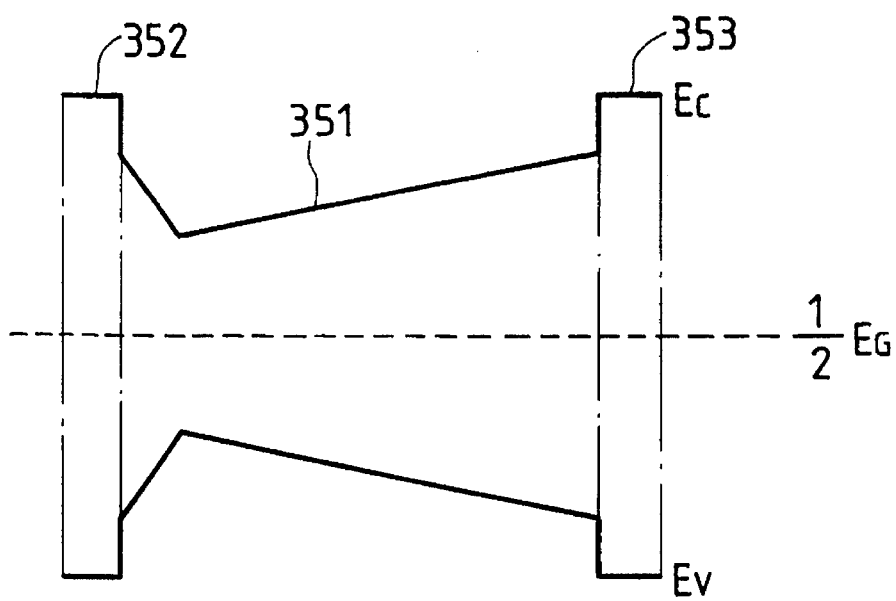
FIG. 9 is a schematic view which illustrates change of the band gap of the photovoltaic device according to the present invention.

FIG. 9 illustrates an example in which a region 351 having the changed band gap is discontinuously and relatively moderately connected to the regions 352 and 353 having constant band gaps. Since the region having the constant band gap and the regions each having the changed band gap are moderately connected to each other in a direction in which the band gap is widened, the carriers excited by light in the regions having the changed band gap are efficiently injected into the region having the constant band gap. As a result, the efficiency of sampling the carriers excited by light can be improved.

The determination of the structure whether or not the region having the constant band gap and the region having the changed band gap are continued is made depending upon the thickness of the region having the constant band gap and that of the region having the band gap changed rapidly. If the region having the constant band gap has a thin thickness of 5 nm or less and if the region having the band gap, which is rapidly changed, has a thickness of 10 nm or less, the photoelectrical conversion efficiency can be improved in the case where the region having the constant band gap and the region having the changed band gap are formed continuously. If the region having the constant band gap has a large thickness of 5 nm or more and if the region having the band gap, which is rapidly changed, has a thickness ranging from 10 to 30 nm, the photoelectrical conversion efficiency can be improved in the case where the region having the constant band gap and the region having the changed band gap are formed discontinuously.

Figure 10:
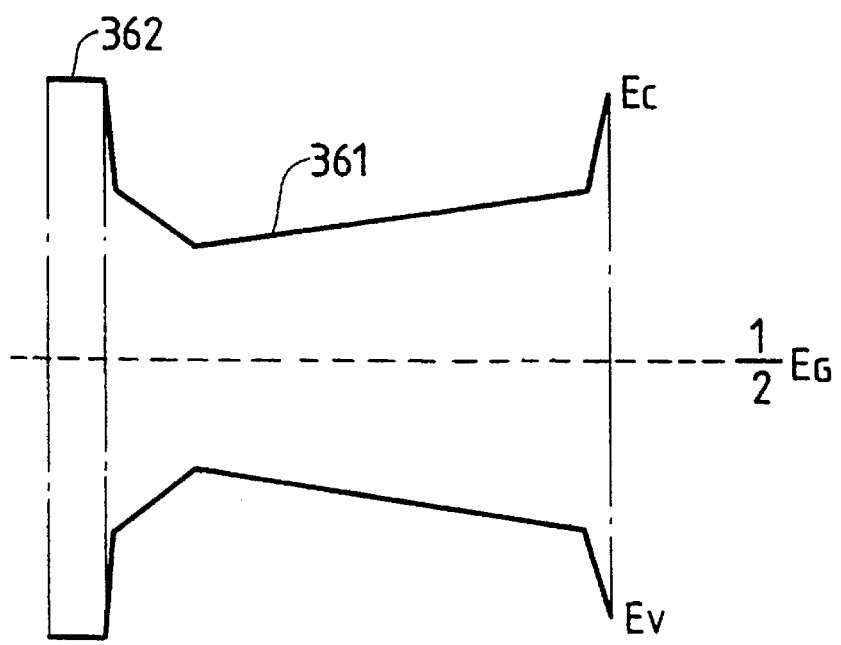
FIG. 10 is a schematic view which illustrates change of the band gap of the photovoltaic device according to the present invention.

FIG. 10 illustrates an example in which the region having the constant band gap and the region having the changed band gap are connected to each other in two steps. In the foregoing case, the minimum band gap position is connected to the region having the wide and constant band gap via the step in which the band gap is widened moderately and the step in which the band gap is rapidly widened. Therefore, the carriers excited by light, in the region in which the band gap is changed can efficiently be sampled. The structure shown in FIG. 10 comprises the i-layer adjacent to the n-layer, the i-layer having a region in which the band gap is rapidly changed toward the n-layer.

Figure 11:
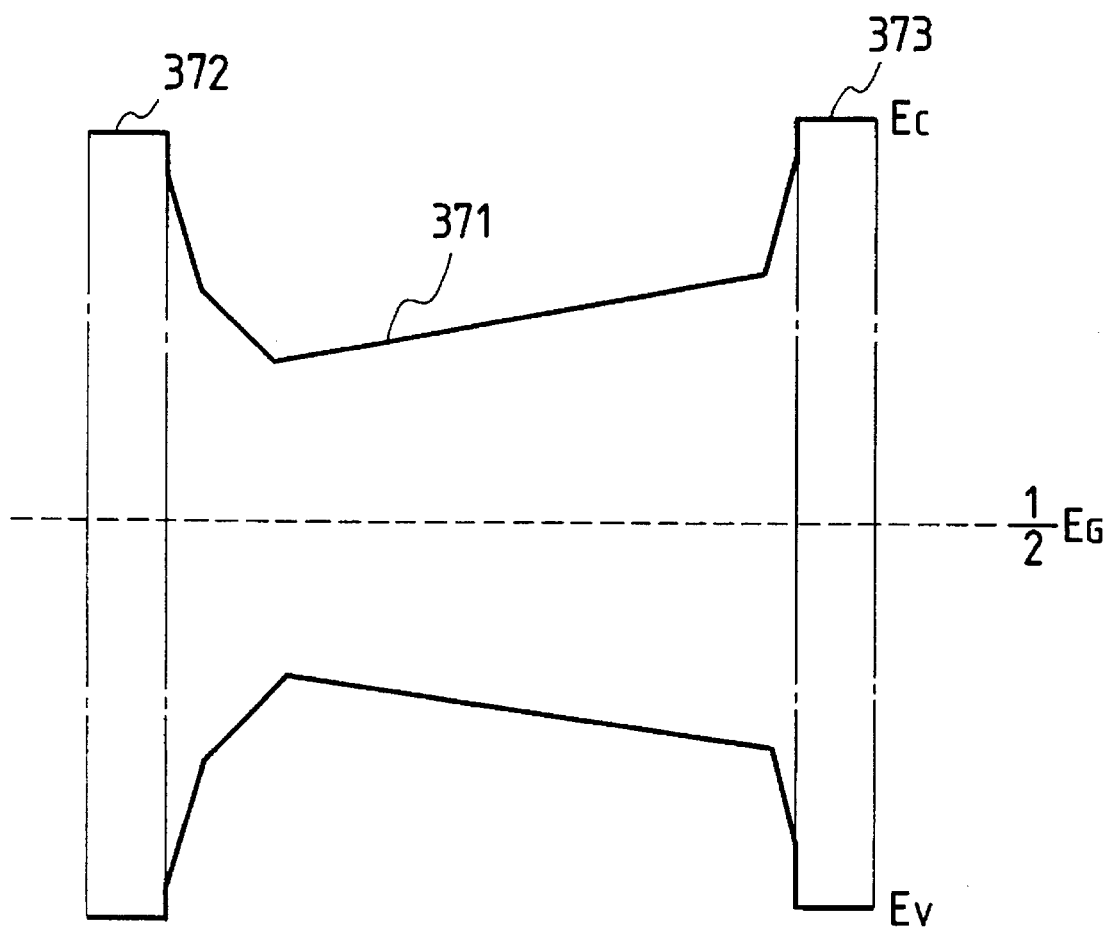
FIG. 11 is a schematic view which illustrates change of the band gap of the photovoltaic device according to the present invention.

FIG. 11 illustrates an example in which regions each having the constant band gap are formed in the two i-layers adjacent to the p-layer and the n-layer. Further, the connection to the region adjacent to the p-layer and having the constant band gap is established by changing the band gap from the region having the changed band gap via two steps. The connection to the region adjacent to the n-layer and having the constant band gap is established by rapidly changing the band gap.

By connecting the region having the constant band gap and the region having the changed band gap to each other in a state where the compositions are similar to each other, the internal distortion can be reduced. Therefore, the phenomenon of the deterioration in the photoelectrical conversion efficiency due to the breakage of the weak bonds causing the increase of the defective levels can be prevented satisfactorily even if the photovoltaic device is annealed for a long time while being vibrated. As a result, an excellent photoelectrical conversion efficiency can be maintained.

Further, the structure, in which the valence control agent is contained in the i-layer as described above, enables the carrier range of the carriers in the i-layer to be enlarged. Therefore, the efficiency of sampling the carriers can be improved. Further, the arrangement, in which the valence control agent is made enlarged in the region having the narrow band gap and made reduced in the region having the wide band gap to correspond to the change of the band gap enables the efficiency of sampling the light-excited carriers to be improved. In addition, the valence control agent is contained in the region having the constant band gap adjacent to the p-layer and the n-layer as contrasted with the region in which the band gap is minimum. Therefore, recombination of the light-excited carriers occurring adjacent to the interface between the p-layer and the i-layer and the interface between the n-layer and the i-layer can be prevented. Therefore, photoelectrical conversion efficiency of the photovoltaic device can be improved.

It is preferable that the band gap at the position in the i-layer containing silicon atoms and germanium atoms ranges from 1.1 to 1.6 eV although it must be selected depending upon the spectrum of the irradiation light.

The inclination of the tail state of the valence band of the photovoltaic device having the band gap, which is changed continuously, is an essential factor for the characteristics of the photovoltaic device. It is preferable that the inclination of the tail state at the position, at which the band gap is minimum, is smoothly continued to the inclination of the tail state at the position at which the band gap is maximum.

Although the description has been made about the pin-structure photovoltaic device, the foregoing arrangement may be also applied to a photovoltaic device having a plurality of stacked pin structures, such as a double cell photovoltaic device having a pin-pin structure or a triple cell photovoltaic device having a pin-pin-pin structure.

Figure 12:
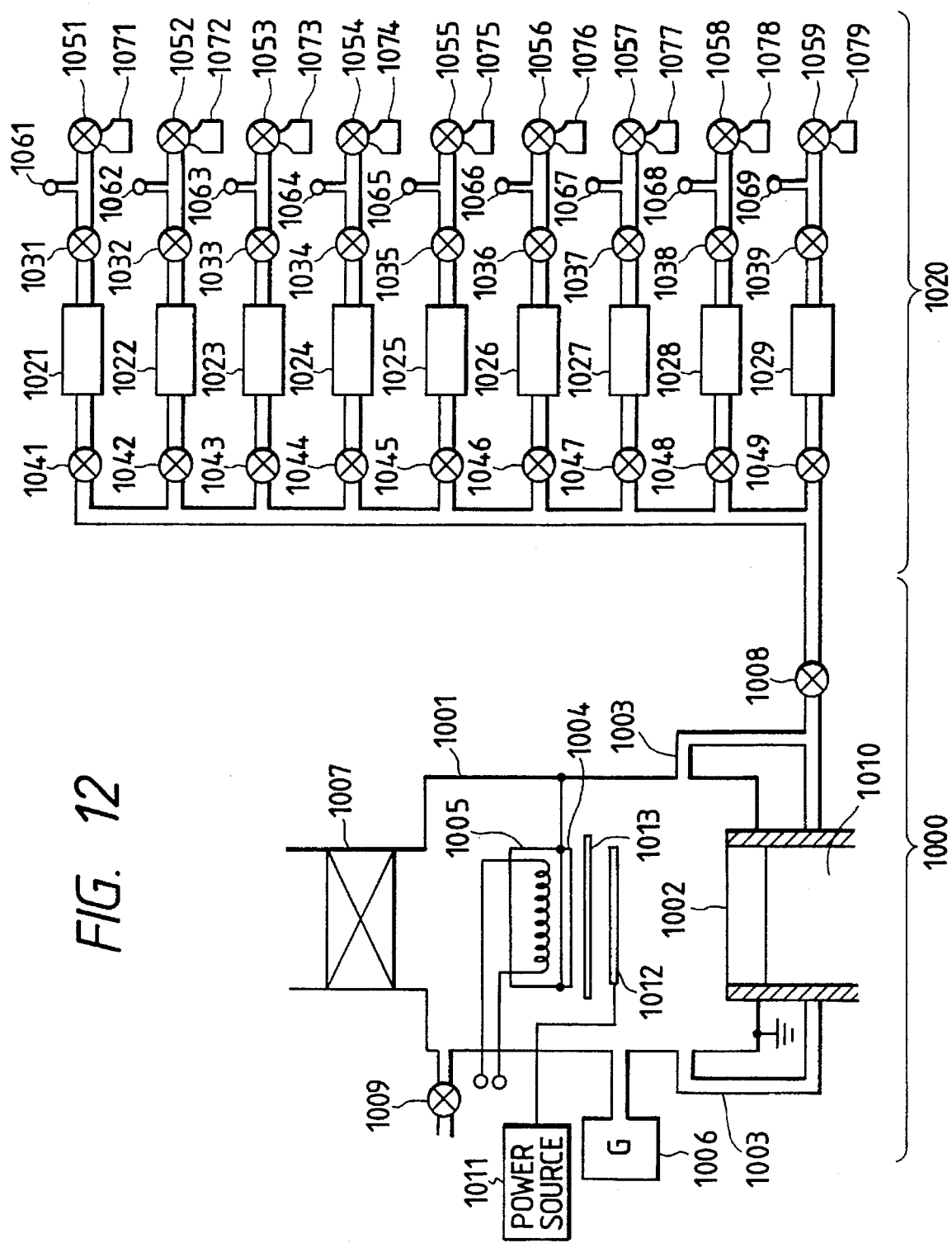
FIG. 12 is a schematic view which illustrates an example of an apparatus for manufacturing the photovoltaic device according to the present invention adapted to a microwave plasma CVD method.

FIG. 12 is a schematic view which illustrates a deposition film forming apparatus adaptable to a method of forming a photovoltaic device deposited film according to the present invention. The deposited film forming apparatus comprises a deposition chamber 1001, a dielectric window 1002, a gas introduction pipe 1003, a substrate 1004, a heater 1005, a vacuum meter 1006, a conductance valve 1007, a sub-valve 1008, a leak valve 1009, a wave-guide portion 1010, a bias power source 1011, a bias rod 1012, a shutter 1013, a raw material gas supply apparatus 1020, a mass-flow controllers 1021 to 1029, gas introduction valves 1031 to 1039, valves 1051 to 1059 of raw material gas cylinders, pressure regulators 1061 to 1069 and the raw material gas cylinders 1071 to 1079.

Although the deposition mechanism in the preferred text method of depositing the photovoltaic device according to the present invention has not be cleared yet, the following consideration can be made.

By causing microwave energy having a energy smaller than microwave energy needed to completely decompose the raw material gas to act on the raw material gas, large RF energy can, together with the microwave energy, be acted on the raw material gas. As a result, activating species suitable to form the deposited film can be selected. Further, a state where the internal pressure of the deposition chamber for decomposing the raw material gas is 50 mTorr or lower enables the mean free process for the activating species suitable to forming excellent deposited film to be lengthened sufficiently. Therefore, the gas-phase reactions can be satisfactorily prevented. If the internal pressure in the deposition chamber is 50 mTorr or lower, the RF energy does not affect the decomposition of the raw material gas but controls the potential between the plasma in the deposition chamber and the substrate. That is, the low potential (the plasma portion is positive and the substrate portion is negative) between the plasma and the substrate realized in microwave CVD method can be raised by simultaneously supplying RF energy and microwave energy.

It can be considered that the fact that the plasma potential is high with respect to that of the substrate causes the activating species decomposed by microwave energy to be deposited on the substrate and positive ions accelerated by the plasma potential collide with the substrate. As a result, the relaxation reactions in the surface of the substrate are enhanced so that an excellent deposited film is obtained. The foregoing effect is significantly enhanced if the deposition rate is several nm/sec or higher.

Since RF wave has a frequency higher than that of DC wave, the distributions of the ionized ions and electrons determine the difference between the potential of the plasma and that of the substrate. That is, the synergetic state of the ions and the electrons determines the difference between the potential of the substrate and that of the plasma. Therefore, an effect can be obtained in that spark cannot easily take place in the deposition chamber. As a result, stable glow discharge can be maintained for a long time longer than 10 hours.

Further, the flow and the flow rate of the raw material gas are changed with time or spatially at the time of depositing the layer having the changed band gap. Therefore, the case where DC is used must adequately change the DC voltage with time or spatially. However, the deposited film forming method according to the present invention enables the ratio of ions to be changed due to the change of the flow and the flow rate of the raw material gas with time or the spatial change of the same. In synchronization with this, the self-bias of RF is automatically changed. If the flow and the flow rate of the raw material gas is changed by applying RF to the bias rod, the discharge can significantly be stabilized as compared with the DC bias.

In order to realized a desired band gap change in the deposited film forming method, it is preferable to mix a silicon-atom-contained gas and a germanium-contained gas at a position distant from the deposition chamber by 5 m or shorter. If the raw material gases are mixed at a position distant by 5 m or longer, the control of the mass flow controller to correspond to a desired band gap change cannot prevent the delay of the changes of the raw material gases or the mutual diffusion of the raw material gases because the mixing position of the raw material gases is distant. Therefore, a deviation from the desired band gap takes place. That is, if the mixing position of the raw material gases is positioned distantly, the controllability of the band gap deteriorates.

The content of hydrogen in the i-layer can be changed in the direction of the thickness of the layer by enlarging the RF energy to be applied to the bias rod in a portion in which the quantity of hydrogen is intended to be enlarged. Further, the RF energy to be applied to the bias rod must be reduced in a portion in which the quantity of hydrogen is intended to be reduced. In the case where the DC energy is applied simultaneously with the application of the RF energy, high positive DC voltage must be applied to the bias rod in the portion where the quantity of hydrogen atoms is intended to be enlarged. If the quantity of hydrogen is intended to be reduced, low positive DC voltage must be applied to the bias rod.

The photovoltaic device according to the present invention is formed by deposition as follows for example.

First, the substrate 1004 for forming the deposited film is placed in the deposition chamber 1001 shown in FIG. 12, and then the pressure in the deposition chamber 1001 is sufficiently lowered to a $10^{-5}$ Torr level. Although a turbo molecular pump is suitable to lower the internal pressure, an oil diffusion pump may be used. If the oil diffusion pump is used, it is preferable to introduce a $H_2$, He, Ar, Ne, Kr or Xe gas into the deposition chamber 1001 when the internal pressure of the deposition chamber 1001 has been lowered to a level lower than $10^{-4}$ Torr in order to prevent reverse diffusion of oil. After the pressure in the deposition chamber 1001 has been sufficiently lowered, the $H_2$, He, Ar, Ne, Kr or Xe gas is introduced into the deposition chamber 1001 to make the internal pressure in the deposition chamber 1001 to be substantially the same as the pressure at which the raw material gas for forming the deposition film is allowed to flow. It is preferable that the pressure in the deposition chamber 1001 be 0.5 to 50 mTorr. After the internal pressure in the deposition chamber 1001 has been stabilized, the switch of the substrate heater 1005 is switched on to heat the substrate to 100° to 500° C. After the temperature of the substrate has been stabilized at a predetermined temperature level, the introduction of the $H_2$, He, Ar, Ne, Kr or Xe gas is interrupted. Further, the raw material gas for forming the deposited film is introduced into the deposition chamber 1001 from the gas cylinder via the mass flow controller.

The quantity of the raw material gas for forming the deposited film to be introduced into the deposition chamber is adequately determined depending upon deposition in the deposition chamber 1101. The internal pressure in the deposition chamber in the case where the raw material gas for forming the deposited film has been introduced into the deposition chamber is an essential factor. The optimum internal pressure in the deposition chamber ranges from 0.5 to 50 mTorr.

The microwave energy to be supplied into the deposition chamber for forming the deposited film is an important factor for the method of forming the photovoltaic device deposited film according to the present invention. The microwave energy is adequately determined depending upon the flow of the raw material gas to be introduced into the deposition chamber. The microwave energy must be smaller than the microwave energy needed to completely decompose the raw material gas. It is preferable that the energy be ranged from 0.02 to 1 $W/cm^3$. It is preferable that the frequency of the microwave energy ranges from 0.5 to 10 GHz. The optimum frequency is about 2.45 GHz. In order to form a deposited film exhibiting excellent reproducibility by the deposition film forming method and in order to form the deposited film for several to tens of hours, the stability of the microwave energy is an essential factor. It is preferable that the change of the frequency be ranged within ±2%. Further, it is preferable that the ripple of the microwave be ranged within ±2%. The RF energy to be introduced into the deposition chamber together with the microwave energy is an essential factor when it is combined with the microwave energy. It is preferable that the RF energy ranges from 0.04 to 2 W/cm$^3$.

The preferred frequency of the RF energy ranges from 1 to 100 MHz, and the optimum frequency is 13.56 MHz. It is preferable that the RF ranges within ±2% having a smooth waveform.

If the RF energy is supplied, it is preferable to ground the self-bias (a DC component) of the power supply side of the bias rod for supplying the RF energy in the case where the area of the bias rod for supplying the RF energy is narrower than the area of the earth although it is adequately selected depending upon the area ratio of the area of the bias rod for supplying the RF energy and the area of the earth. If the self-bias (the DC component) of the power supply side for supplying the RF energy is not grounded, it is preferable to make the area of the bias rod for supplying the RF energy to be larger than the area of the earth to which the plasma contacts.

The foregoing microwave energy is introduced into the deposition chamber from the wave guide portion 1010 via the dielectric window 1002. Simultaneously, the RF energy is introduced into the deposition chamber from the bias power source 1011 into the deposition chamber. Then, the introduction of the microwave energy and that of the RF energy are stopped, and then the gases in the deposition chamber are exhausted and sufficiently purged with the H$_2$, He, Ar, Ne, Kr or Xe gas. Then, the deposited non-single-crystal semiconductor film is taken out from the deposition chamber.

The foregoing bias rod may be applied with DC voltage in place of the application of the RF energy. As for the polarity of the DC voltage, the voltage is applied in such a manner that the bias rod is made to be positive polarity. It is preferable that the DC voltage ranges from 10 to 300 V.

Figure 13:
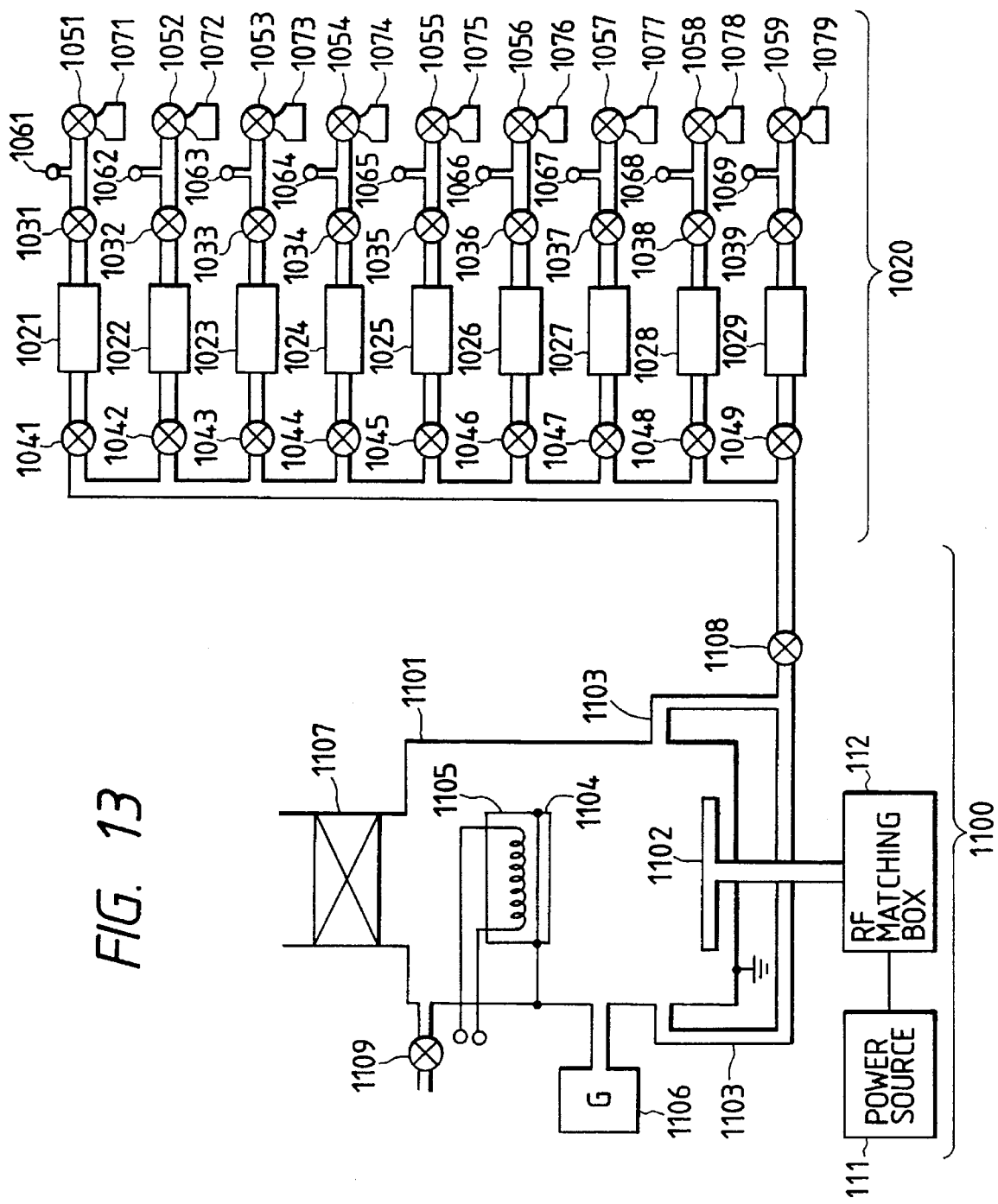
FIG. 13 is a schematic view which illustrates an example of an apparatus for manufacturing the photovoltaic device according to the present invention adapted to an RF plasma CVD method.

FIG. 13 is a schematic view which illustrates a deposited film forming apparatus adapted to an RF plasma CVD method suitable to depose a p- or n-layer. The deposed film forming apparatus comprises a deposition chamber 1101, a cathode 1102, a gas introduction pipe 1103, a substrate 1104, a heater 1105, a vacuum meter 1106, a conductance valve 1107, a sub-valve 1108, a leak valve 1109, an RF power source 1111, an RF matching box 1112, a raw material gas supply apparatus 1020, mass flow controllers 1021 to 1029, gas introduction valves 1031 to 1039, raw material gas cylinder valves 1051 to 1059, pressure regulators 1061 to 1069 and raw material gas cylinders 1071 to 1079.

The apparatus for depositing the photoelectrical conversion device according to the present invention may be an apparatus formed by continuously connecting the microwave plasma CVD apparatus and the RF plasma CVD apparatus. It is preferable to form the apparatus in such a manner that the deposition chamber adapted to the microwave plasma CVD method and the deposition chamber adapted to the RF plasma CVD method are separated from each other by a gate. It is preferable that the foregoing gate may be a mechanical gate or a gas gate.

The p-layer or the n-layer formed by stacking the layer (doping layer A) mainly composed of group III elements of the periodic table and/or group V elements of the same and the layer (doping layer B) containing the valence control agent and mainly composed of silicon atoms can be formed by the deposition apparatus adapted to the microwave plasma CVD method or the RF plasma CVD method.

It is preferable that the doping layer A be deposited by the microwave plasma CVD method or the RF plasma CVD method while using the gas containing the group III element of the periodic table and/or the group V dement of the same. In order to reduce the hydrogen content in the doping layer A, it is preferable to deposit the layer while decomposing the raw material gas with the maximum power.

It is preferable that the doping layer B be deposited by the microwave plasma CVD method or the RF plasma CVD method while mixing the gas containing the group III element of the periodic table and/or the group V element of the same as the valence control agent with the gas containing silicon atoms.

If the doping layer B containing crystal phase is deposited by the microwave plasma CVD method, it is preferable that the RF energy be made smaller than the microwave energy while making the microwave energy to be relatively large. The preferred microwave energy ranges from 0.1 to 1.5 W/cm$^3$. In order to enlarge the crystal grain size, it is preferable to perform dilution with hydrogen. The preferred dilution ratio of the raw material gas by making use of hydrogen gas ranges from 0.01 to 10%.

In the case where the doping layer B containing crystal phase is deposited by the RF plasma CVD method, it is preferable to dilute the gas containing silicon atoms with hydrogen gas (H$_2$, D$_2$) to 0.01 to 10% and to use RF power of 1 to 10 W/cm$^2$.

In the case where the p-layer and/or the n-layer of the photovoltaic device according to the present invention is formed by stacking the doping layer A and the doping layer B, it is preferable to form the structure starting from the doping layer B and completing at the doping layer B. For example, any one of the following configurations is employed: BAB, BABAB, BABABAB or In the case where the transparent electrode and the p-layer and/or the n-layer in the foregoing stacked structure are in contact with each other, it is preferable that the doping layer B and the transparent electrode be in contact with each other. In this case, diffusion of indium oxide or tin oxide forming the transparent electrode into group III element of the periodic table and/or group V element of the same can be prevented. Therefore, the deterioration of the photoelectrical conversion efficiency of the photovoltaic device with time can be prevented.

In the foregoing deposited-film forming method, the raw material gas for depositing silicon may be made of any one of the following compounds.

Specifically, the compounds each of which contains silicon atoms and which can be gasified are exemplified by SiH$_4$, Si$_2$H$_6$, SiF$_4$, SiFH$_3$, SiF$_2$H$_2$, SiF$_3$H, Si$_3$H$_8$, SiD$_4$, SiHD$_3$, SiH$_2$D$_2$, SiH$_3$D, SiFD$_3$, SiF$_2$D$_2$, SiD$_3$H and Si$_2$D$_3$H$_3$.

The compounds as the raw material gas for depositing germanium are exemplified as follows.

Specifically, the compounds each of which contains germanium atoms and which can be gasified are exemplified by GeH$_4$, GeD$_4$, GeF$_4$, GeFH$_3$, GeF$_2$H$_2$, GeF$_3$H, GeHD$_3$, GeH$_2$D$_2$, GeH$_3$D, Ge$_2$H$_6$ and Ge$_2$D$_6$.

The valence control agent to be introduced into the non-single-crystal semiconductor layer for the purpose of controlling the valence of the non-single-crystal semiconductor layer is exemplified by group III atoms of the periodic table and group V element.

The effective material to serve as the starting material for introducing group III atoms in the present invention is exemplified as follows. The starting material for introducing boron atoms is exemplified by boron hydride, such as $B_2H_6$, $B_4H_{10}$, $B_5H_9$, $B_5H_{11}$, $B_6H_{10}$, $B_6H_{12}$ or $B_6H_{14}$ and boron halide such as $BF_3$ or $BCl_3$. Further, $AlCl_3$, $GaCl_3$, $InCl_3$ and $TlCl_3$ are exemplified.

The effective material to serve as the starting material for introducing group V atoms in the present invention is exemplified as follows. The staging material for introducing phosphorus atoms is exemplified by phosphorus hydride such as $PH_3$ or $P_3H_4$ and phosphorus halide such as $PH_4I$, $PF_3$, $PF_5$, $PCl_3$, $PCl_5$, $PBr_3$, $PBr_5$ and $PI_3$. Further, $AsH_3$, $AsF_3$, $AsCl_3$, $AsBr_5$, $AsF_5$, $SbH_3$, $SbF_3$, $SbF_5$, $SbCl_3$, $SbCl_5$, $BiH_3$, $BiCl_3$ and $BiBr_3$ are exemplified.

It is preferable that the quantity of introduction of group III atoms and group V atoms to be introduced into the i-layer of the non-single-crystal semiconductor layer to achieve the object of the present invention be 1000 ppm or less. It is preferable to add the atoms to simultaneously compensate the group III atoms and the group V atoms in order to achieve the object of the present invention.

It is preferable that the quantity of introduction of group III atoms and group V atoms for the purpose of controlling the conduction type of the non-single-crystal semiconductor layer to the p- or n-type be 1500 ppm to 10%.

The foregoing compound, which can be gasified, may be introduced into the deposition chamber while adequately diluting with $H_2$, $D_2$, He, Ne, Ar, Xe or Kr gas. The optimum gas for diluting the compound, which can be gasified, is exemplified by $H_2$ and He.

The gas containing nitrogen is exemplified by $N_3$, $NH_3$, $NDa$, $NO$, $NO_3$ and $N_2O$.

The gas containing oxygen is exemplified by $O_2$, $CO$, $CO_2$, $NO$, $NO_2$, $N_2O$, $CH_3CH_2OH$ and $CH_3OH$.

Conductive Substrate

The conductive substrate may be made of a conductive material or may be formed into a structure manufactured by forming a support member by an insulating material or a conductive material and by performing a conductive process. The conductive support member is exemplified by metal, such as NiCr, stainless steel, AL, Cr, Mo, Au, Nb, Ta, V, Ti, Pt, Pb, or Sn or their alloys.

The electrical insulating support member is exemplified by a film or a sheet made of synthetic resin, such as, polyester, polyethylene, polycarbonate, cellulose acetate, polypropylene, polyvinyl chloride, polyvinylidene chloride, polyethylene or polyamide, glass, ceramics or paper. It is preferable that the at least either side of the electrical insulating support member be subjected to the conductive process and that the photovoltaic layer be formed on the side subjected to the conductive process.

If glass is employed, a thin film made of NiCr, Al, Cr, Mo, Ir, Nb, Ta, V, Ti, Pt, Pb, $In_2O_3$ or ITO ($In_2O_3+SnO_2$) is formed on the surface thereof so that the conductivity is given. If the synthetic film, such as the polyester film, is used, a metal thin film made of NiCr, Al, Ag, Pb, Zn, Ni, Au, Cr, Mo, Ir, Nb, Ta, V, Ti or Pt is formed on the surface thereof by vacuum evaporation, electron beam evaporation or sputtering. As an alternative to this, the surface of the film is subjected to a laminating process so that the surface is made conductive. The support member may be formed into a sheet-like shape having smooth surfaces or the surfaces having projections and pits. The thickness of the support member must be determined adequately as to form a desired photovoltaic device. If the photovoltaic device must have flexibility, the thickness may be reduced so far as the function as the support member can be exhibited sufficiently. However, the thickness is usually made to be 10 mm or more in order to easily manufacture and handle the support member and to maintain the mechanical strength.

Light Reflecting Layer

It is preferable to employ metal, such as Ag, Al, Cu or AlSi, exhibiting high reflectance from visible ray to near infrared ray to form the light reflecting layer. It is preferable to form the foregoing metal by a resistance heating vacuum evaporation method, an electron beam vacuum evaporation method or a co-evaporation or a sputtering method. The preferable thickness of the metal to form the light reflecting layer ranges from 10 nm to 5000 nm. In order to make the foregoing metal to have protections and pits (texture), it is preferable to raise the temperature of the substrate to 200° C. or higher at the time of the deposition.

Reflection Enhancing Layer

It is preferable to make the reflection enhancing layer by ZnO, $SnO_2$, $In_2O_3$, ITO, $TiO_2$, CdO, $Cd_2SnO_4$, $Bi_2O_3$, $MoO_3$ or $Na_xWO_3$.

It is preferable to deposit the reflection enhancing layer by a vacuum evaporation method, a sputtering method, a CVD method, a spraying method, a spin-on method or a dipping method.

Although the preferred thickness of the reflection enhancing layer depends upon the reflectance factor of the material of the reflection enhancing layer, the preferred thickness ranges from 50 nm to 10 μm.

In order to form the reflection enhancing layer into the texture, it is preferable to raise the temperature of the substrate to 300° C. or higher at the time of depositing the reflection enhancing layer.

p-layer or n-layer (second and first conductive layers)

The p- or the n-layer is an important layer that affects the characteristics of the photovoltaic device. The amorphous material (hereinafter expressed by "a-") of course including micro-crystal material (hereinafter expressed by "μc-") of the p-layer or the n-layer is exemplified by a material formed by adding the high-concentration p-type valence control agent (group III atom, such as B, Al, Ga, In or Ti) or the n-type valence control agent (group V atom, such as P, As, Sb or Bi) to a-Si:H, a-Si:HX, a-SiC:H, a-SiC:HX, a-SiGe:H, a-SiGeC:H, a-SiO:H, a-SiN:H, a-SiON:H, a-SiOCN:HX, μc-Si:H, μc-SiC:H, μc-Si:HX, μc-SiC:HX, μc-SiGe:H, μc-SiO:H, μc-SiGeC:H, μt-SiN:H, μc-SiON:HX or μc-SiOCN:HX. The polycrystal material (hereinafter expressed by "poly-") is exemplified by a material obtained by adding the high-concentration p-type valence control agent (group III atom, such as B, Al, Ga, In or Ti) or the n-type valence control agent (group V atom, such as P, As, Sb or Bi) to poly-SiH, poly-Si:HX, poly-SiC:H, poly-SiC:HX, poly-SiGe:H, poly-Si, poly-SiC or poly-SiGe.

It is preferable to make the p-layer or the n-layer in the light receiving portion by a crystal semiconductor layer which does not considerably absorb light or an amorphous semiconductor layer having a wide band gap.

It is preferable to make the quantity of the addition of the group III atoms of the periodic table to the p-layer and that of the group V atoms of the periodic table to the n-layer to be 0.1 to 50 atom %.

Hydrogen atoms (H, D) or halogen atoms contained in the p-layer or the n-layer act to compensate the unbonded hands of the p-layer or the n-layer. As a result, the doping efficiency of the p-layer or the n-layer can be improved. The optimum quantity of hydrogen atoms or halogen atoms to be added to the p-layer or the n-layer ranges from 0.1 to 40 atom %. If the p-layer or the n-layer is made of a crystal material, the optimum quantity of hydrogen atoms or halogen atoms ranges from 0.1 to 8 atom %. It is preferable that hydrogen atoms and/or halogen atoms be distributed by a large quantity adjacent to the interface between the p-layer and the i-layer and the interface between the n-layer and the i-layer. It is preferable that the content of hydrogen atoms and/or halogen atoms adjacent to the interfaces be 1.1 to 2 times the content of the same in the bulk. By enlarging the content of hydrogen atoms or halogen atoms adjacent to the interface between the p-layer and the i-layer and the interface between the n-layer and the i-layer, the defective levels and mechanical distortion adjacent to the interfaces can be prevented. Therefore, the photovoltaic power and the photovoltaic current of the photovoltaic device according to the present invention can be enlarged.

It is preferable that the p-layer and the n-layer of the photovoltaic device have electric characteristics such that the activating energy is 0.2 eV or less. It is preferable that the specific resistance be 100 $\Omega$cm or less, and the optimum specific resistance is 1 $\Omega$cm or less. Further, the preferred thickness of the p-layer and that of the n-layer ranges from 1 to 50 nm. The optimum thickness is 3 to 10 nm.

The raw material gas suitable to deposit the p-layer or the n-layer of the photovoltaic device is exemplified by $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$ and $Si_2D_3H_3$.

Specifically, the compound which contains germanium atoms and which can be gasified is exemplified by $GeH_4$, $GeD_4$, $GeF_4$, $GeFH_3$, $GeF_2H_2$, $GeF_3H$, $GeHD_3$, $GeH_3D_2$, $GeH_3D$, $Ge_2H_6$ and $Ge_2D_6$.

The compound which contains carbon atoms and which can be gasified is exemplified by $CH_4$, $CD_4$, $C_nH_{2n+2}$ (n is an integer), $C_nH_{2n}$ (n is an integer), $C_2H_2$, $C_6H_6$, $CO_2$ and $CO$.

The gas containing nitrogen is exemplified by $N_2$, $NH_3$, $ND_3$, $NO$, $NO_2$ and $N_2O$.

The gas containing oxygen is exemplified by $O_2$, $CO$, $CO_2$, $NO$, $NO_3$, $N_3O$, $CH_3CH_2OH$ and $CH_3OH$.

The substance to be introduced into the p-layer or the n-layer in order to control the valence is exemplified by group III atoms and group V atoms of the periodic table.

The effective material to serve as the starting material for introducing group III atoms is exemplified as follows. The starting material for introducing boron atoms is exemplified by boron hydride such as $B_2H_6$, $B_4H_{10}$, $B_5H_9$, $B_5H_{11}$, $B_6H_{10}$, $B_6H_{12}$ or $B_6H_{14}$ and boron halide such as $BF_3$ or $BCl_3$. Further, $AlCl_3$, $GaCl_3$, $InCl_3$ or $TlCl_3$ is exemplified. In particular, $B_2H_6$ or $BF_3$ are suitable.

The effective material to serve as the starting material for introducing group V atoms is exemplified as follows. The starting material for introducing phosphorus atoms is exemplified by phosphors hydride such as $PH_3$ or $P_2H_4$ and phosphorus halide such as $PH_4I$; $PF_3$, $PF_5$, $PCl_3$, $PCl_5$, $PBr_3$, $PBr_5$ and $PI_3$. Further, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$ are exemplified. In particular, $PH_3$ or $PF_3$ is suitable.

The suitable method of depositing the p-layer or the n-layer suitable to form the photovoltaic device is the RF plasma CVD method or the microwave plasma CVD method. If the deposition is performed by the RF plasma CVD method, it is preferable to employ a capacity-coupling-type RF plasma CVD method.

If the p-layer or the n-layer is deposited by the RF plasma CVD method, the optimum conditions are as follows: the temperature of the substrate placed in the deposition chamber is 100° to 350° C., the internal pressure is 0.1 to 10 Torr, the RF power is 0.01 to 25.0 W/cm$^2$ and the deposition rate is 0.1 to 30 A/sec.

The employed compound, which can be gasified, may be diluted with the $H_2$, He, Ne, Ar, Xe or Kr gas before it is introduced into the deposition chamber.

If the layer made of microcrystal semiconductor or a-SiC:H or the like, which does not considerably absorb light, or which has a wide band gap, is deposited, it is preferable to dilute the raw material gas to 2 to 100 times with a hydrogen gas and to supply relatively large RF power. The preferred range of the RF is from 1 MHz to 100 MHz, more preferably a frequency adjacent to 13.56 MHz.

If the p-layer or the n-layer is deposited by the microwave plasma CVD method, it is preferable to arrange the microwave plasma CVD apparatus to be adaptable to a method in which microwaves are introduced into the deposition chamber through the wave guide pipe via the dielectric window (made of alumina ceramics or the like).

Although the film forming method, in which the p-layer or the n-layer is deposited by simultaneously applying microwave power and RF power to the raw material gas, is suitable to be adapted to the microwave plasma CVD method, the deposited film which can be adapted to the photovoltaic device can be formed under wider deposition conditions. That is, if the p-layer or the n-layer is deposited by a usual microwave plasma CVD method, it is preferable to employ the following conditions: the temperature of the substrate placed in the deposition chamber is 100° to 400° C., the internal pressure is 0.5 to 30 mTorr, microwave power is 0.01 to 1 W/cm$^3$ and the frequency of the microwave is 0.5 to 10 GHz.

The compound, which can be gasified, may be diluted adequately with the $H_2$, He, Ne, Ar, Xe or Kr gas before it is introduced into the deposition chamber.

If the layer made of microcrystal semiconductor or a-SiC:H or the like, which does not considerably absorb light, or which has a wide band gap, is deposited, it is preferable to dilute the raw material gas to 2 to 100 times with a hydrogen gas and to supply relatively large RF power.

i-layer

The i-layer is an important layer for generating and transporting the carriers in response to irradiation light. The i-layer may be a layer containing slightly p-type characteristics or a layer containing slightly n-type characteristics.

The i-layer of the photovoltaic device according to the present invention contains silicon atoms and germanium atoms, having the band gap which is smoothly changed in the direction of the thickness of the i-layer and having the minimum band gap deviated toward the interface between the p-layer and the i-layer from the central portion of the i-layer. It is preferable that the valence control agent to serve as the donor and the valence control agent to serve as the acceptor be simultaneously doped into the i-layer.

Hydrogen atoms (H, D) or halogen atoms (X) contained in the i-layer act to compensate the unbonded hands of the i-layer so that the product of the mobility of the carrier in the i-layer and the life is enlarged. Further, the foregoing atoms act to compensate the interfacial level in the interface between the p-layer and the i-layer and between the n-layer and the i-layer so that the photovoltaic power, the photoelectric current and the light response of the photovoltaic device are improved. It is preferable to contain hydrogen atoms and/or halogen atoms in the i-layer by 1 to 40 atom %. It is preferable that hydrogen atoms and/or halogen atoms be distributed by a large quantity adjacent to the interface between the p-layer and the i-layer and the interface between the n-layer and the i-layer. It is preferable that the content of hydrogen atoms and/or halogen atoms adjacent to the interfaces be 1.1 to 2 times the content of the same in the bulk. It is preferable that the content of hydrogen atoms and/or halogen atoms be changed with respect to the content of silicon atoms. It is preferable that hydrogen atoms and/or halogen atoms be contained by 1 to 10 atom % in the portion in which the content of silicon atoms is minimum. It is preferable that the quantity be 0.3 to 0.8 times that in the region in which hydrogen atoms and/or halogen atoms are contained by the largest quantities.

The content of hydrogen atoms and/or halogen atoms is changed to correspond to silicon atoms, that is, the content of hydrogen atoms and/or halogen atoms is reduced in the portion having the narrow band gap. Although the detailed mechanism has not been cleared yet, the deposited film forming method according to the present invention makes use of the difference in the ionization ratio between silicon atoms and germanium atoms in the deposition of alloy-type semiconductor containing silicon atoms and germanium atoms so that the RF energy given to respective atoms becomes different. As a result, even if the content of hydrogen and/or halogen is insufficient in the alloy-type semiconductor, relaxation is enhanced satisfactorily. Therefore, an excellent alloy-type semiconductor can be deposited.

By adding oxygen and/or nitrogen by a small quantity of 100 ppm or less to the i-layer which contains silicon atoms and germanium atoms, the durability of the photovoltaic device against annealing performed by making use of vibrations for a long time can be improved. Although the reason for this has not been cleared yet, the following consideration can be made. That is, the fact that the composition ratio of silicon atoms and germanium atoms is continuously changed in the direction of the thickness of the layer causes the residual strain to be enlarged as compared with the case where silicon atoms and germanium atoms are mixed at a constant ratio.

By adding oxygen atoms and/or nitrogen atoms to the foregoing system, the structural strain can be reduced. Therefore, the durability of the photovoltaic device against annealing performed by making use of vibrations for a long time can be improved. It is preferable that oxygen atoms and/or nitrogen atoms be increased/decreased with respect to the content of germanium atoms in the direction of the thickness of the layer. Although the foregoing distribution opposes the distribution of hydrogen atoms and/or halogen atoms, the foregoing distribution is considered preferable due to the effect of eliminating the structural strain and the effect of reducing the unbonded hands. By distributing hydrogen atoms (and/or halogen atoms) and oxygen atoms (and/or nitrogen atoms) as described above, the tail state of the valence band and that of the conductive band can be continuously connected to each other.

Although the preferred thickness of the i-layer depends upon the structure (for example, single cell, tandem cell or triple cell) of the photovoltaic device and upon the band gap of the i-layer, the optimum thickness ranges from 0.05 to 1.0 µm.

The i-layer of the deposited film forming method according to the present invention and containing silicon atoms and germanium atoms exhibits a small tail state adjacent to the valence band even if the deposition rate is raised to 5 nm/sec or higher. The inclination of the tail state is 60 meV or less and the density of the unbonded hand due to the electron spin resonance (esr) is $10^{17}/cm^3$ or less.

It is preferable that the band gap in the i-layer be designed to be widened adjacent to the interface between the p-layer and the i-layer and the interface between the n-layer and the i-layer. As a result of the foregoing design, the photovoltaic power and the photoelectric current of the photovoltaic device can be enlarged. Further, the light deterioration occurring after the device has been used for a long time can be prevented.

The optimum method of forming the i-layer of the photovoltaic device is to form the deposited film by simultaneously applying microwaves and RF waves.

Transparent Electrode

It is preferable that the transparent electrode be made of an indium oxide or an indium-tin oxide. The optimum method of forming the transparent electrode is to deposit it by a sputtering method or a vacuum evaporation method.

The transparent electrode is deposited as follows:

In the case where the transparent electrode made of the indium oxide is deposited on the substrate in a DC magnetron sputtering apparatus, the target may be metal indium (In) or an indium oxide ($In_2O_3$).

In the case where the transparent electrode made of the indium-tin oxide is deposited on the substrate, the target may be metal tin, metal indium, alloy of metal tin and metal indium, a tin oxide, an indium oxide or an indium-tin oxide or their mixtures.

In the case where the deposition is performed by the sputtering method, the temperature of the substrate is an important factor. The preferred temperature range is from 25° C. to 600° C. The sputtering gas for use in the case where the transparent electrode is deposited by the sputtering method is exemplified by inactive gas such as argon (Ar) gas, neon (Ne) gas, xenon (Xe) gas or helium (He) gas. The optimum gas is the Ar gas. It is preferable to add an oxygen ($O_2$) gas to the foregoing inactive gas. In particular, the oxygen ($O_2$) gas is a necessary gas in the case where metal is used as the target.

In the case where the target is sputtered by the foregoing inactive gas, it is preferable that the pressure in the discharge space be 0.1 to 50 mTorr.

The preferred power source for use in the case where the sputtering method is employed is exemplified by a DC source or an RF source. The preferred electric power needed at the time of performing sputtering is 10 to 1000 W.

The deposition rate of the transparent electrode depends upon the pressure in the discharge space and upon the discharge power. The optimum deposition rate ranges from 0.01 to 10 nm/sec.

The evaporation source suitable to deposited the transparent electrode by the vacuum evaporation method is exemplified by metal tin, metal indium and indium-tin alloy.

The preferred range of the temperature of the substrate at the time of depositing the transparent electrode is 25° C. to 600° C.

When the transparent electrode is deposited, the oxygen gas ($O_2$) in a quantity of $5 \times 10^{-5}$ Torr to $9 \times 10^{-4}$ Torr must be introduced into the deposition chamber after the pressure in the deposition chamber has been lowered to $10^{-5}$ Torr level. By introducing oxygen by the foregoing quantity, the gasified metal reacts with gas-phase oxygen. As a result, an excellent transparent electrode can be deposited.

Another method may be employed in which RF power is introduced at the foregoing degree of vacuum to generate plasma and the evaporation is performed while interposing the generated plasma.

The preferred rate for depositing the transparent electrode under the foregoing conditions ranges from 0.01 to 10 nm/sec. If the deposition rate is lower than 0.01 nm/sec, the manufacturing yield deteriorates. If it is higher than 10 nm/sec, a coarse film suffering from unsatisfactory permeability, conductivity and contact is undesirably formed.

It is preferable to deposit the transparent electrode to have a thickness to meet the conditions needed for the reflection prevention film. Specifically, the preferred thickness of the transparent electrode ranges from 50 to 300 nm.

The generating system according to the present invention comprises the photovoltaic device according to the present invention, a control system that monitors the voltage and/or the electric current of the photovoltaic device to control supply of the electric power from the photovoltaic device to a battery and/or an external load and the battery for accumulating the electric power supplied from the photovoltaic device and/or supplying the electric power to the external load.

Figure 25:
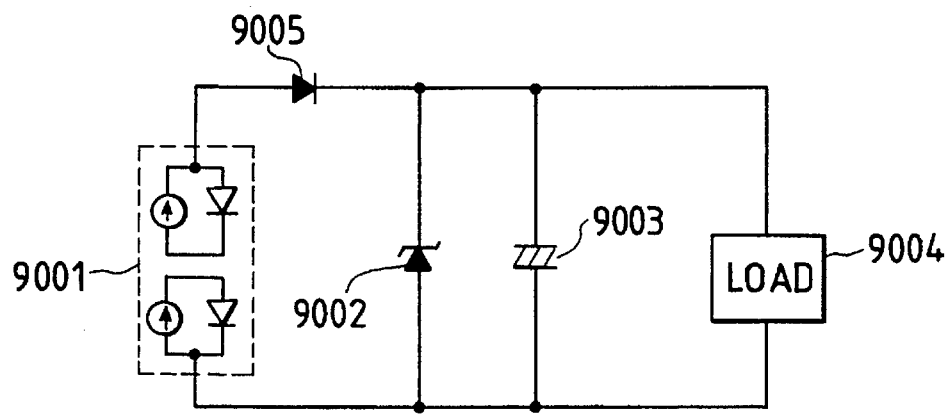
FIG. 25 is a schematic view which illustrates a power supply system according to the present invention.

FIG. 25 illustrates an example of the power supply system according to the present invention comprising a basic circuit having the power source composed of only the photovoltaic device. The power supply system comprises a photoelectrical conversion device 9001 serving as a solar cell and according to the present invention, a diode 9002 for controlling the power of the photoelectrical conversion device, a capacitor 9003 serving as a battery and acting to stabilize the voltage, a load 9004 and a checking diode 9005.

Figure 26:
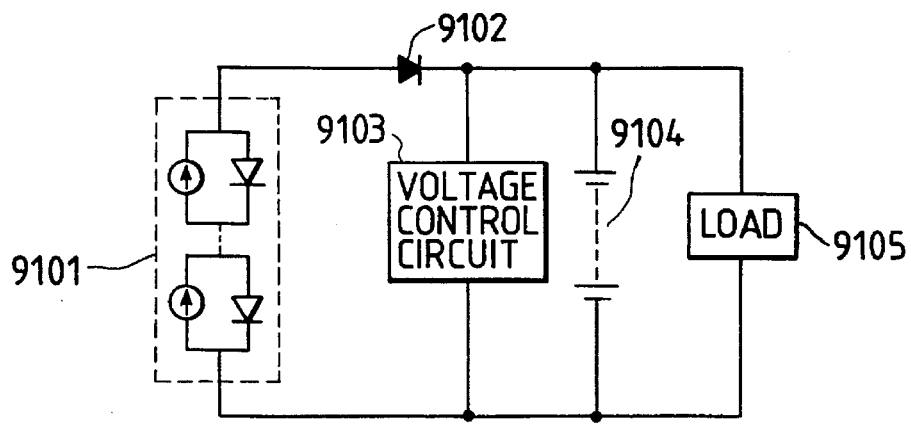
FIG. 26 is a schematic view which illustrates the power supply system according to the present invention.
Figure 27:
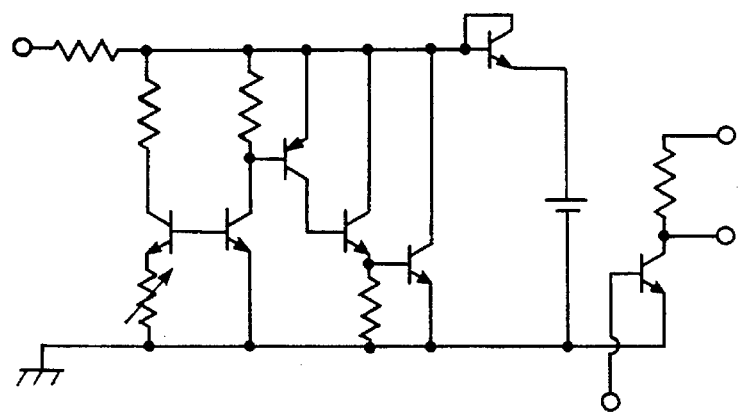
FIG. 27 is a schematic view which illustrates an example of a voltage control circuit of the power supply system according to the present invention.

FIG. 26 illustrates an example of the power supply system according to the present invention comprising a basic charging circuit making use of the photovoltaic device. The foregoing circuit comprises a solar cell 9101 made of the photovoltaic device according to the present invention. The circuit further comprises a checking diode 9102, a voltage control circuit 9103 which monitors the voltage to control the voltage, a secondary battery 9104 and a load 9105. It is preferable that the checking diode comprises a silicon diode or a shot-key diode. The secondary battery may comprises a nickel cadmium battery, a charge-type silver oxide battery, a lead battery or a flywheel energy accumulating unit. FIG. 27 illustrates an example of the voltage control circuit 9103. The voltage control circuit transmits substantially the same output from a solar cell until the battery is completely charged. When the battery is completely charged, a charge control IC of the voltage control circuit interrupts the charging current.

The solar cell system using the foregoing photovoltaic power can be used as the power source for a battery charging system for an automobile or a ship, a street light system, an exhaust system or the like.

Figure 28:
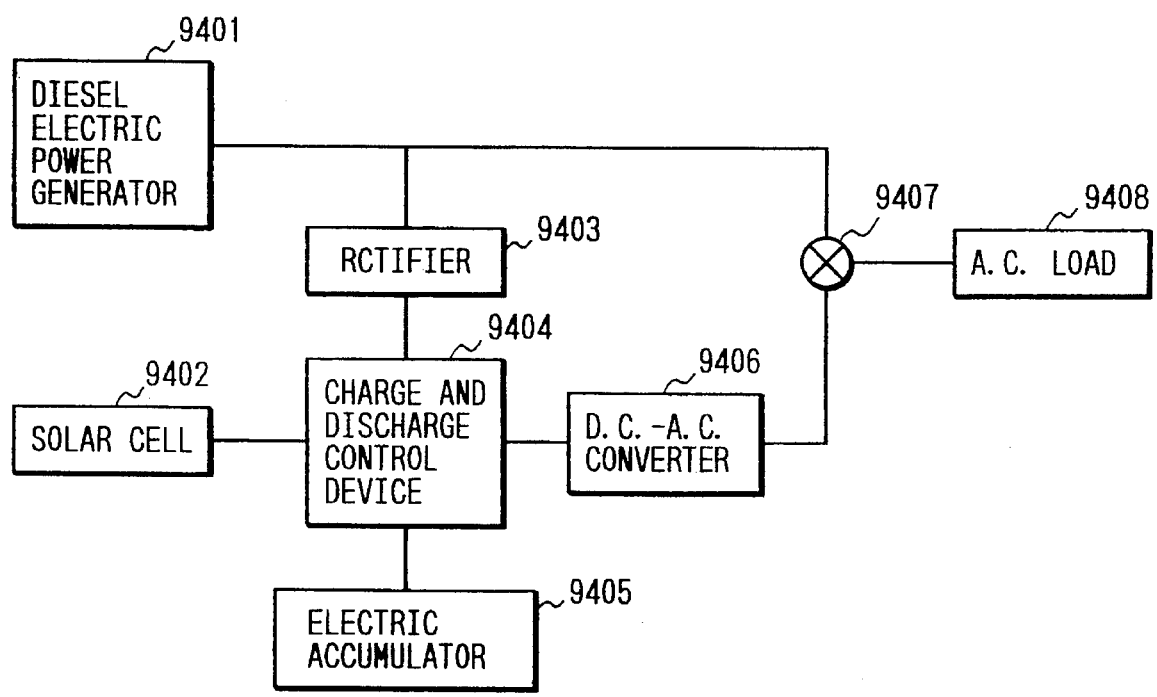
FIG. 28 is a schematic view which illustrates the power supply system according to the present invention.

FIG. 28 is a block diagram which illustrates a hybrid power source system composed of a solar cell and a diesel generating unit. The generating system shown in FIG. 28 comprises a diesel generator 9401, a solar cell 9402, a charging/discharging control unit 9404, a battery 9405, a DC/AC converting unit 9406, a switcher 9407 and an AC load 9408.

Figure 29:
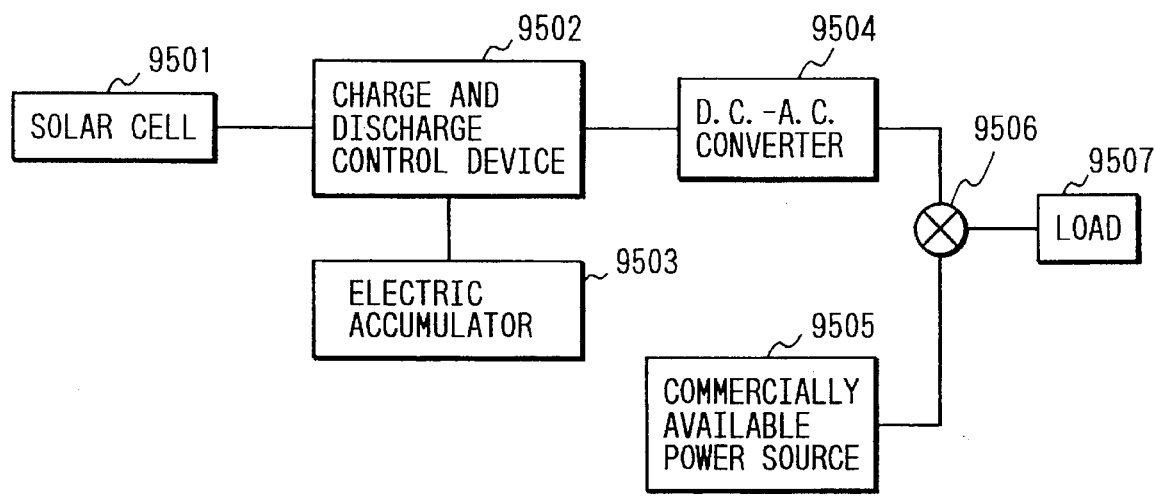
FIG. 29 is a schematic view which illustrates the power supply system according to the present invention.

FIG. 29 is a block diagram which illustrates solar cell power supply system using a commercial power source as a backup source. The power supply system shown in FIG. 29 comprises a solar cell 9501, which is a photoelectrical conversion device, a charging/discharging control unit 9502, a battery 9503, a DC/AC converting unit 9504 which is a power conversion means, a commercial power source 9505, a instantaneous switcher 9506 and a load.

Figure 30:
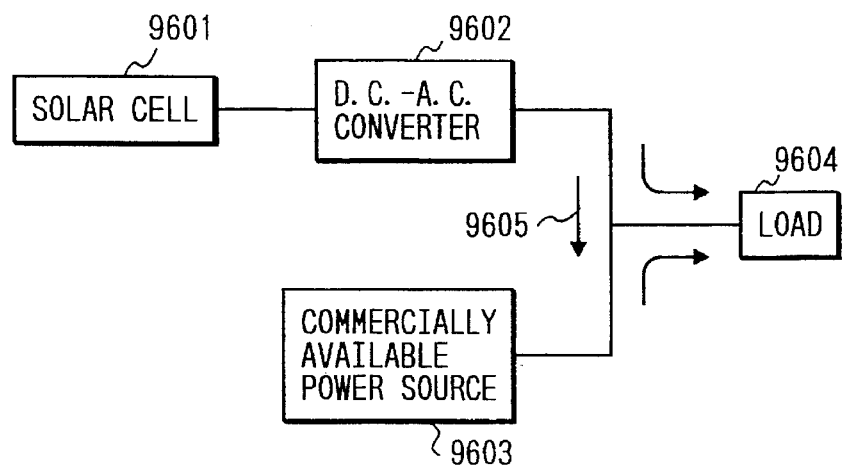
FIG. 30 is a schematic view which illustrates the power supply system according to the present invention.

FIG. 30 is a block diagram which illustrates a solar cell power source system of a type completely linked with the commercial power source. The power source system shown in FIG. 30 comprises a solar cell 9601 which is a photoelectrical conversion device, a DC/AC converter 9602 which is a power conversion means, a commercial power source 9603 also serving as a load, a load 9604 and an reverse-flow 9605.

The power source system using the photoelectrical conversion device according to the present invention as the solar cell can be stably used for a long time. Further, even if the light for irradiating the solar cell is changed, the system is able to work satisfactorily as the photoelectrical conversion device. Therefore, excellent stability is realized.

Examples of the present invention will now be described further in detail. However, the present invention is not limited to the following description.

EXAMPLE 1

A manufacturing method comprising a raw material gas supply unit 1020 and a deposition unit 1000 shown in FIG. 12 and adapted to the microwave plasma CVD method was used to manufacture the photovoltaic device according to the present invention.

The gas cylinders 1071 to 1079 shown in FIG. 12 were filled with raw material gases for manufacturing the p-, i- and n-layers made of the non-single-crystal semiconductor material according to the present invention. Reference numeral 1071 represents a $SiH_4$ gas cylinder, 1072 represents a $H_2$ gas cylinder, 1073 represents a $BF_3$ as cylinder for a $BF_3$ gas diluted with a $H_2$ gas to 1% (hereinafter abbreviated to "$BF_3$ (1%)/$H_2$"), 1074 represents a $PH_3$ gas cylinder for a $PH_3$ gas diluted with a $H_2$ gas to 1% (hereinafter abbreviated to "$PH_3$ (1%)/$H_2$"), 1075 represents a $Si_2H_6$ gas cylinder, 1076 represents a $GeH_4$ gas cylinder, 1077 represents a $BF_3$ gas cylinder for a $BF_3$ gas diluted with a $H_2$ gas to 2000 ppm (hereinafter abbreviated to "$BF_3$ (2000 ppm)/$H_2$"), 1078 represents a $PH_3$ gas cylinder for a $PH_3$ gas diluted with a $H_2$ gas to 2000 ppm (hereinafter abbreviated to "$PH_3$ (2000 ppm)/$H_2$") and 1079 represents a NO gas cylinder for a NO gas diluted with a He gas to 1% (hereinafter abbreviated to "NO/He"). Each of the foregoing gases was previously introduced from the valves 1051 to 1059 into the introduction valves 1031 to 1039.

Referring to FIG. 12, reference numeral 1004 represents a 50 mm×50 mm substrate having a thickness of 1 mm and made of stainless steel (SUS430BA). The substrate 1004 was subjected mirror-surface forming process and had a silver (Ag) thin film serving as a reflecting layer and formed into a texture shape by the sputtering method to have a thickness of 100 nm. Further, zinc oxide (ZnO) thin film serving as a reflection enhancing layer and having a thickness of 1 μm was formed on the substrate 1004 by evaporation.

First, the $SiH_4$ gas was introduced from the gas cylinder 1071, the $H_2$ gas was introduced from the gas cylinder 1072, the $BF_3$ (1%)/$H_2$ gas was introduced from the gas cylinder 1073, the $PH_3$(1%)/$H_2$ gas was introduced from the gas cylinder 1074, the $Si_2H_6$ gas was introduced from the gas cylinder 1075, the $GeH_4$ gas was introduced from the gas cylinder 1076, the $BF_3$ (2000 ppm)/$H_2$ gas was introduced from the gas cylinder 1077, the $PH_3$ (2000 ppm)/$H_2$ gas was introduced from the gas cylinder 1078 and the NO/He gas was introduced from the gas cylinder 1079 by opening the valves 1051 to 1059. Further, the pressure regulators 1061 to 1069 were used to regulate each gas pressure to about 2 $Kg/cm^2$.

Then, a fact that the introduction valves 1031 to 1039 and the leak valve 1009 of the deposition chamber 1001 had been closed was confirmed. Further, a fact that the discharge valves 1041 to 1049 and the sub-valve 1008 had been opened was confirmed. Then, the conductance (the butterfly type) valve 1007 was opened completely and the vacuum pump (omitted from illustration) was used to exhaust the inside portions of the deposition chamber 1001 and the gas pipe until the vacuum meter 1006 indicates a level about $1 \times 10^{-4}$ Torr. At this moment, the sub-valve 1008 and the discharge valves 1041 to 1049 were closed.

Then, the introduction valves 1031 to 1039 were gradually opened to introduce the gases into the corresponding mass flow controllers 1021 to 1029.

After the preparation for forming the film had been completed, the n-, i- and p-layers were formed on the substrate 1004.

The n-layer was formed, by heating the substrate 1004 to 350° C. by using the heater 1005 and by gradually opening the discharge valves 1041, 1044 and the sub-valve 1008 so that the $SiH_4$ gas and the $PH_3$ (1%)/$H_2$ gas were introduced into the deposition chamber 1001 through the gas introduction pipe 1003. At this time, the flow of the $SiH_4$ gas was made to be 50 sccm and the flow of the $PH_3$ (1%)/$H_2$ gas was made to be 200 sccm by the regulating operations performed by the corresponding mass flow controllers 1021 and 1024. The pressure in the deposition chamber 1001 was made to be 10 mTorr by adjusting the opening of the conductance valve 1007 while observing the vacuum meter 1006.

Then, the shutter 1013 was closed, and the direct current (hereinafter abbreviated to "DC") bias of the bias power source 1011 was set to 50 V to be applied to the bias rod 1012. Then, the power of the microwave power source (omitted from illustration) was set to 130 mW/cm$^3$ to be supplied into the deposition chamber 1001 through the wave guide pipe (omitted from illustration), the wave guide portion 1010 and the dielectric window 1002 so that the microwave glow discharge was caused to occur. The shutter 1013 was then opened so that forming of the n-layer on the substrate 1004 was commenced. When the n-layer having a thickness of 10 nm was formed, the shutter 1013 was closed while stopping the microwave glow discharge. Then, the discharge valves 1041, 1044 and the sub-valve 1008 were closed, and the gas introduction into the deposition chamber 1001 was stopped. Thus, the n-layer was formed.

The i-layer was formed by heating the substrate 1004 to 350° C. by using the heater 1005 and by gradually opening the discharge valves 1041, 1042, 1046 to 1048 and the sub-valve 1008 so that the $SiH_4$ gas, $H_2$ gas, the $GeH_4$ gas, the $BF_3$ (2000 ppm)/2 gas and the $PH_3$ (2000 ppm)/$H_2$ gas were introduced into the deposition chamber 1001 through the gas introduction pipe 1003. At this time, the flow of the $SiH_4$ gas was made to be 200 sccm, the flow of the $H_2$ gas was made to be 50 sccm, the flow of the $BF_3$ (2000 ppm)/$H_2$ gas was made to be 0.2 sccm, the flow of the $PH_3$ (2000 ppm)/$H_2$ gas was made to be 0.1 sccm and the flow of the $GeH_4$ gas was made to be 1 sccm by the regulating operations performed by the corresponding mass flow controllers 1021, 1022 and 1026 to 1028. The pressure in the deposition chamber 1001 was made to be 8 mTorr by adjusting the opening of the conductance valve 1007 while observing the vacuum meter 1006.

Figure 16:
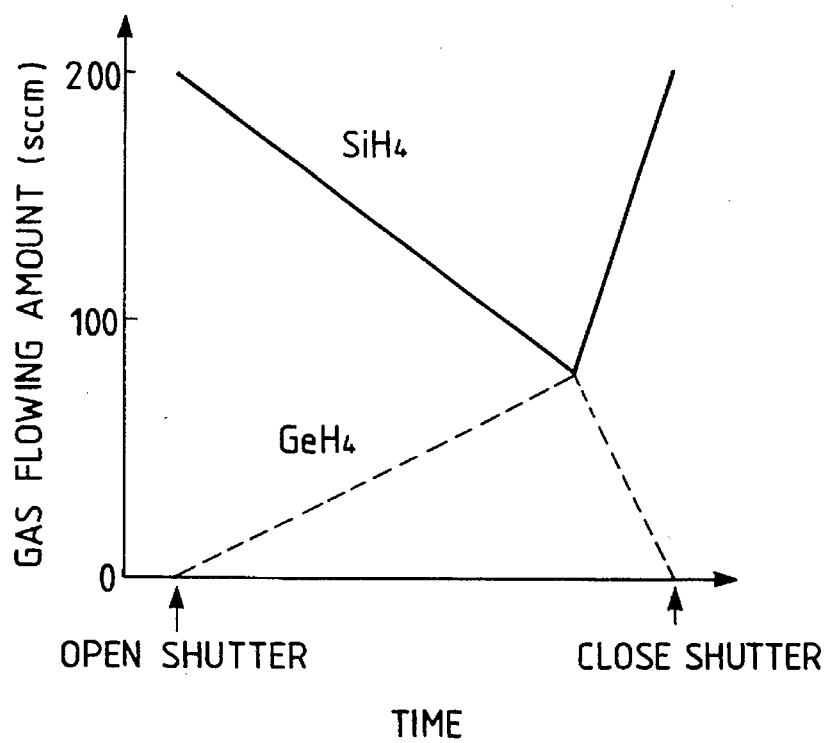
FIG. 16 is a graph which shows the time sequential change pattern of the flows to $SiH_4$ and $GeH_4$ gases.

Then, the shutter 1013 was closed, and the power of the microwave power source (omitted from illustration) was set to 170 m/cm$^3$ to be supplied into the deposition chamber 1001 through the wave guide pipe (omitted from illustration), the wave guide portion 1010 and the dielectric window 1002 so that the microwave glow discharge was caused to occur. The radio frequency (hereinafter abbreviated to "RF") bias of the bias power source 1011 was set to 350 mW/cm$^3$ and the DC bias was set to 0 V via an RF cutting coil to be applied to the bias rod 1012. Then, the shutter 1013 was opened so that forming of the i-layer on the n-layer was commenced. Simultaneously, the flow of the $SiH_4$ gas and that of the $GeH_4$ gas were regulated by the mass flow controllers 1021 and 1026 in accordance with the flow pattern shown in FIG. 16 until the i-layer having a thickness of 300 nm was formed. At this time, the shutter 1013 was closed, the output from the bias power source 1011 was turned off, the microwave glow discharge was interrupted and the discharge valves 1041, 1042 and 1046 to 1048 and the sub-valve 1008 were closed to stop the gas introduction into the deposition chamber. Thus, the i-layer was formed.

The p-layer was formed by heating the substrate 1004 to 300° C. by using the heater 1005 and by gradually opening the discharge valves 1041 to 1043 and the sub-valve 1008 so that the $SiH_4$ gas, $H_2$ gas and the $BF_3$ (1%)/$H_2$ gas were introduced into the deposition chamber 1001 through the gas introduction pipe 1003. At this time, the flow of the $SiH_4$ gas was made to be 10 sccm, the flow of the $H_2$ gas was made to be 700 sccm and the flow of the $BF_3$ (1%)/$H_2$ gas was made to be 30 sccm by the regulating operations performed by the corresponding mass flow controllers 1021 to 1023. The pressure in the deposition chamber 1001 was made to be 25 mTorr by adjusting the opening of the conductance valve 1007 while observing the vacuum meter 1006.

Then, the power of the microwave power source (omitted from illustration) was set to 250 m/cm$^3$ to be supplied into the deposition chamber 1001 through the wave guide pipe (omitted from illustration), the wave guide portion 1010 and the dielectric window 1002 so that the microwave glow discharge was caused to occur. Then, the shutter 1013 was opened so that forming of the p-layer on the i-layer was commenced. When the p-layer having a thickness of 10 nm was formed, the shutter 1013 was closed, the microwave glow discharge was interrupted and the discharge valves 1041 to 1043 and the sub-valve 1008 were closed to stop the gas introduction into the deposition chamber. Thus, the p-layer was formed.

The residual discharge valves 1041 to 1049 must be completely closed at the time of forming the respective layers. Further, undesirable leaving of the gases in the deposition chamber 1001 and the pipes arranged from the discharge valves 1041 to 1049 to the deposition chamber is prevented by closing the discharge valves 1041 to 1049, opening the sub-valve 1008 and completely opening the conductance valve 1007 so that the inside portion of the system is exhausted to realize a vacuum state if necessary.

Then, an ITO ($In_2O_3+SnO_2$) thin film to serve as the transparent electrode was formed on the p-layer to have a thickness of 70 μm and an aluminum (Al) thin film was formed on the same to have a thickness of 2 μm by vacuum evaporation so that a photovoltaic device was manufactured (Device No. Example 1). The conditions for manufacturing the photovoltaic device are shown in Table 1.

TABLE 1

| Substrate | SUS430BA 50 mm × 50 mm having a thickness of 1 mm |
| --- | --- |
| Reflecting Layer | Silver (Ag) thin film 100 nm |
| Reflection Enhaning Layer | Zinc Oxide (ZnO) thin film 1 μm |

| Forming Conditions | Name of Layer | Gas and Flow of Gas (sccnm) | | Discharge Power of Microwave (mW/cm$^3$) | Bias | Pressure (mTorr) | Temperature of Substrate | Thickness of Layer |
| --- | --- | --- | --- | --- | --- | --- | --- | --- |
| | n-layer | SiH$_4$ | 50 | 130 | DC50V | 10 | 350 | 10 |
| | | PH$_3$/H$_2$ (diluted to 1%) | 200 | | | | | |
| | i-layer | SiH$_4$ (see FIG. 16) | | 170 | RF 350 (mW/cm$^3$) | 8 | 350 | 300 |
| | | H$_2$ | 500 | | DCoV | | | |
| | | BF$_3$/H$_2$ (diluted to 2000 ppm) | 0.2 | | | | | |
| | | PH$_3$/H$_2$ (diluted to 2000 ppm) | 0.1 | | | | | |
| | | GeH$_4$ (see FIG. 16) | | | | | | |
| | p-layer | SiH$_4$ | 10 | 250 | | 25 | 300 | 10 |
| | | H$_2$ | 700 | | | | | |
| | | BF$_3$/H$_2$ (diluted to 1%) | 30 | | | | | |

| Transparent Electrode | ITO (In$_2$O$_3$ + SnO$_2$) thin film 70 nm |
| --- | --- |
| Collecting Electrode | Aluminim (Al) thin film 2 μm |

As a comparative example, a reflecting layer, a reflection enhancing layer, an n-layer, an i-layer, a p-layer, a transparent electrode and a collecting electrode was formed on the substrate under the same manufacturing conditions as those according to Example 1 except for that BF$_3$ (2000 ppm)/H$_2$ and PH$_3$ (2000 ppm)/H$_2$ were not used at the time of forming the i-layer so that a photovoltaic device was manufactured (Device No. Comparative Example 1-1).

Figure 17:
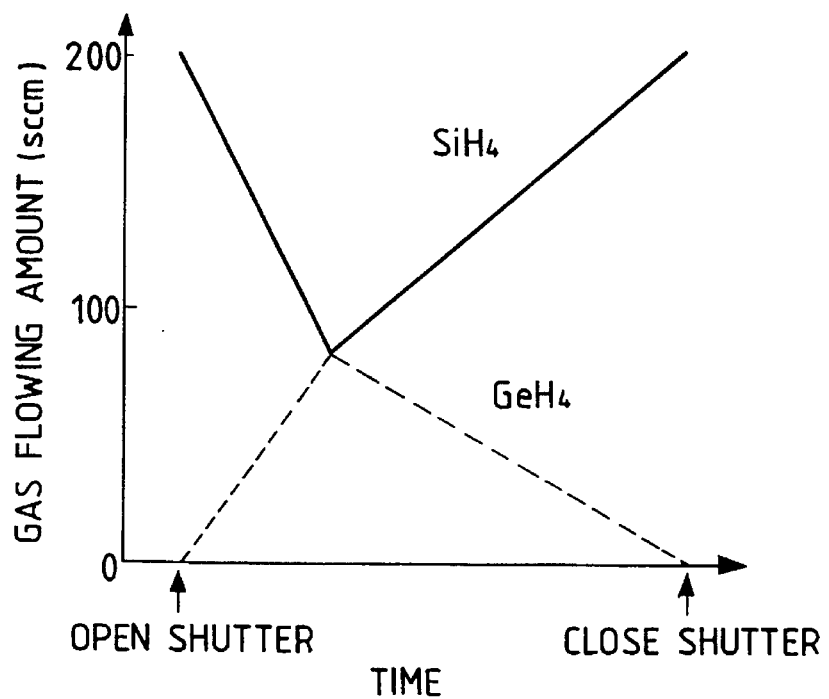
FIG. 17 is a graph which shows the time sequential change pattern of the flows of $SiH_4$ and $GeH_4$ gases.

Another photovoltaic device (Device No. Comparative Example 1-2) was manufactured by forming a reflecting layer, a reflection enhancing layer, an n-layer, an i-layer, a p-layer, a transparent electrode and a collecting electrode on the substrate under the same manufacturing conditions as those according to Example 1 except for that the flows of the SiH$_4$ gas and the GeH$_4$ gas were adjusted by the mass flow controllers 1021 and 1026 in accordance with the flow pattern shown in FIG. 17.

The initial characteristics, low illuminance characteristics and durability of the manufactured photovoltaic devices (Device Nos. Example 1, Comparative Examples 1-1 and 1-2) were measured.

The initial characteristics were measured by making use of the open voltage and the curve factor obtained by measuring V-I characteristics while placing the manufactured photovoltaic devices (Device Nos. Example 1, Comparative Examples 1-1 and 1-2) as to be irradiated with AM-1.5 (100 mW/cm$^2$) light. As a result of the measurement, Device No. Example 1 exhibited an open voltage which was 1.02 times that of Device No. Comparative Example 1-1 and a curve factor which was 1.03 times of the same. Device No. Comparative Example 1-2 exhibited an open voltage which was 0.99 times and a curve factor which was 1.00 time.

The low illuminance characteristics were measured in such a manner that the manufactured photovoltaic devices (Device Nos. Example 1, Comparative Examples 1-1 and 1-2) were placed as to be irradiated with AM-1.5 (10 mW/cm$^2$) light so that the V-I characteristics were measured to evaluate the photoelectrical conversion efficiency. As a result of the measurement, Device No. Example 1 exhibited a photoelectrical conversion efficiency which was 1.08 times that of Device No. Comparative Example 1-1. Device No. Comparative Example 1-2 exhibited a photoelectrical conversion efficiency which was 1.01 times.

The durability was measured in such a manner that the manufactured photovoltaic devices (Device Nos. Example 1, Comparative Examples 1-1 and 1-2) were placed in a dark place the humidity of which was 70% and the temperature of which was 60° C. while being vibrated at 3600 rpm by a quantity of 1 mm for 48 hours as to measure the change of the photoelectrical conversion efficiency. As a result of the measurement, Device No. Example 1 exhibited a reduced deterioration in the photoelectrical conversion efficiency which was 1.07 times that of Device No. Comparative Example 1-1. Device No. Comparative Example 1-2 exhibited a photoelectrical conversion efficiency which was 1.01 times.

The compositions of the photovoltaic devices Device No. Example 1 and Device Nos. Comparative Examples 1-1 and 1-2 were analyzed by a secondary-ion mass analyzing apparatus ("IMS-3F" manufactured by CAMECA, resulting in that boron and phosphorus atoms were contained in the i-layer was confirmed.

Then, samples (sample Nos. 1-1 to 1-5) for measuring the physical properties were manufactured by forming an i-layer having a thickness of 1 μm on a substrate under the same manufacturing conditions as those for forming the i-layer according to Example 1 except for that a stainless steel substrate and barium boro-silicated glass ("7059" manufactured by Corning) substrate were used and the flow of the SiH$_4$ gas and that of the GeH$_4$ gas were made to be values shown in Table 2.

TABLE 2

| Sample No. | Flow of Gas (sccm) SiH$_4$ | GeH$_4$ | Band Gap (eV) | Composition Ratio Si | Ge |
| --- | --- | --- | --- | --- | --- |
| 1-1 | 200 | 1 | 1.71 | 100 | 1 |
| 1-2 | 170 | 20 | 1.60 | 8.7 | 1 |
| 1-3 | 140 | 40 | 1.52 | 3.3 | 1 |
| 1-4 | 110 | 60 | 1.45 | 1.9 | 1 |
| 1-5 | 80 | 80 | 1.38 | 1.1 | 1 |

The band gap and the composition of each of the manufactured samples for measuring the physical properties were analyzed so that the relationship between the composition ratio of Si atoms and Ge atoms and the band gap was obtained.

The band gap was measured in such a manner that the glass substrate having the i-layer formed thereon was set to a spectrum luminosity meter ("330" manufactured by Hitachi) so that the wave length dependency of the absorption coefficient of the i-layer was evaluated. Further, the band gap of the i-layer was measured by a method disclosed in "Amorphous Solar Cell", Kiyoshi Takahashi and Makoto Konagai, Shokodo, pp. 109.

The composition was analyzed in such a manner that the stainless steel substrate having the i-layer formed thereon was set to an Auger electron spectrum analyzing apparatus ("JAMP-3" manufactured by Nihon Denshi) to measure the composition ratio of Si atoms and Ge atoms. The results of the evaluations of the band gap and the composition are shown in Table 2.

Figure 18:
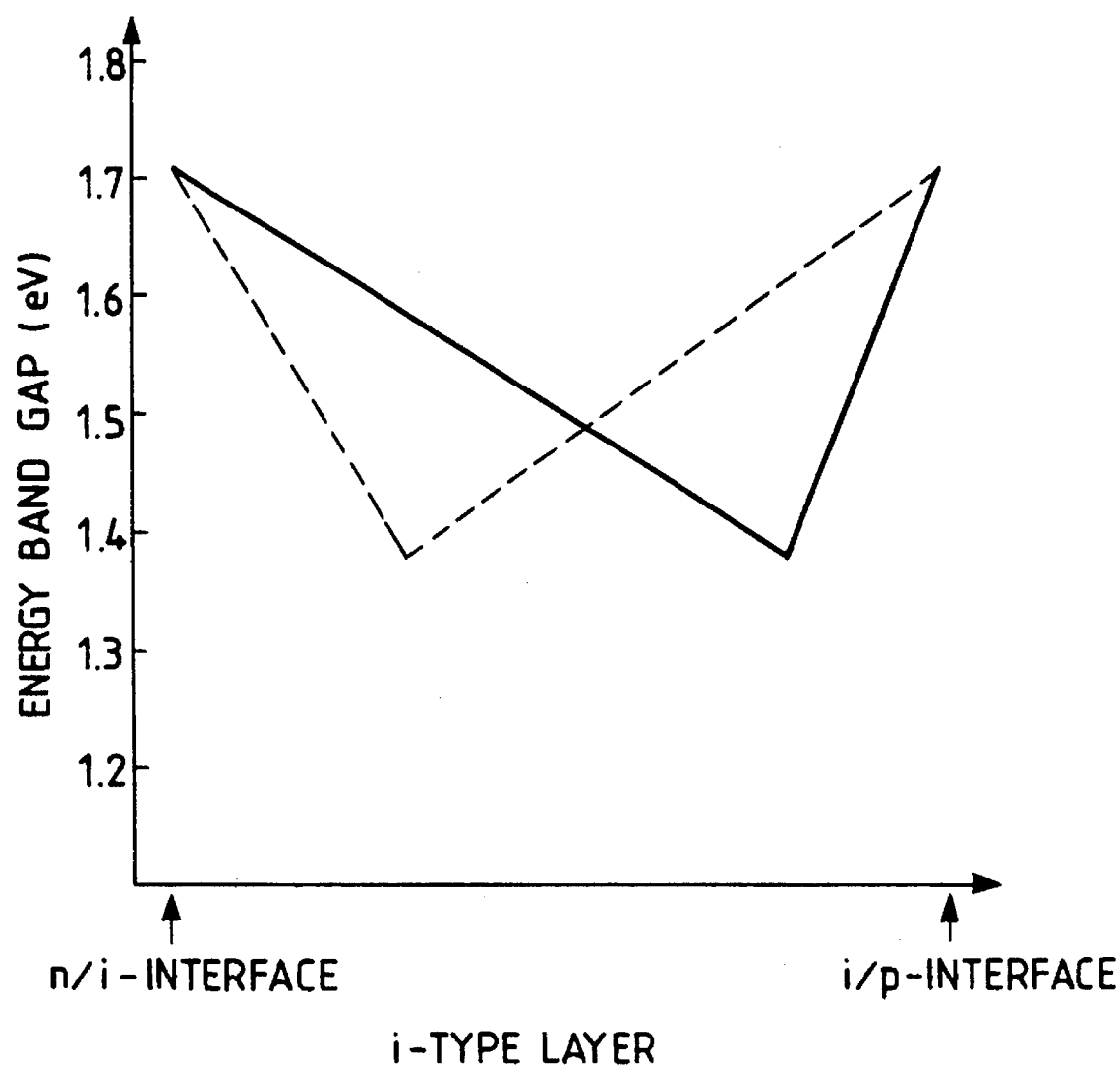
FIG. 18 is a graph which shows a change of the band gap in the i-layer occurring in the direction of the thickness.

The composition of Si atoms and Ge atoms in the direction of the i-layer of the photovoltaic devices Device No. Example 1 and Device No. Comparative Examples 1-1 and 1-2 was analyzed by a method similar to that employed to analyze the composition. In accordance with the relationship between the obtained composition ratio of Si atoms and Ge atoms of the photovoltaic devices Device Nos. Example 1 and Comparative Examples 1-1 and 1-2 and the band gap, the change of the band gap in the i-layer in the direction of the thickness of the i-layer was obtained. The results are shown in FIG. 18. As can be understood from FIG. 18, each of the photovoltaic devices Device Nos. Example 1 and Comparative Example 1-1 has the minimum band gap at a position concentrically toward the interface between the p-layer and the i-layer from the central position of the i-layer. Further, the photovoltaic device (Device No. Comparative Example 1-2) has the minimum band gap at a position concentrically to the interface between the n-layer and the i-layer from the central position of the i-layer.

As a result of the foregoing measurements, the photovoltaic device (Device No. Example 1) according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents respectively serving as the donor and the acceptor were doped, has excellent characteristics as compared with the photovoltaic devices (Device Nos. Comparative Examples 1-1 to 1-2). Thus, the effect of the present invention was confirmed.

EXAMPLE 2

Photovoltaic devices (Device Nos. Examples 2-1 to 2-8) were manufactured by, on the substrate, forming a reflecting layer, a reflection enhancing layer, an n-layer, an i-layer, a p-layer, a transparent electrode and a collecting electrode under the same conditions as those according to Example 1 except for that the flow of the SiH$_4$ gas and that of the GeH$_4$ gas were adjusted by the mass flow controllers 1021 and 1026 in accordance with the flow pattern shown in FIG. 16 similarly to Example 1, and then the flow of the SiH$_4$ gas was made to be 200 sccm and that of the GeH$_4$ gas was maintained at 1 sccm and the maximum band gap region was positioned in a portion having the thickness shown in Table 3 at the time of forming the i-layer.

TABLE 3

| Device No. | Thickness of Region of Maximum Value of Band Gap (nm) | Initial Characteristics Open Voltage | Curve Factor | Low Illuminance Characteristics Photoelectrical Conversion Efficiency | Durability Deterioration of Photoelectrical Conversion Efficiency |
| --- | --- | --- | --- | --- | --- |
| Example 2-1 | 1 | 1.03 | 1.03 | 1.11 | 1.09 |
| Example 2-2 | 2 | 1.04 | 1.03 | 1.12 | 1.11 |
| Example 2-3 | 3 | 1.04 | 1.03 | 1.13 | 1.12 |
| Example 2-4 | 5 | 1.04 | 1.03 | 1.13 | 1.13 |
| Example 2-5 | 10 | 1.04 | 1.04 | 1.14 | 1.11 |
| Example 2-6 | 20 | 1.05 | 1.03 | 1.12 | 1.09 |
| Example 2-7 | 30 | 1.04 | 1.03 | 1.11 | 1.09 |
| Example 2-8 | 50 | 1.01 | 1.02 | 1.06 | 1.04 |

(Note) The initial characteristics, the low illuminance characteristics and the durability are relative values with reference to those of Device No. Comparative Example 1-1.

The initial characteristics, the low illuminance characteristics and the durability of the manufactured photovoltaic devices (Device Nos. Examples 2-1 to 2-8) were measured by a method similar to that employed in Example 1. The results are shown in Table 3. As can be understood from Table 3, it was confirmed that the photovoltaic devices (Device No. Examples 2-1 to 2-8) according to the present invention and having the maximum band gap in a region having the thickness of 1 to 30 nm have excellent characteristics. Therefore, the effect of the present invention was confirmed.

EXAMPLE 3

A photovoltaic device (Device No. Example 3) was manufactured by, on the substrate, forming a reflecting layer, a reflection enhancing layer, an n-layer, an i-layer, a p-layer, a transparent electrode and a collecting electrode under the same conditions according to Example 1 except for that the i-layer was formed by using an AsH$_3$ gas cylinder for a AsH$_3$ gas diluted by H$_2$ gas to 2000 ppm (hereinafter abbreviated to "AsH$_3$/H$_2$") in place of the PH$_3$(2000 ppm)/H$_2$ gas cylinder and that the AsH$_3$/H$_2$ gas was allowed to flow in a quantity of 0.5 sccm.

The initial characteristics, the low illuminance characteristics and the durability of the manufactured photovoltaic device (Device No. Example 3) were measured by a method similar to that employed in Example 1. As a result of the measurements, the photovoltaic device (Device No. Example 3) exhibited superior characteristics to the photovoltaic device (Device No. Comparative Example 1-1) such that a 1.02 times of the open voltage of the initial characteristics, a 1.3 times of the curve factor of the same, a 1.07 times of the photoelectrical conversion efficiency of the low illuminance characteristics and a 1.06 times of the photoelectrical conversion efficiency of the durability characteristics were exhibited. As a result, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents was doped, has excellent characteristics. Thus, the effect of the present invention was confirmed.

EXAMPLE 4

Figure 19:
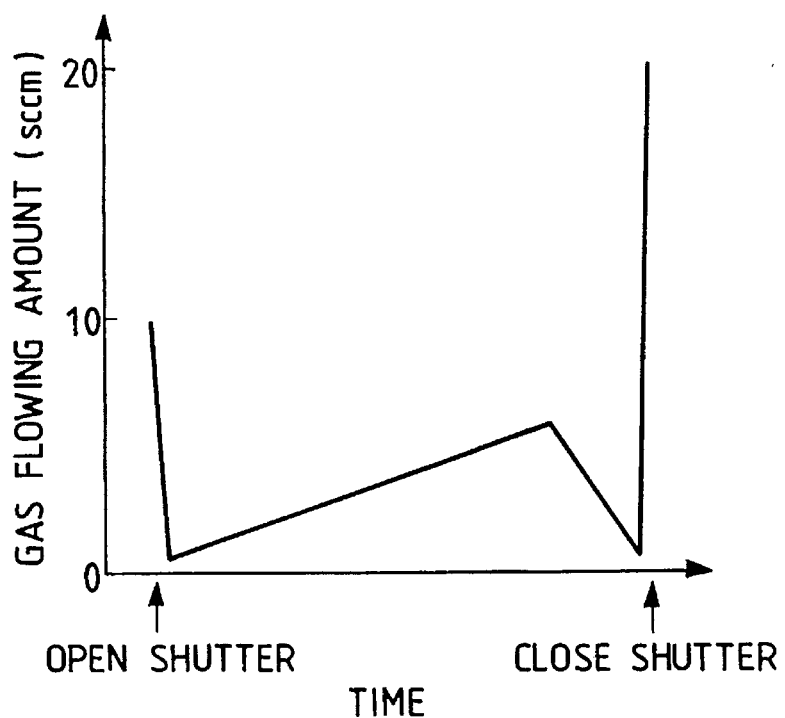
FIG. 19 is a graph which shows the time sequential changes of a $BF_3/H_2$ gas and a $PH_3/H_2$ gas to be introduced at the time of forming the i-layer and the changes of boron and phosphorus atoms contained in the i-layer in the direction of the thickness.
Figure 20:
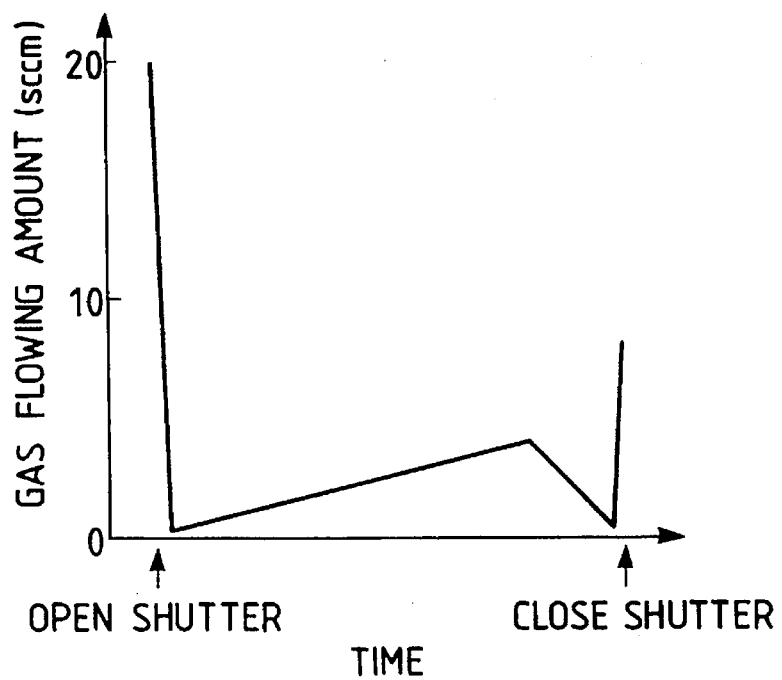
FIG. 20 is a graph which shows the time sequential changes of a $BF_3/H_2$ gas and a $PH_3/H_2$ gas to be introduced at the time of forming the i-layer and the changes of boron and phosphorus atoms contained in the i-layer in the direction of the thickness.

A photovoltaic device (Device No. Example 4) was manufactured by, on the substrate, forming a reflecting layer, a reflection enhancing layer, an n-layer, an i-layer, a p-layer, a transparent electrode and a collecting electrode under the same conditions as those according to Example 1 except for that the flow of the BF$_3$ (2000 ppm)/H$_2$ gas was adjusted in accordance with the flow pattern shown in FIG. 19 and that of the PH$_3$(2000 ppm)/H$_2$ gas was adjusted in accordance with the flow pattern shown in FIG. 20 by using the corresponding mass flow controllers 1027 and 1028 at the time of forming the i-layer.

The initial characteristics, the low illuminance characteristics and the durability of the manufactured photovoltaic device (Device No. Example 4) were measured by a method similar to that employed in Example 1. As a result of the measurements, the photovoltaic device (Device No. Example 4) exhibited superior characteristics to the photovoltaic device (Device No. Comparative Example 1-1) such that a 1.03 times of the open voltage of the initial characteristics, a 1.04 times of the curve factor of the same, a 1.08 times of the photoelectrical conversion efficiency of the low illuminance characteristics and a 1.08 times of the photoelectrical conversion efficiency of the durability characteristics were exhibited.

Figure 21:
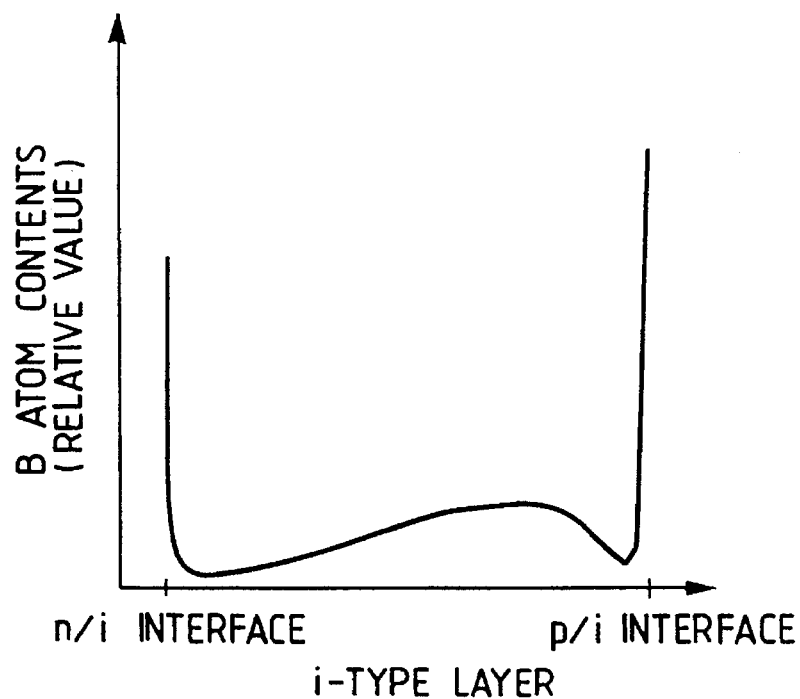
FIG. 21 is a graph which shows the time sequential changes of a $BF_3/H_2$ gas and a $PH_3/H_2$ gas to be introduced at the time of forming the i-layer and the changes of boron and phosphorus atoms contained in the i-layer in the direction of the thickness.
Figure 22:
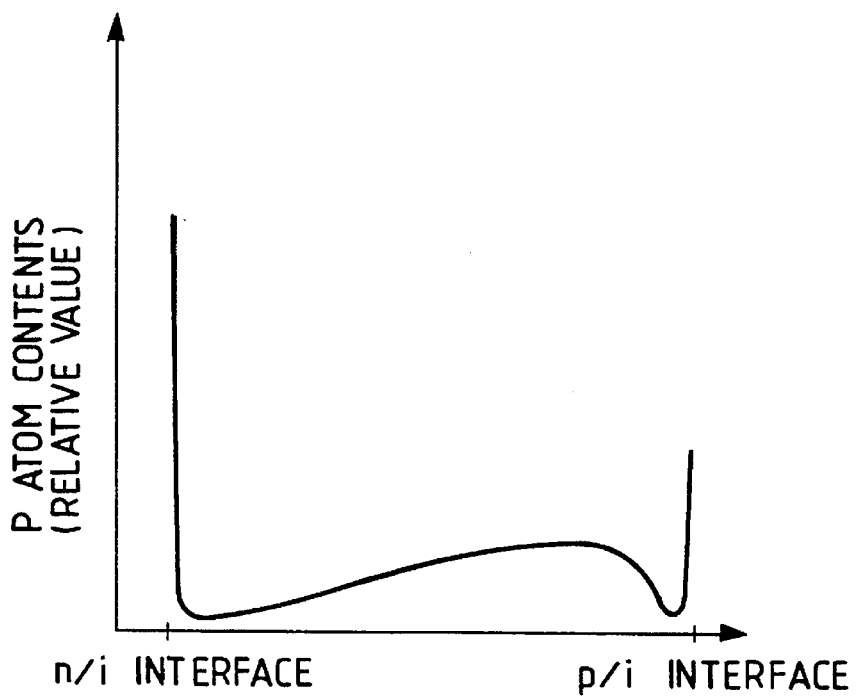
FIG. 22 is a graph which shows the time sequential changes of a $BF_3/H_2$ gas and a $PH_3/H_2$ gas to be introduced at the time of forming the i-layer and the changes of boron and phosphorus atoms contained in the i-layer in the direction of the thickness.

The distribution of boron atoms and phosphorus atoms in the i-layer of the photovoltaic device (Device No. Example 4) was analyzed by using the secondary ion mass analyzing apparatus ("IMS-3F" manufactured by CAMECA). The results are shown in FIGS. 21 and 22.

As a result of the foregoing measurements, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents were doped, has excellent characteristics as compared with the photovoltaic device (Device No. Comparative Example 1-1). Thus, the effect of the present invention was confirmed.

EXAMPLE 5

A photovoltaic device (Device No. Example 5) was manufactured by, on the substrate, forming a reflecting layer, a reflection enhancing layer, an n-layer, an i-layer, a p-layer, a transparent electrode and a collecting electrode under the same conditions as those according to Example 1 except for that the NO/He gas cylinder 1079 was used and the flow of the NO/He gas was made to be 0.5 sccm at the time of forming the i-layer.

The initial characteristics, the low illuminance characteristics and the durability of the manufactured photovoltaic device (Device No. Example 5) were measured by a method similar to that employed in Example 1. As a result of the measurements, the photovoltaic device (Device No. Example 5) exhibited superior characteristics to the photovoltaic device (Device No. Comparative Example 1-1) such that a 1.04 times of the open voltage of the initial characteristics, a 1.02 times of the curve factor of the same, a 1.09 times of the photoelectrical conversion efficiency of the low illuminance characteristics and a 1.10 times of the photoelectrical conversion efficiency of the durability characteristics were exhibited.

The composition of the photovoltaic device (Device No. Example 5) was analyzed by using the secondary ion mass analyzing apparatus ("IMS-3F" manufactured by CAMECA). As a result, it was confirmed that oxygen atoms and nitrogen atoms were contained in the i-layer.

As a result, the photovoltaic device according to the present invention, which had the band gap smoothly changed in the direction of the i-layer, in which the minimum band gap was positioned eccentrically toward the interface between the p-layer and the i-layer from the central position of the i-layer, which had the i-layer into which the valence control agents were doped, and which contained oxygen atoms and nitrogen atoms, had excellent characteristics as compared with the photovoltaic device (Device No. Comparative Example 1-1). Thus, the effect of the present invention was confirmed.

EXAMPLE 6

Figure 23:
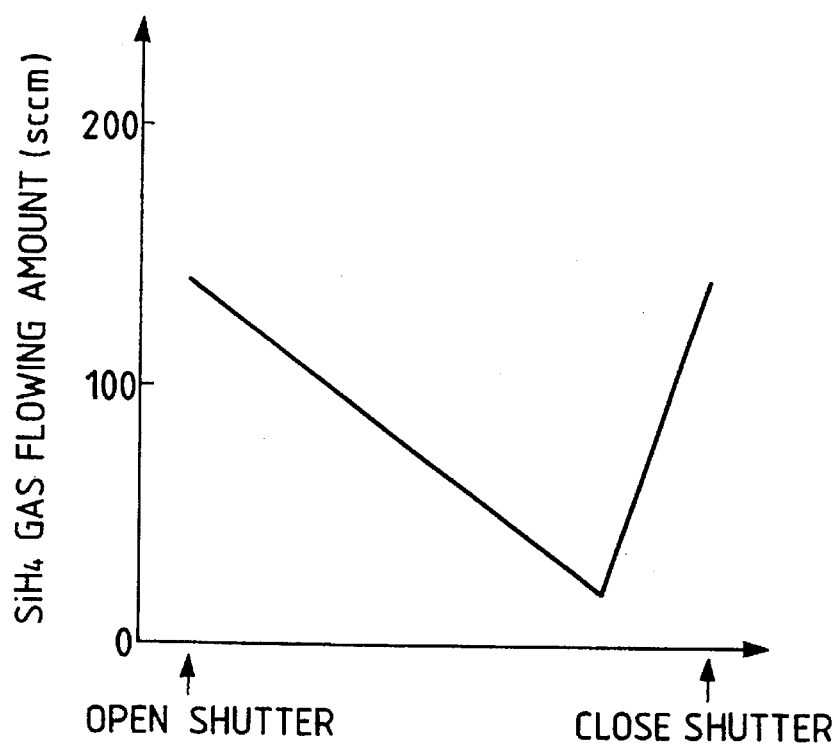
FIG. 23 is a graph which shows the time sequential change pattern of the flow of a $SiH_4$ gas at the time of forming the i-layer and changes in relative concentration of Si atoms and H atoms in the i-layer in the direction of the thickness.

A photovoltaic device (Device No. Example 6) was manufactured by, on the substrate, forming a reflecting layer, a reflection enhancing layer, an n-layer, an i-layer, a p-layer, a transparent electrode and a collecting electrode under the same conditions as those according to Example 1 except for that the Si$_2$H$_6$ gas cylinder was used, the flow of the Si$_2$H$_6$ gas was made to be 40 sccm and the flow of the SiH$_4$ gas was adjusted by the mass flow controller 1021 in accordance with the flow pattern shown in FIG. 23 at the time of forming the i-layer.

The initial characteristics, the low illuminance characteristics and the durability of the manufactured photovoltaic device (Device No. Example 6) were measured by a method similar to that employed in Example 1. As a result of the measurements, the photovoltaic device (Device No. Example 6) exhibited superior characteristics to the photovoltaic device (Device No. Comparative Example 1-1) such that a 1.04 times of the open voltage of the initial characteristics, a 1.04 times of the curve factor of the same, a 1.09 times of the photoelectrical conversion efficiency of the low illuminance characteristics and a 1.08 times of the photoelectrical conversion efficiency of the durability characteristics were exhibited.

Figure 24:
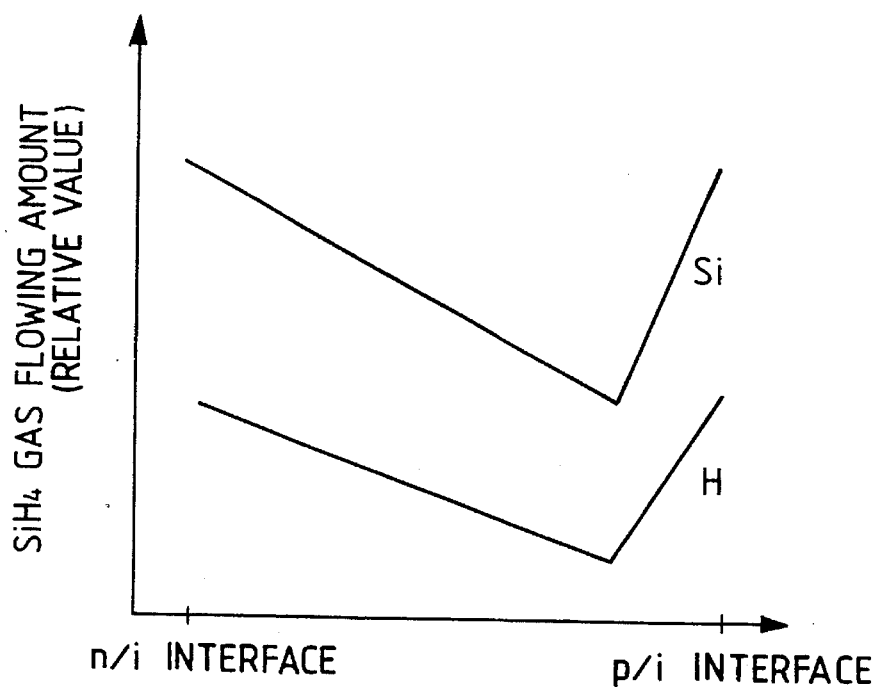
FIG. 24 is a graph which shows the time sequential change pattern of the flow of a $SiH_4$ gas at the time of forming the i-layer and changes in relative concentrate of Si atoms and H atoms in the i-layer in the direction of the thickness.

The distribution of Si atoms and hydrogen atoms in the i-layer of the photovoltaic device (Device No. Example 6) in the direction of the thickness of the i-layer was analyzed by using the secondary ion mass analyzing apparatus ("IMS-3F" manufactured by CAMECA). The results are shown in FIG. 24.

As a result, the photovoltaic device according to the present invention, which had the band gap smoothly changed in the direction of the i-layer, in which the minimum band gap was positioned eccentrically toward the interface between the p-layer and the i-layer from the central position of the i-layer, which had the i-layer into which the valence control agents were doped, and in which the content of hydrogen atoms changes to correspond to the content of Si atoms, had excellent characteristics as compared with the photovoltaic device (Device No. Comparative Example 1-1). Thus, the effect of the present invention was confirmed.

EXAMPLE 7

Photovoltaic devices (Device Nos. Examples 7-1 to 7-6 and Comparative Example 2-1) were manufactured by, on the substrate, forming a reflecting layer, a reflection enhancing layer, an n-layer, an i-layer, a p-layer, a transparent electrode and a collecting electrode under the same conditions as those according to Example 1 except for that the pressure in the deposition chamber 1001 was adjusted to a value shown in Table 4 by using the conductance valve 1007 at the time of forming the i-layer.

TABLE 4

| Device No. | Pressure in Deposition Chamber (mTorr) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Example 7-1 | 0.5 | 1.02 | 1.02 | 1.06 | 1.05 |
| Example 7-2 | 1 | 1.02 | 1.03 | 1.07 | 1.07 |
| Example 7-3 | 2 | 1.03 | 1.03 | 1.09 | 1.07 |
| Example 7-4 | 5 | 1.03 | 1.04 | 1.09 | 1.07 |
| Example 1 | 10 | 1.02 | 1.03 | 1.07 | 1.08 |
| Example 7-5 | 20 | 1.02 | 1.02 | 1.07 | 1.08 |
| Example 7-6 | so | 1.02 | 1.02 | 1.06 | 1.06 |
| Comparative Example 2-1 | 100 | 1.00 | 1.00 | 1.00 | 1.00 |

(Note) The initial characteristics, the low illuminance characteristics and the durability are relative values with reference to those of Device No. Comparative Example 2-1.

The initial characteristics, the low illuminance characteristics and the durability of the manufactured photovoltaic devices (Device Nos. Examples 7-1 to 7-6 and Comparative Example 2-1) were measured by a method similar to that employed in Example 1. The results are shown in Table 4. As can be understood from Table 4, making of the pressure in the deposition chamber 1001 to be 50 mTorr or lower enabled a further excellent photovoltaic device to be obtained.

Then, the i-layer was formed on the substrate by opening the shutter 1013 for 2 minutes under the same manufacturing conditions as those for forming the i-layer according to Example 1 except for that barium boro-silicated glass ("7059" manufactured by Coning) was used, the flow of the $SiH_4$ gas and that of the $GeH_4$ gas were made to be values shown in Table 5, and the power of the microwave power source was made to be the value shown in Table 5. As a result, samples for measuring the efficiency of decomposing the raw material gas were manufactured.

TABLE 5

| Flow of Gas (sccm) | | Efficiency of Decomposing Raw Material Gas at each Microwave Power (W/cm³) | | | | |
| --- | --- | --- | --- | --- | --- | --- |
| $SiH_4$ | $GeH_4$ | 0.1 | 0.2 | 0.3 | 0.4 | 0.5 |
| 200 | 1 | 24 | 45 | 68 | 93 | 100 |
| 170 | 20 | 25 | 48 | 73 | 97 | 100 |
| 140 | 40 | 27 | 51 | 76 | 99 | 100 |
| 110 | 60 | 28 | 53 | 81 | 100 | 100 |
| 80 | 80 | 31 | 58 | 88 | 100 | 100 |

The thickness of each of the manufactured sample for measuring the efficiency of decomposing the raw material gas was measured by using a thickness measuring apparatus ("alpha-step 100" manufactured by TENCOR INSTRUMENTS), the thickness being used to obtain the efficiency of decomposing the raw material gas. The results are shown in Table 5.

Photovoltaic devices (Device Nos. Examples 7-7 to 7-9 and Comparative Examples 2-2 to 2-3) were manufactured by, on the substrate, forming a reflecting layer, a reflection enhancing layer, an n-layer, an i-layer, a p-layer, a transparent electrode and a collecting electrode under the same conditions as those according to Example 1 except for that the power of the microwave power source was made to be the value shown in Table 6 at the time of forming the i-layer.

TABLE 6

| Device No. | Microwave (W/cm³) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Example 7-7 | 0.1 | 1.02 | 1.03 | 1.08 | 1.07 |
| Example 7-8 | 0.2 | 1.02 | 1.04 | 1.08 | 1.09 |
| Example 7-9 | 0.3 | 1.02 | 1.03 | 1.09 | 1.07 |
| Comparative Example 2-2 | 0.4 | 1.00 | 1.01 | 1.02 | 1.01 |
| Comparative Example 2-3 | 0.5 | 1.00 | 1.00 | 1.00 | 1.00 |

(Note) The initial characteristics, the low illuminance characteristics and the durability are relative values with reference to those of Device No. Comparative Example 2-3.

The initial characteristics, the low illuminance characteristics and the durability of the manufactured photovoltaic devices (Device Nos. Examples 7-7 to 7-9 and Comparative Examples 2-2 to 2-3) were measured by a method similar to that employed in Example 1. The results of the measurements are shown in Table 6. As can be understood from Table 6, it was confirmed that an excellent photovoltaic device can be obtained by decomposing the raw material gas with microwave energy smaller than the microwave energy needed to completely decompose the raw material gas.

Photovoltaic devices (Device Nos. Examples 7-10 to 7-13 and Comparative Example 2-4) were manufactured by, on the substrate, forming a reflecting layer, a reflection enhancing layer, an n-layer, an i-layer, a p-layer, a transparent electrode and a collecting electrode under the same conditions as those according to Example 1 except for that the RF bias was made to be as shown in Table 7 at the time of forming the i-layer.

tive Example 2-4) were measured by a method similar to that employed in Example 1. The results of the measurements are shown in Table 7. As can-be understood from Table 7, it was confirmed that an excellent photovoltaic device can be obtained by causing RF energy larger than the microwave energy to act on the raw material gas.

EXAMPLE 8

A photovoltaic device (Device No. Example 8) was manufactured by, on the substrate, forming a reflecting layer, a reflection enhancing layer, an n-layer, an i-layer, a p-layer, a transparent electrode and a collecting electrode under the same conditions as those according to Example 1 except for that the distance from a point at which the $SiH_4$ gas and the $GeH_4$ gas were mixed in the raw material gas supply apparatus 1020 to the deposition chamber 1001 was made as shown in Table 8.

TABLE 7

| Device No. | RF Bias (W/cm³) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Comparative Example 2-4 | 150 | 1.00 | 1.00 | 1.00 | 1.00 |
| Example 7-10 | 200 | 1.02 | 1.02 | 1.04 | 1.03 |
| Example 7-11 | 250 | 1.02 | 1.02 | 1.05 | 1.06 |
| Example 7-12 | 300 | 1.03 | 1.03 | 1.06 | 1.07 |
| Example 7-13 | 350 | 1.03 | 1.04 | 1.07 | 1.05 |

(Note) The initial characteristics, the low illuminance characteristics and the durability are relative values with reference to those of Device No. Comparative Example 2-4.

The initial characteristics, the low illuminance characteristics and the durability of the manufactured photovoltaic devices (Device Nos. Examples 7-10 to 7-13 and Compara-

TABLE 8

| Device No. | Distance from Gas Mixing Point to Deposition Chamber (m) | Initial Characteristics Open Voltage | Initial Characteristics Curve Factor | Low Illuminance Characteristics Photoelectrical Conversion Efficiency | Durability Deterioration of Photoelectrical Conversion Efficiency |
| --- | --- | --- | --- | --- | --- |
| Example 8-1 | 1 | 1.03 | 1.03 | 1.05 | 1.07 |
| Example 7-10 | 2 | 1.03 | 1.04 | 1.06 | 1.06 |
| Example 7-11 | 3 | 1.03 | 1.03 | 1.04 | 1.06 |
| Example 7-12 | 5 | 1.02 | 1.03 | 1.03 | 1.04 |
| Example 7-13 | 8 | 1.00 | 1.00 | 1.00 | 1.00 |

(Note) The initial characteristics, the low illuminance characteristics and the durability are relative values with reference to those of Device No. Example 8-5.

The initial characteristics, the low illuminance characteristics and the durability of the manufactured photovoltaic device (Device No. Example 8) were measured by a method similar to that employed in Example 1. The results of the measurements are shown in Table 8. As can be understood from Table 8, it was confirmed that a further excellent photovoltaic device can be obtained by making the distance from the point at which the $SiH_4$ gas and the $GeH_4$ gas were mixed to the deposition chamber 1001 to be 5 m or shorter.

EXAMPLE 9

A photovoltaic device was manufactured under the same conditions as those employed in Example 1, the photovoltaic device being used to form a solar cell module. Then, an analog clock having a circuit structured as shown in FIG. 26 was manufactured. In FIG. 26, electric power generated in a solar cell module 9101 was charged into a secondary battery 9104 via the checking diode 9102. Reference numeral 9103 represents a supercharge-prevention diode.

The electric power supplied from the solar cell module 9101 and the secondary battery 9104 are supplied to a drive circuit 9105 of the analog clock.

As a comparative example, a photovoltaic device was manufactured under the same conditions as those employed to manufacture Device No. comparative example 1-1. By using this, an analog clock arranged similarly to Example 9 was manufactured.

The analog clocks according to Example 9 and the comparative example were placed of the wall of a room to illuminate the room for 8.5 hours every day. The analog clock according to Example 9 was able to work for a whole day as contrasted with the analog clock according to the comparative example which was not able to work for a whole day. Thus, an effect of the generating system according to the present invention was confirmed.

EXAMPLE 10

A photovoltaic device (Device No. Example 10) was manufactured by, on the substrate, forming a reflecting layer, a reflection enhancing layer, an n-layer, an i-layer, a p-layer, a transparent electrode and a collecting electrode under the same conditions as those according to Example 1 except for that the flow of the $SiH_4$ gas and that of the $GeH_4$ gas were adjusted by using the mass flow controllers 1021 and 1026 in accordance with the flow pattern shown in FIG. 10 at the time of forming the i-layer.

The initial characteristics, the low illuminance characteristics and the durability of the manufactured photovoltaic device (Device No. Example 10) were measured by a method similar to that employed in Example 1. As a result, the initial characteristics, the low illuminance characteristics and the durability similar to that obtained from Example 1 were realized. Thus, the effect of the present invention was confirmed.

EXAMPLE 11

A photovoltaic device (Device No. Example 11) was manufactured by, on the substrate, forming a reflecting layer, a reflection enhancing layer, an n-layer, an i-layer, a p-layer, a transparent electrode and a collecting electrode under the same conditions as those according to Example 1 except for that a $B_2H_6$ gas cylinder for $B_2H_6$ gas diluted by a $H_2$ gas to 1% (hereinafter abbreviated to "$B_2H_6$ (1%)/$H_2$") was used in place of the $BF_3$ (2000 ppm)/$H_2$ gas and the $B_2H_6$ (1%)/$H_2$ gas was allowed to flow by 1 sccm at the time of forming the i-layer.

The initial characteristics, the low illuminance characteristics and the durability of the manufactured photovoltaic device (Device No. Example 11) were measured by a method similar to that employed in Example 1. As a result, the initial characteristics, the low illuminance characteristics and the durability similar to that obtained from Example 1 were realized. Thus, the effect of the present invention was confirmed.

EXAMPLE 12

Figure 32:
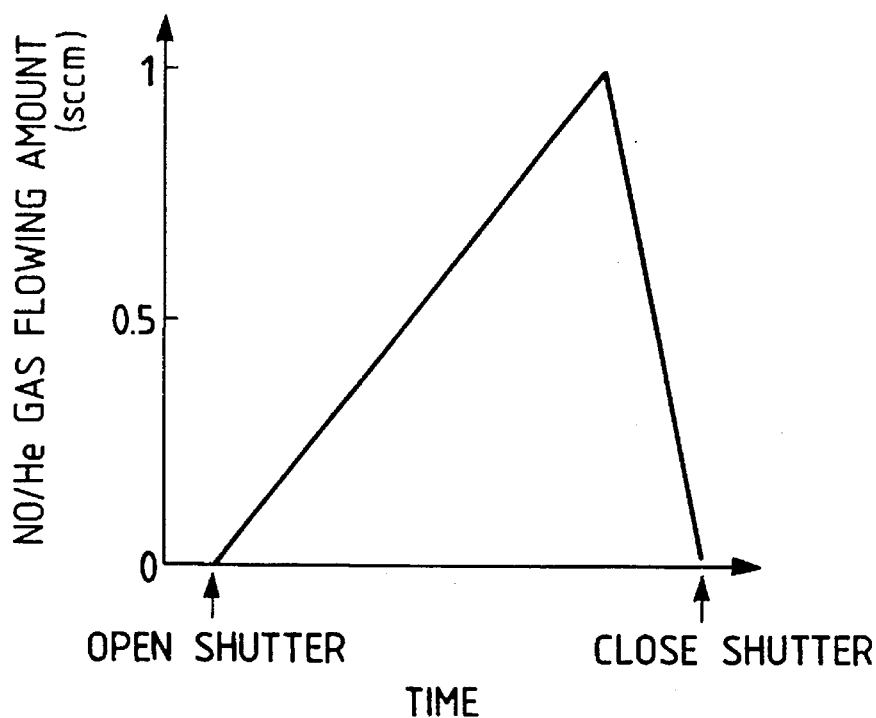
FIG. 32 is a graph which shows the time sequential change of a NO/He gas to be introduced at the time of forming the i-layer and the changes of N and O atoms contained in the i-layer occurring in the direction of the thickness.

A photovoltaic device (Device No. Example 12) was manufactured by, on the substrate, forming a reflecting layer, a reflection enhancing layer, an n-layer, an i-layer, a p-layer, a transparent electrode and a collecting electrode under the same conditions as those according to Example 1 except for that the NO/He gas was adjusted by the mass flow controller 1029 in accordance with the flow pattern shown in FIG. 32.

The initial characteristics, the low illuminance characteristics and the durability of the manufactured photovoltaic device (Device No. Example 12) were measured by a method similar to that employed in Example 1. As a result, the initial characteristics, the low illuminance characteristics and the durability similar to that obtained from Example 1 were realized.

Figure 33:
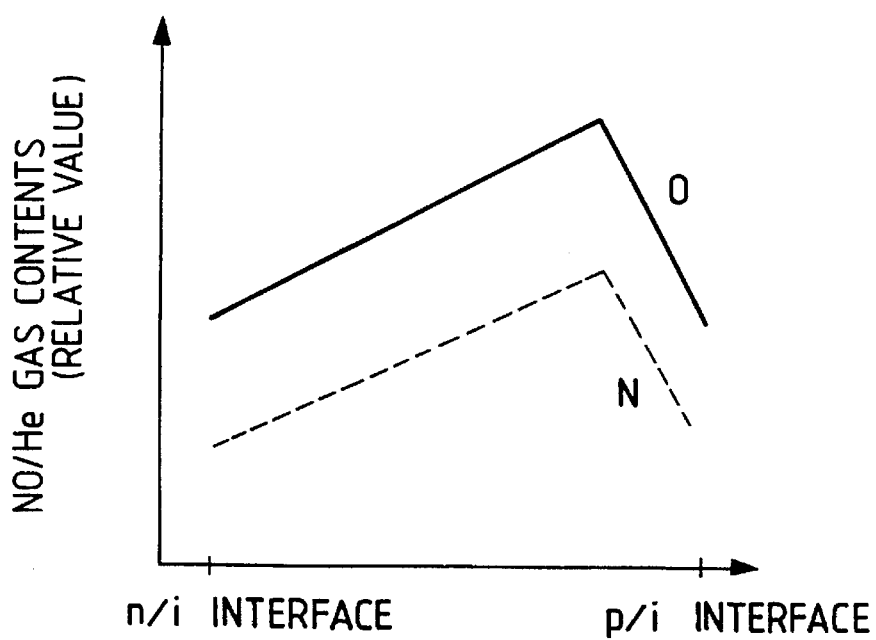
FIG. 33 is a graph which shows the time sequential change of a NO/He gas to be introduced at the time of forming the i-layer and the changes of N and O atoms contained in the i-layer occurring in the direction of the thickness.

Further the distribution of nitrogen atoms and oxygen atoms of the photovoltaic device according to Example 12 (Device No. Example 12) in the i-layer was analyzed by the secondary ion mass analyzing apparatus. The results are shown in FIG. 33.

As a result of the foregoing measurements, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents were doped, has excellent characteristics. Thus, the effect of the present invention was confirmed.

EXAMPLE 13

A photovoltaic device (Device No. Example 13) was manufactured by, on the substrate, forming a reflecting layer, a reflection enhancing layer, an n-layer, an i-layer, a p-layer, a transparent electrode and a collecting electrode under the same conditions as those employed to form the i-layer except for that the flow of the $SiH_4$ gas and that of the $GeH_4$ gas were adjusted by the mass flow controllers 1021 and 1026 in accordance with the flow pattern shown in FIG. 12 at the time of forming the i-layer similarly to Example 1, and the microwave glow discharge was temporarily interrupted and the flow of the $SiH_4$ gas flow was adjusted to be 200 sccm by the mass flow controller 1021 while interrupting the flow of the $GeH_4$ gas. Further, the same manufacturing conditions as those employed in Example 1 were employed except for that the maximum band gap region of 10 nm was formed in the i-layer.

The initial characteristics, the low illuminance characteristics and the durability of the manufactured photovoltaic device (Device No. Example 13) were measured by a method similar to that employed in Example 1. As a result, the initial characteristics, the low illuminance characteristics and the durability similar to that obtained from Example 1 were realized. Thus, the effect of the present invention was confirmed.

EXAMPLE 14

A photovoltaic device (Device No. Example 14) was manufactured by, on the substrate, forming a reflecting layer, a reflection enhancing layer, an n-layer, an i-layer, a p-layer, a transparent electrode and a collecting electrode under the same conditions as those according to Example 1 except for that the RF bias of the bias power source 1011 was set to 250 mW/cm$^3$ and the DC bias was set to 50 V via the RF cutting coil to apply them to the bias rod 1012 at the time of forming the i-layer at the time of forming the i-layer.

The initial characteristics, the low illuminance characteristics and the durability of the manufactured photovoltaic device (Device No. Example 14) were measured by a method similar to that employed in Example 1. As a result, the initial characteristics, the low illuminance characteristics and the durability similar to that obtained from Example 1 were realized. Thus, the effect of the present invention was confirmed.

EXAMPLE 15

A photovoltaic device (Device No. Example 15) was manufactured by, on the substrate, forming a reflecting layer, a reflection enhancing layer, an n-layer, an i-layer, a p-layer, a transparent electrode and a collecting electrode under the same conditions as those according to Example 1 except for that a $D_2$ gas cylinder (omitted from illustration) was used in place of the $H_2$ gas cylinder to allow the $D_2$ gas to flow by 300 sccm at the time of forming the i-layer.

The initial characteristics, the low illuminance characteristics and the durability of the manufactured photovoltaic device (Device No. Example 15) were measured by a method similar to that employed in Example 1. As a result, the initial characteristics, the low illuminance characteristics and the durability similar to that obtained from Example 1 were realized. Further, the composition of the photovoltaic device according to Example 15 (Device No. Example 15) was analyzed by the secondary ion mass analyzing apparatus, resulting in that the fact that D ions were contained in the i-layer was confirmed. Thus, the effect of the present invention was confirmed.

EXAMPLE 16

A photovoltaic device (Device No. Example 16) was manufactured by, on the substrate, forming a reflecting layer, a reflection enhancing layer, an n-layer, an i-layer, a p-layer, a transparent electrode and a collecting electrode under the same conditions as those according to Example 1 except for that the DC bias of the bias power source 1011 was changed from 50 V to 80 V at a predetermined rate simultaneously with opening of the shutter 1013 at the time of forming the n-layer.

The initial characteristics, the low illuminance characteristics and the durability of the manufactured photovoltaic device (Device No. Example 16) were measured by a method similar to that employed in Example 1. As a result, the initial characteristics, the low illuminance characteristics and the durability similar to that obtained from Example 1 were realized. Thus, the effect of the present invention was confirmed.

EXAMPLE 17

The manufacturing apparatus used in Example 1, comprising the raw material gas supply apparatus 1020 and the deposition apparatus 1100 and adapted to the RF plasma CVD method was used to form the n- and p-layers of the photovoltaic device according to the present invention.

Referring to the drawing, reference numeral 1104 represents a substrates similar to that according to Example 1. The gas cylinders 1071 to 1079 were filled with the raw material gases similarly to Example 1. By the same operation procedure similar to Example 1, the respective gases were introduced into the mass flow controllers 1021 to 1029.

After the preparation for forming the film had been made, the n-layer was formed on the substrate 1104.

The n-layer was formed by heating the substrate 1104 to 350° C. by using the heater 1105 and by gradually opening the discharge valves 1042, 1044, 1045 and the sub-valve 1008 so that the $H_2$ gas, the $PH_3$ (1%)/$H_2$ gas and the $Si_2H_6$ gas were introduced into the deposition chamber 1101 through the gas introduction pipe 1103. At this time, the flow of the $H_2$ gas was made to be 50 sccm, the flow of the $PH_3$ (1%)/$H_2$ gas was made to be 5 sccm and the flow of the $Si_2H_6$ gas was made to be 3 sccm by the regulating operations performed by the corresponding mass flow controllers 1022, 1024 and 1025. The pressure in the deposition chamber 1101 was made to be 1 Torr by adjusting the opening of the conductance valve 1107 while observing the vacuum meter 1106.

Then, the power of the RF power source 1111 was set to 120 mW/cm$^2$ to be supplied to a cathode 1102 via an RF matching box 1112 so that the RF glow discharge was caused to occur. Thus forming of the n-layer on the substrate 1104 was commenced. When the n-layer having a thickness of 10 nm was formed, the RF glow discharge was stopped, the discharge valve 1042, 1044, 1045 and the sub-valve 1108 were closed to stop the gas introduction into the deposition chamber. Thus, forming of the n-layer was completed.

The substrate 1104, on which the n-layer had been formed, was taken out from the deposition chamber 1101, and then the substrate 1104 was placed in a deposition apparatus 1000 adapted to the microwave plasma CVD method so that an i-layer was formed on the n-layer similarly to Example 1.

The substrate 1004, on which the i-layer had been formed, was taken out from the deposition chamber 1000, and then the substrate 1004 was placed in a deposition apparatus 1100 adapted to the RF plasma CVD method so that a p-layer was formed. The p-layer was formed by heating the substrate 1104 to 200° C. by using the heater 1105 and by gradually opening the discharge valves 1041 to 1043 and the sub-valve 1108 so that the $SiH_4$ gas, $H_2$ gas and the $BF_3$ (1%)/$H_2$ gas were introduced into the deposition chamber 1101 through the gas introduction pipe 1103. At this time, the flow of the $SiH_4$ gas was made to be 0.5 sccm, the flow of the $H_2$ gas was made to be 100 sccm and the flow of the $BF_3$ (1%)/$H_2$ gas was made to be 1 sccm by the regulating operations performed by the corresponding mass flow controllers 1021 to 1023. The pressure in the deposition chamber 1101 was made to be 1 Torr by adjusting the opening of the conductance valve 1107 while observing the vacuum meter 1106. Then, the power of the RF power source 1111 was set to 2 W/cm$^2$ so that the RF power was supplied to the cathode 1102 through the RF matching box 1112 to cause the RF glow discharge to occur. Thus, forming of the p-layer on the i-layer was commenced. When the p-layer having a thickness of 5 nm was formed, the RF glow discharge was stopped, the discharge valves 1041 to 1043 and the sub-valve 1108 were closed to stop the gas introduction into the deposition chamber 1101. Thus, forming of the p-layer was completed.

The residual discharge valves 1041 to 1049 must be completely closed at the time of forming the respective layers. Further, undesirable leaving of the gases in the deposition chamber 1101 and the pipes arranged from the discharge valve 1041 to 1049 to the deposition chamber 1101 is prevented by closing the discharge valves 1041 to 1049, opening the sub-valve 1108 and completely opening the conductance valve 1107 so that the inside portion of the system is exhausted to realize a vacuum state if necessary.

Then, the transparent electrode and the collecting electrode were formed on the p-layer by evaporation similarly to Example 1 so that the photovoltaic device was manufactured (Battery No. Example 17). The conditions for manufacturing the photovoltaic device are shown in Table 9.

TABLE 9

| Substrate | SUS430BA 50 mm × 50 mm having a thickness of 1 mm |
| --- | --- |
| Reflecting Layer | Silver (Ag) thin film 100 nm |
| Reflection Enhaning Layer | Zinc Oxide (ZnO) thin film 1 μm |

| Forming Conditions | Name of Layer | Gas and Flow of Gas (sccm) | | RF Discharge Power (W/cm$^3$) | Pressure (Torr) | Temperature of Substrate (°C.) | Thickness of Layer (nm) |
| --- | --- | --- | --- | --- | --- | --- | --- |
| | n-layer | $Si_2H_6$ | 3 | 0.12 | 1 | 350 | 10 |
| | | $PH_3/H_2$ (diluted to 1%) | 5 | | | | |
| | | $H_2$ | 50 | | | | |
| | i-layer | | | Same as Example 1 | | | |
| | p-layer | $SiH_2$ | 0.5 | 2 | 1 | 200 | 5 |
| | | $H_2$ | 100 | | | | |
| | | $BF_3/H_2$ (diluted to 1%) | 1 | | | | |
| Transparent Electrode | ITO ($In_2O_3$ + $SnO_2$) thin film 70 nm | | | | | | |
| Collecting Electrode | Aluminum (Al) thin film 2 μm | | | | | | |

A photovoltaic device (Comparative Example 3) was manufactured by, on the substrate, forming a reflecting layer, a reflection enhancing layer, an n-layer, an i-layer, a p-layer, a transparent electrode and a collecting electrode under the same conditions as those according to Example 17 except for that $BF_3$ (200 ppm)/$H_2$ and $PH_3$ (2000 ppm)/$H_2$ were not used.

The initial characteristics, the low illuminance characteristics and the durability of the manufactured photovoltaic devices (Device Nos. Example 17 and Comparative Example 3) were measured by a method similar to that employed in Example 1. As a result of the measurements, the photovoltaic device (Device No. Example 17) exhibited superior characteristics to the photovoltaic device (Device No. Comparative Example 3) such that a 1.02 times of the open voltage of the initial characteristics, a 1.04 times of the curve factor of the same, a 1.08 times of the photoelectrical conversion efficiency of the low illuminance characteristics and a 1.06 times of the photoelectrical conversion efficiency of the durability characteristics were exhibited. As a result, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents was doped, has excellent characteristics. Thus, the effect of the present invention was confirmed.

EXAMPLE 18

A photovoltaic device (Device No. Example 18) was manufactured by forming, on the substrate, a reflecting layer, a reflection enhancing layer, a first n-layer, a first i-layer, a first p-layer, a second n-layer, a second i-layer, a second p-layer, a transparent electrode and a collecting electrode by a method similar to that employed in Example 1 under the manufacturing conditions shown in Table 10.

TABLE 10

| Substrate | SUS430BA 50 mm × 50 mm having a thickness of 1 mm |
| Reflecting Layer | Silver (Ag) thin film 100 nm |
| Reflection Enhancing Layer | Zinc Oxide (ZnO) thin film 1 μm |

Figure 35:
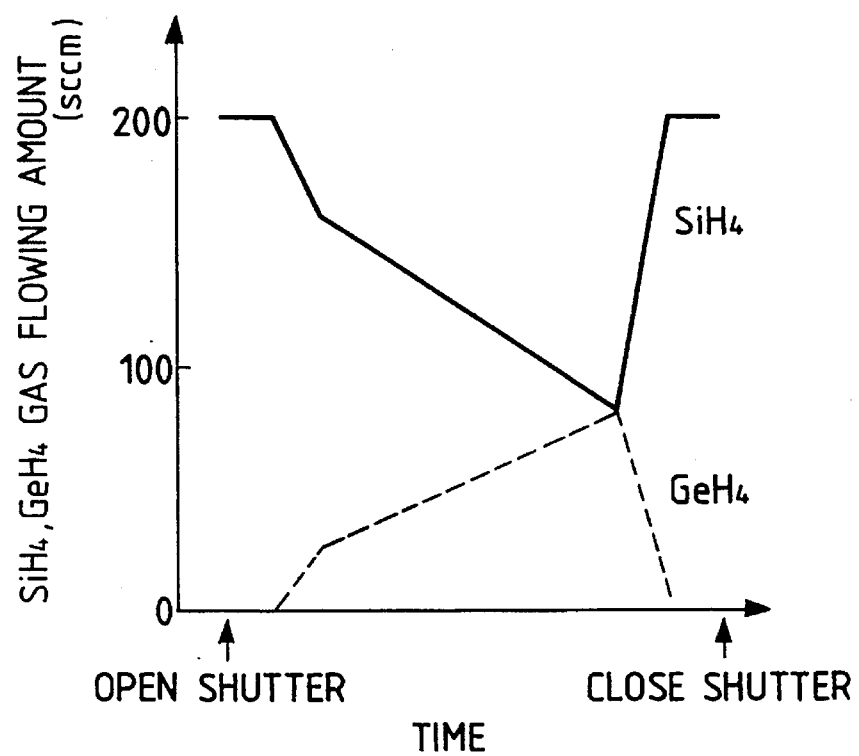
FIG. 35 is a graph which shows the time sequential changes of the flows of the $SiH_4$ gas and the $GeH_4$ gas.

| Forming Conditions | Name of Layer | Gas and Quantity of Gas (sccm) | Discharge Power | Bias | Pressure (mTorr) | Temperature of Substrate (°C.) | Thickness of Layer (nm) |
|---|---|---|---|---|---|---|---|
| | First n-layer | $Si_2H_6$ 1<br>$H_2$ 50<br>$PH_3/H_2$ 1<br>(diluted to 1%) | RF 80 ($mW/cm^2$) | | 1500 | 370 | 20 |
| | First i-layer | $SiH_4$ (see FIG. 35)<br>$H_2$ 500<br>$BF_3/H_2$ 0.2<br>(diluted to 2000 ppm)<br>$PH_3/H_2$ 0.1<br>(diluted to 2000 ppm)<br>$GeH_4$ (see FIG. 35) | Microwave 170 ($mW/cm^2$) | RF 350 ($mW/cm^3$) DC0V | 8 | 350 | 300 |
| | First p-layer | $SiH_4$ 0.05<br>$H_2$ 100<br>$BF_3/H_2$ 5<br>(diluted to 1%) | RF 1.5 ($mW/cm^2$) | | 2000 | 250 | 10 |
| | Second n-layer | $SiH_6$ 1<br>$H_2$ 50<br>$PH_3/H_2$ 1<br>(diluted to 1%) | RF 80 ($mW/cm^2$) | | 1500 | 300 | 10 |
| | Second i-layer | $SiH_4$ 200<br>$H_2$ 700 | Microwave 130 ($mW/cm^3$) | RF 250 ($mW/cm^3$) DC0V | 5 | 300 | 150 |
| | Second p-layer | $SiH_4$ 0.05<br>$H_2$ 100<br>$BF_3/H_2$ 5<br>(diluted to 1%) | RF 1.5 ($mW/cm^2$) | | 2000 | 200 | 5 |

| Transparent Electrode | ITO ($In_2O_3 + SnO_2$) thin film 70 nm |
| Collecting Electrode | Aluminum (Al) thin film 2 μm |

Another photovoltaic device (Device No. Comparative Example 4) was manufactured by forming a first n-layer, a first i-layer, a first p-layer, a second n-layer, a second i-layer, a second p-layer, a transparent electrode and a collecting electrode under the manufacturing conditions similar to that employed in Example 18 except for that $BF_3$(2000 ppm)/$H_2$ and $PH_3$(2000 ppm)/$H_2$ were not used at the time of forming the first i-layer.

The initial characteristics, the low illuminance characteristics and the durability of the manufactured photovoltaic device (Device Nos. Example 18 and Comparative Example 4) were measured by a method similar to that employed in Example 1. As a result of the measurements, the photovoltaic device (Device No. Example 18) exhibited superior characteristics to the photovoltaic device (Device No. Comparative Example 4) such that a 1.02 times of the open voltage of the initial characteristics, a 1.03 times of the curve factor of the same, a 1.08 times of the photoelectrical conversion efficiency of the low illuminance characteristics and a 1.07 times of the photoelectrical conversion efficiency of the durability characteristics were exhibited. As a result, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents was doped, has excellent characteristics. Thus, the effect of the present invention was confirmed.

EXAMPLE 19

A photovoltaic device (Device No. Example 19) was manufactured by forming, on the substrate, a reflecting layer, a reflection enhancing layer, a first n-layer, a first i-layer, a first p-layer, a second n-layer, a second i-layer, a second p-layer, a third n-layer, a third i-layer and a third p-layer, a transparent electrode and a collecting electrode by a method similar to that employed in Example 1 under the manufacturing conditions shown in Table 11.

TABLE 11

| | | | | | | | |
|---|---|---|---|---|---|---|---|
| Substrate | SUS430BA 50 mm × 50 mm having a thickness of 1 mm | | | | | | |
| Reflecting Layer | Silver (Ag) thin film 100 nm | | | | | | |
| Reflection Enhancing Layer | Zinc Oxide (ZnO) thin film 1 μm | | | | | | |

Figure 36:
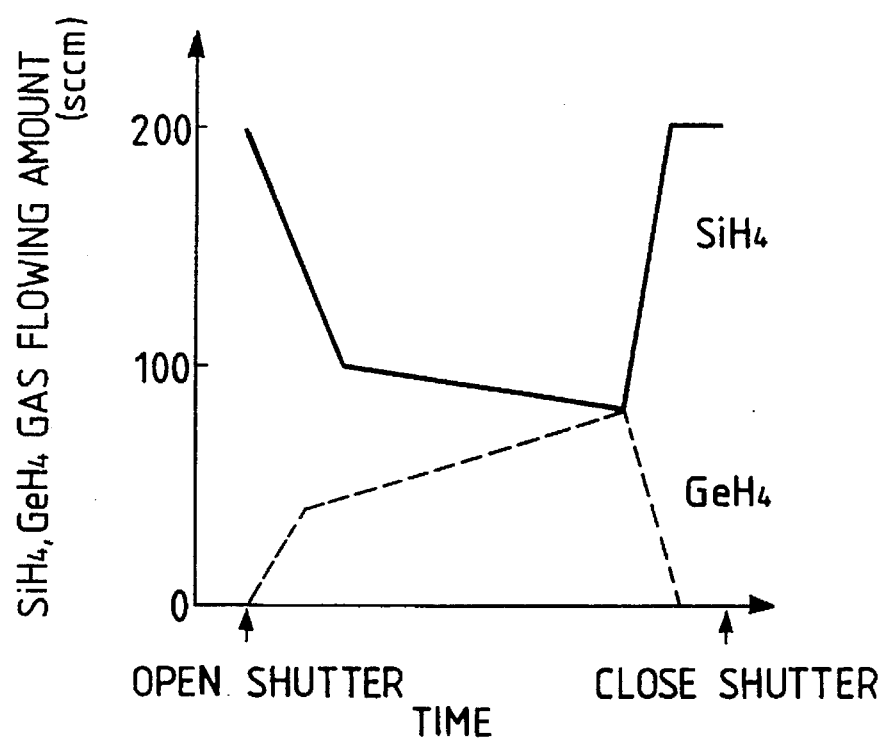
FIG. 36 is a graph which shows the time sequential changes of the flows of the $SiH_4$ gas and the $GeH_4$ gas.
Figure 37:
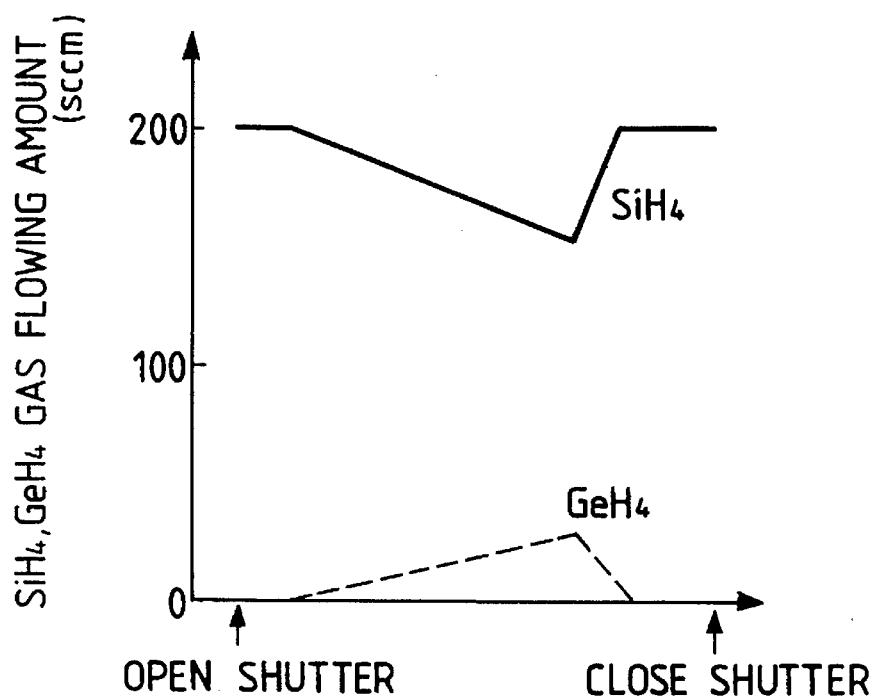
FIG. 37 is a graph which shows the time sequential changes of the flows of the $SiH_4$ gas and the $GeH_4$ gas.

| Forming Conditions | Name of Layer | Gas and Quantity of Gas (sccm) | | Microwave Discharge Power (mW/cm³) | Bias | Pressure (mTorr) | Temperature of Substrate (°C.) | Thickness of Layer (nm) |
|---|---|---|---|---|---|---|---|---|
| | First n-layer | SiH₄<br>PH₃/H₂<br>(diluted to 1%) | 50<br>200 | 130 | DC50V | 10 | 350 | 10 |
| | First i-layer | SiH₄<br>(see FIG. 36)<br>H₂<br>BF₃/H₂<br>(diluted to 2000 ppm)<br>P₃/H₂<br>(diluted to 2000 ppm)<br>GeH₄<br>(see FIG. 36) | <br><br>500<br>0.5<br><br>0.2 | 170<br><br>DC0V | RF 350<br>(mW/cm³) | 8 | 350 | 250 |
| | First p-layer | SiH₄<br>H₂<br>BF₃/H₂<br>(diluted to 1%) | 10<br>700<br>30 | 250 | | 25 | 350 | 10 |
| | Second n-layer | SiH₄<br>PH₃/H₂<br>(diluted to 1%) | 50<br>200 | 130 | DC50V | 10 | 350 | 10 |
| | Second i-layer | SiH₄<br>(see FIG. 37)<br>H₂<br>BF₃/H₂<br>(diluted to 2000 ppm)<br>PH₃/H₂<br>(diluted to 2000 ppm)<br>GeH₄<br>(see FIG. 37) | <br><br>500<br>0.3<br><br>0.1 | 210 | RF280<br>(mW/cm³)<br>DC0V | 8 | 350 | 200 |
| | Second p-layer | SiH₄<br>H₂<br>BF₃/H₂<br>(diluted to 1%) | 10<br>700<br>30 | 250 | | 25 | 350 | 10 |
| | Third n-layer | SiH₄<br>PH₃/H₂<br>(diluted to 1%) | 50<br>200 | 130 | DC50V | 10 | 350 | 10 |
| | Third i-layer | SiH₄<br>H₂ | 200<br>700 | 150 | RF 300<br>(mW/cm³)<br>DC0V | 5 | 300 | 100 |
| | Third p-layer | SiH₄<br>H₂<br>BF₃/H₂<br>(diluted to 1%) | 10<br>700<br>30 | 250 | | 25 | 300 | 5 |

| | |
|---|---|
| Transparent Electrode | ITO (In₂O₃ + SnO₂) thin film 70 nm |
| Collecting Electrode | Aluminum (Al) thin film 2 μm |

Another photovoltaic device (Device No. Comparative Example 5) was manufactured by forming, on the substrate, a reflecting layer, a reflection enhancing layer, a first n-layer, a first i-layer, a first p-layer, a second n-layer, a second i-layer, a second p-layer, a third n-layer, a third i-layer and a third p-layer, a transparent electrode and a collecting electrode under the manufacturing conditions similar to that employed in Example 19 except for that BF₃ (2000 ppm)/H₂ and PH₃ (2000 ppm)/H₂ were not used at the time of forming the first i-layer.

The initial characteristics, the low illuminance characteristics and the durability of the manufactured photovoltaic device (Device Nos. Example 19 and Comparative Example 5) were measured by a method similar to that employed in Example 1. As a result of the measurements, the photovoltaic device (Device No. Example 19) exhibited superior characteristics to the photovoltaic device (Device No. Comparative Example 5) such that a 1.03 times of the open voltage of the initial characteristics, a 1.03 times of the curve factor of the same, a 1.07 times of the photoelectrical conversion efficiency of the low illuminance characteristics and a 1.09 times of the photoelectrical conversion efficiency of the durability characteristics were exhibited. As a result, the photovoltaic device according to the present invention, which had the band gap smoothly changed in the direction of the i-layer, in which the minimum band gap was positioned eccentrically toward the interface between the p-layer and the i-layer from the central position of the i-layer and which had the i-layer into which the valence control agents was doped, has excellent characteristics. Thus, the effect of the present invention was confirmed.

EXAMPLE 20

Figure 14:
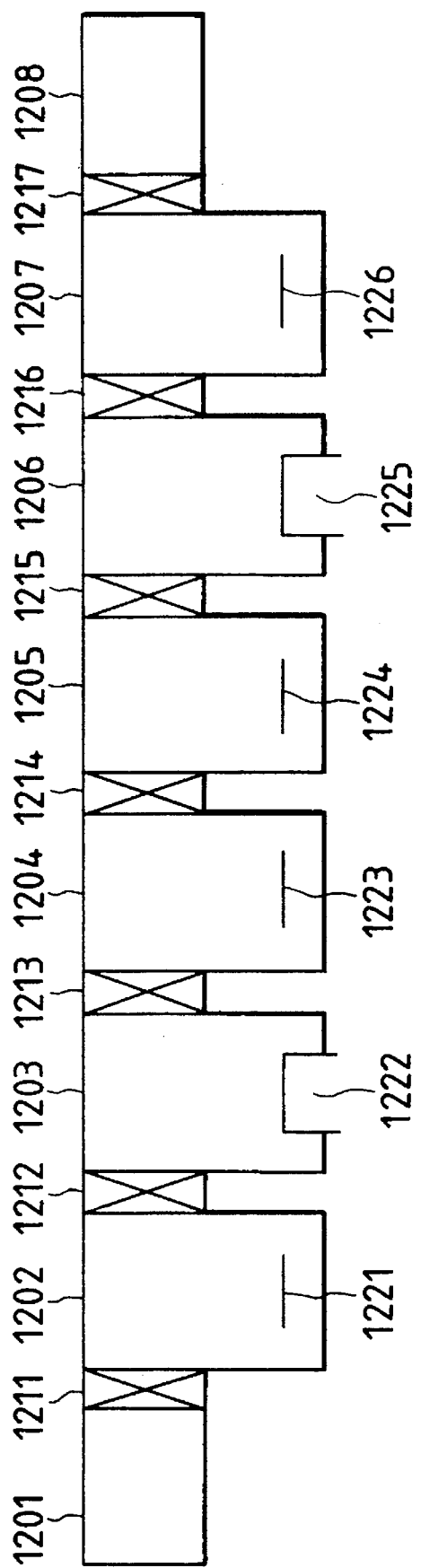
FIG. 14 is a schematic view which illustrates an example of a separated multi-chamber deposition apparatus for manufacturing the photovoltaic device according to the present invention.

A photovoltaic device according to the present invention was manufactured by a separated multi-chamber deposition apparatus shown in FIG. 14. Referring to FIG. 14, reference numerals 1201 and 1028 respectively represent a loading chamber and an unloading chamber, 1202, 1204, 1205 and 1027 represent deposition chambers for respective layers adapted to the RF plasma CVD method similar to those employed in Example 17, 1203 and 1206 represent deposition chambers for respective layers adapted to the microwave plasma CVD method similar to those employed in Example 1, 1211 to 1217 represent gate valves for insulating the respective chambers, 1221, 1223, 1224 and 1226 represent cathode electrodes, and 1222 and 1225 respective represent a microwave guide portion and a dielectric window.

First, the substrate was placed in the loading chamber 1201, and then the loading chamber 1201 was exhausted to realize a vacuum state. Then, the gate valve 1211 was opened to shift the substrate into the first n-layer deposition chamber 1202, and then the gate valve 1211 was closed. Then, the first n-layer was formed on the substrate under the same conditions employed to form the first n-layer of Example 18. Then, the gate valve 1212 was opened to shift the substrate into the first i-layer deposition chamber 1203, and then the gate valve 1212 was closed. Then, the first i-layer was formed on the first n-layer under the same conditions employed to form the first i-layer of Example 18. Then, the gate valve 1213 was opened to shift the substrate into the first p-layer deposition chamber 1204, and then the gate valve 1213 was closed. Then, the first p-layer was formed on the first i-layer under the same conditions employed to form the first p-layer of Example 18. Then, the gate valve 1214 was opened to shift the substrate into the second n-layer deposition chamber 1205, and then the gate valve 1214 was closed. Then, the second n-layer was formed on the first p-layer under the same conditions employed to form the second n-layer of Example 18. Then, the gate valve 1215 was opened to shift the substrate into the second i-layer deposition chamber 1206, and then the gate valve 1215 was closed. Then, the second i-layer was formed on the second n-layer under the same conditions employed to form the second i-layer of Example 18. Then, the gate valve 1216 was opened to shift the substrate into the second p-layer deposition chamber 1207, and then the gate valve 1216 was closed. Then, the second p-layer was formed on the second i-layer under the same conditions employed to form the second p-layer of Example 18. Then, the gate valve 1217 was opened to shift the substrate into the unloading chamber 1208, and then the gate valve 1217 was closed. Then, the substrate was taken out from the unloading chamber 1208 so that the photovoltaic device (Device No. Example 20) was manufactured.

The initial characteristics, the low illuminance characteristics and the durability of the manufactured photovoltaic device (Device No. Example 20) were measured by a method similar to that employed in Example 1. As a result of the measurements, the photovoltaic device (Device No. Example 20) exhibited superior characteristics to the photovoltaic device (Device No. Example 18) such that a 1.01 times of the open voltage of the initial characteristics, a 1.02 times of the curve factor of the same, a 1.02 times of the photoelectrical conversion efficiency of the low illuminance characteristics and a 1.03 times of the photoelectrical conversion efficiency of the durability characteristics were exhibited. As a result, the photovoltaic device according to the present invention and manufactured by the separated multi-chamber deposition apparatus, which had the band gap smoothly changed in the direction of the i-layer, in which the minimum band gap was positioned eccentrically toward the interface between the p-layer and the i-layer from the central position of the i-layer and which had the i-layer into which the valence control agents was doped, has further excellent characteristics. Thus, the effect of the present invention was confirmed.

EXAMPLE 21

A photovoltaic device was manufactured under the same conditions as those employed in Example 18, the photovoltaic device being used to manufacture a solar cell module to manufacture a ventilating fan to be mounted on a vehicle and having a circuit arranged as shown in FIG. 26. As shown in FIG. 26, electric power generated in the solar cell module 9101 bonded to the bonnet of a vehicle passes through a checking diode 9102 to be charged into a secondary battery 9104. Reference numeral 9103 represents a supercharge prevention diode. Electric power supplied from the solar cell module 9101 and that from the secondary battery 9104 are supplied to a motor 9105 of the ventilating fan.

As a comparative example, a photovoltaic device was manufactured under the same conditions as those according to Comparative Example 4, the photovoltaic device being used to manufacture a ventilating fan arranged similarly to Example 21.

The vehicle to which the ventilating fans according to Example 21 and the comparative example was allowed to stand for 168 hours in an idling state in which the engine was rotated. Then, the engine rotation was stopped and allowed to stand while operating the ventilating fan under the sunshine. The temperature in the compartment of the vehicle was measured. As a result, the vehicle cooling fan according to Example 21 exhibited a temperature which was lower than that realized by the cooling fan according to the comparative example by three degrees. Thus, the effect of the generating system according to the present invention was confirmed.

EXAMPLE 22

In this example, a photovoltaic device was manufactured in which the valence control agent was not doped into the i-layer and the p-layer was formed into a stacked structure.

The $BF_3$ (1%)/$H_2$ gas cylinder of the raw material gas supply apparatus 1020 shown in FIG. 12 was replaced by a ($B_2H_6$/$H_2$) gas cylinder for a $B_2H_6$ gas diluted by a $H_2$ gas to 10%.

Similarly to Example 1, the reflection layer, the reflection enhancing layer and the n-layer were formed on the SUS substrate, and then the i-layer and the p-layer were formed as follows:

The i-layer was formed similarly to Example 1 except for that the $BF_3$ (2000 ppm)/$H_2$ gas and the $PH_3$ (2000 ppm)/$H_2$ gas were not introduced and that the pressure in the deposition chamber was made as shown in Table 13.

Then, the p-layer formed by stacking a doping layer A and a doping layer B was formed.

A doping layer B1 was formed by heating the substrate 1004 to 300° C. by using the heater 1005 and by gradually opening the discharge valves 1041, 1042, 1047 and the sub-valve 1008 so that the $SiH_4$ gas, the $H_2$ gas and the $BF_3$ (2000 ppm)/$H_2$ gas were introduced into the deposition chamber 1001 through the gas introduction pipe 1003. At this time, the flow of the $SiH_4$ gas was made to be 1 sccm, the flow of the $H_2$ gas was made to be 300 sccm and the flow of the $BF_3$ (2000 ppm)/$H_2$ gas was made to be 2 sccm by the regulating operations performed by the corresponding mass flow controllers 1021, 1022 and 1027. The pressure in the deposition chamber 1001 was made to be 25 mTorr by adjusting the opening of the conductance valve 1007 while observing the vacuum meter 1006.

Then, the power of the microwave power source (omitted from illustration) was set to 50 mW/$cm^3$ to be supplied into the deposition chamber 1001 through the wave guide pipe (omitted from illustration), the wave guide portion 1010 and the dielectric window 1002 so that the microwave glow discharge was caused to occur. The shutter 1013 was then opened so that forming of the doping layer B1 on the i-layer was commenced. When the doping layer B1 having a thickness of 0.5 nm was formed, the shutter 1013 was closed to stop the microwave glow discharge. Then, the discharge valves 1041, 1042, 1047 and the sub-valve 1008 were closed, and the gas introduction into the deposition chamber 1001 was stopped.

The doping layer A was formed by heating the substrate 1004 to 300° C. by using the heater 1005 and by gradually opening the discharge valve 1043 and the sub-valve 1008 so that the $B_2H_6/H_2$ gas was introduced into the deposition chamber 1001 through the gas introduction pipe 1003. At this time, the flow of the $B_2H_6/H_2$ gas was made to be 100 sccm by the regulating operation performed by the mass flow controller 1023. The pressure in the deposition chamber 1001 was made to be 30 mTorr by adjusting the opening of the conductance valve 1007 while observing the vacuum meter 1006.

Then, the power of the microwave power source (omitted from illustration) was set to 50 mW/$cm^3$ to be supplied into the deposition chamber 1001 through the wave guide pipe (omitted from illustration), the wave guide portion 1010 and the dielectric window 1002 so that the microwave glow discharge was caused to occur. The shutter 1013 was then opened so that forming of the doping layer A1 on the doping layer B1 was commenced. When the doping layer A having a thickness of 0.3 nm was formed, the shutter 1013 was closed to stop the microwave glow discharge. Then, the discharge valve 1043 and the sub-valve 1008 were closed, and the gas introduction into the deposition chamber 1001 was stopped.

Then, the doping layer B2 was formed on the doping layer A under the same conditions as those for forming the doping layer B1 except for that the thickness was made to be 10 nm.

Then, an ITO ($In_2O_3+SnO_2$) thin film serving as the transparent electrode was formed on the p-layer to have a thickness of 70 μm and an aluminum (Al) thin film serving as the collecting electrode was vacuum-evaporated on the same to have a thickness of 2 μm so that photovoltaic devices (Device Nos. Examples 22-1 to 22-7 and Comparative Example 6-1) were manufactured. The conditions for manufacturing the foregoing photovoltaic devices are shown in Table 12.

TABLE 12

| | | | | | | | |
|---|---|---|---|---|---|---|---|
| Substrate | SUS430BA 50 mm × 50 mm having a thickness of 1 mm | | | | | | |
| Reflecting Layer | Silver (Ag) thin film 100 mn | | | | | | |
| Reflection Enhancing Layer | Zinc Oxide (ZnO) thin film 1 μm | | | | | | |

| Forming Conditions | Name of Layer | Gas and Quantity of Gas (sccm) | | Microwave Discharge Power (mW/cm$^3$) | Bias | Pressure (mTorr) | Temperature of Substrate (°C.) | Thickness of Layer (nm) |
|---|---|---|---|---|---|---|---|---|
| | n-layer | SiH$_4$ | 50 | 130 | DC50V | 10 | 350 | 10 |
| | | PH/H$_2$ (diluted to 1%) | 200 | | | | | |
| | i-layer | SiH$_4$ (see FIG. 16) | | 170 | RF 350 (mW/cm$^3$) DC0V | Table 13 | 350 | 300 |
| | | H$_2$ | 500 | | | | | |
| | | GeH$_4$ (see FIG. 16) | | | | | | |
| | Doping layer B1 in p-layer | SiH$_4$ | 1 | 50 | | 25 | 300 | 0.5 |
| | | H$_2$ | 300 | | | | | |
| | | BFIH$_2$ (2000 ppm) | 2 | | | | | |
| | Doping Layer A in p-layer | B$_2$H$_6$/H$_2$ | 100 | 50 | | 30 | 300 | 0.3 |
| | Doping Layer B2 in p-layer | SiH$_4$ | 1 | 50 | | 25 | 300 | 10 |
| | | H$_2$ | 300 | | | | | |
| | | BF$_3$/H$_2$ (2000 ppm) | 2 | | | | | |
| Transparent Electrode | ITO (In$_2$O$_3$ + SnO$_2$) thin film 70 nm | | | | | | |
| Correcting Electrode | Aluminum (Al) thin film 2 μm | | | | | | |

The initial characteristics, the low illuminance characteristics and the durability of the manufactured photovoltaic devices (Device Nos. Examples 22-1 to 22-7 and Comparative Example 6-1) were measured. The results are shown in Table 13.

TABLE 13

| Device No. | Pressure in Deposition Chamber (mTorr) | Initial Characteristics | | Low Illuminance Characteristics | Durability Deterioration of |
|---|---|---|---|---|---|
| | | Open Voltage | Curve Factor | Photoelectrical Conversion Efficiency | Photoelectrical Conversion Efficiency |
| Example 22-1 | 0.5 | 1.02 | 1.02 | 1.05 | 1.05 |
| Example 22-2 | 1 | 1.02 | 1.02 | 1.05 | 1.05 |
| Example 22-3 | 2 | 1.03 | 1.02 | 1.06 | 1.06 |
| Example 22-4 | 5 | 1.03 | 1.04 | 1.06 | 1.08 |
| Example 22-5 | 10 | 1.04 | 1.03 | 1.07 | 1.07 |
| Example 22-6 | 20 | 1.03 | 1.03 | 1.06 | 1.07 |
| Example 22-7 | 50 | 1.02 | 1.02 | 1.06 | 1.06 |
| Comparative Example 6-1 | 100 | 1.00 | 1.00 | 1.00 | 1.00 |

(Note) The initial characteristics, the low illuminance characteristics and the durability are relative values with reference to those of Device No. Comparative Example 6-1.

As can be understood from Table 13, an excellent photovoltaic device can be obtained by forming it when the pressure in the deposition chamber for forming the i-layer is 50 mTorr or lower.

Then, the i-layer was formed on the substrate by opening the shutter 1013 for 2 minutes under the same manufacturing conditions as those for forming the i-layer of the device (Device No. Example 22-5) except for that a stainless steel substrate and a barium boro-silicated glass ("7059" manufactured by Coning) substrate were used and the flow of the SiH$_4$ gas and that of the GeH$_4$ gas were made to be values shown in Table 5. As a result, samples for measuring the efficiency of decomposing the raw material gas were manufactured. The thickness of the manufactured samples for measuring the efficiency of decomposing the raw material gas was measured by a thickness measuring unit to obtain the efficiency of decomposing the raw material gas. The results were the same as those shown in Table 5.

Then, photovoltaic devices (Device Nos. Example 22-8 to 22-10 and Comparative Example 6-2 and 6-3) were manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 22-5) except for that power of the microwave power source was made to be the value shown in Table 14 at the time of forming the i-layer.

energy larger than the microwave energy to act on the raw material gases.

Then, the i-layer was formed on the substrate under the same manufacturing conditions as those for forming the i-layer of the device (Device No. Example 22-5) except for that a stainless steel substrate and a barium boro-silicated

TABLE 14

| Device No. | Microwave (W/cm$^3$) | Initial Characteristics | | Low Illuminance Characteristics | Durability Deterioration of |
| | | Open Voltage | Curve Factor | Photoelectrical Conversion Efficiency | Photoelectrical Conversion Efficiency |
| --- | --- | --- | --- | --- | --- |
| Example 22-8 | 0.1 | 1.02 | 1.02 | 1.07 | 1.06 |
| Example 22-9 | 0.2 | 1.02 | 1.02 | 1.07 | 1.07 |
| Example 22-10 | 0.3 | 1.01 | 1.01 | 1.08 | 1.06 |
| Comparative Example 6-2 | 0.4 | 1.00 | 1.01 | 1.02 | 1.00 |
| Comparative Example 6-3 | 0.5 | 1.00 | 1.00 | 1.00 | 1.00 |

(Note) The initial characteristics, the low illuminance characteristics and the durability are relative values with reference to those of Device No. Comparative Example 6-3.

The initial characteristics, the low illuminance characteristics and the durability of the manufactured photovoltaic devices (Device Nos. Example 22-8 to 22-10 and Comparative Examples 6-2 and 6-3) were measured by a method similar to that employed in Example 1. The results are shown in Table 14. As can be understood from Table 14, an excellent photovoltaic device can be manufactured by decomposing the raw material gases with microwave energy smaller than that needed to completely decompose the raw material gas.

Then, photovoltaic devices (Device Nos. Example 22-11 to 22-14 and Comparative Example 6-4) were manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 22-5) except for that the RF bias was made to be the value shown in Table 15 at the time of forming the i-layer.

glass ("7059" manufactured by Coning) substrate were used and the flow of the SiH$_4$ gas and that of the GeH$_4$ gas were made to be values shown in Table 2. As a result, samples for measuring the physical properties were manufactured. The band gap and the composition of each of the manufactured samples for measuring the physical properties were analyzed to obtain the relationship between the composition ratio of Si atoms and Ge atoms and the band gap. The results were the same as those shown in Table 2.

Then, a photovoltaic device (Device No. Comparative Example 6-5) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 22-5) except for that the flow of the SiH$_4$ gas and that of the GeH$_4$ gas were adjusted by the mass flow controllers 1021 and 1026 in accordance with the flow pattern shown in FIG. 17 at the time of forming the i-layer.

TABLE 15

| Device No. | RF Bias (mW/cm$^3$) | Initial Characteristics | | Low Illuminance Characteristics | Durability Deterioration of |
| | | Open Voltage | Curve Factor | Photoelectrical Conversion Efficiency | Photoelectrical Conversion Efficiency |
| --- | --- | --- | --- | --- | --- |
| Comparative Example 6-4 | 150 | 1.00 | 1.00 | 1.00 | 1.00 |
| Example 22-11 | 200 | 1.01 | 1.02 | 1.06 | 1.07 |
| Example 22-12 | 250 | 1.03 | 1.03 | 1.07 | 1.08 |
| Example 22-13 | 300 | 1.03 | 1.02 | 1.06 | 1.08 |
| Example 22-14 | 350 | 1.02 | 1.02 | 1.06 | 1.06 |

(Note) The initial characteristics, the low illuminance characteristics and the durability are relative values with reference to those of Device No. Comparative Example 6-4.

The initial characteristics, the low illuminance characteristics and the durability of the manufactured photovoltaic devices (Device Nos. Example 22-11 to 22-14 and Comparative Example 6-4) were measured by a method similar to that employed in Example 1. The results are shown in Table 15. As can be understood from Table 15, an excellent photovoltaic device can be manufactured by causing RF The initial characteristics, the low illuminance characteristics and the durability of the manufactured photovoltaic device (Device No. Comparative Example 6-5) were measured by a method similar to that employed in Example 1. As a result of the measurements, the photovoltaic device (Device No. Example 22-5) exhibited superior characteristics to the photovoltaic device (Device No. Comparative Example 6-5) such that a 1.02 times of the open voltage of the initial characteristics, a 1.02 times of the curve factor of the same, a 1.08 times of the photoelectrical conversion efficiency of the low illuminance characteristics and a 1.07 times of the photoelectrical conversion efficiency of the durability characteristics were exhibited.

The change of the band gap in the i-layer in the direction of the thickness of the i-layer was obtained. The photovoltaic device given the Device No. Example 22-5 has the minimum band gap positioned concentrically toward the interface between the p-layer and the i-layer from the central position of the i-layer. The photovoltaic device (Device No. Comparative Example 6-5) has the minimum band gap positioned concentrically toward the interface between the n-layer and the i-layer from the central position of the i-layer.

Then, a photovoltaic device (Device No. Comparative Example 6-6) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 22-5) except for that the doping layer A was not formed but only the doping layer B was formed at the time of forming the p-layer.

The initial characteristics, the low illuminance characteristics and the durability of the manufactured photovoltaic device (Device No. Comparative Example 6-6) were measured by a method similar to that employed in Example 1. As a result of the measurements, the photovoltaic device energy, the band gap was changed smoothly in the direction of the thickness of the layer, the minimum band gap was positioned concentrically toward the interface between the p-layer and the i-layer from the central position of the i-layer, and the p-layer and/or the n-layer was formed into a stacked structure consisting of a layer mainly composed of group III element and/or group V element of the periodic table and a layer containing the valence control agent and mainly composed of silicon atoms.

EXAMPLE 23

Photovoltaic devices (Device Nos. Examples 23-1 to 23-8) were manufactured by, on the substrate, forming a reflecting layer, a reflection enhancing layer, an n-layer, an i-layer, a p-layer, a transparent electrode and a collecting electrode under the same conditions as those employed to manufacture the photovoltaic device (Device No. Example 22-5) according to Example 22 except for that the flow of the $SiH_4$ gas and that of the $GeH_4$ gas were adjusted by the mass flow controllers 1021 and 1026 in accordance with the flow pattern shown in FIG. 16 similarly to Example 22 at the time of forming the i-layer, then the flow of the $SiH_4$ gas was maintained at 200 sccm and that of the $GeH_4$ gas was maintained at 1 sccm and then the maximum band gap was positioned in the region having the thickness shown in Table 16.

TABLE 16

| Device No. | Thickness Region of Maximum Value of Band Gap (nm) | Initial Characteristics | | Low Illuminance Characteristics | Durability Deterioration of |
|---|---|---|---|---|---|
| | | Open Voltage | Curve Factor | Photoelectrical Conversion Efficiency | Photoelectrical Conversion Efficiency |
| Example 23-1 | 1 | 1.02 | 1.02 | 1.04 | 1.04 |
| Example 23-2 | 2 | 1.02 | 1.02 | 1.05 | 1.04 |
| Example 23-3 | 3 | 1.02 | 1.02 | 1.05 | 1.05 |
| Example 23-4 | 5 | 1.03 | 1.03 | 1.06 | 1.06 |
| Example 23-5 | 10 | 1.03 | 1.02 | 1.05 | 1.07 |
| Example 23-6 | 20 | 1.02 | 1.02 | 1.05 | 1.06 |
| Example 23-7 | 30 | 1.02 | 1.02 | 1.05 | 1.05 |
| Example 23-1 | 50 | 1.00 | 1.00 | 1.00 | 1.00 |

(Note) The initial characteristics, the low illuminance characteristics and the durability are relative values with reference to those of Device No. Example 23-8.

(Device No. Example 22-5) exhibited superior characteristics to the photovoltaic device (Device No. Comparative Example 6-6) such that a 1.04 times of the open voltage of the initial characteristics, a 1.02 times of the curve factor of the same, a 1.10 times of the photoelectrical conversion efficiency of the low illuminance characteristics and a 1.07 times of tile photoelectrical conversion efficiency of the durability characteristics were exhibited.

As a result of the foregoing measurements, it was found that the photovoltaic devices (Device Nos. Example 22-1 to 22-14) according to the present invention had superior characteristics to those of the conventional photovoltaic device and the effect of the present invention was confirmed, the photovoltaic devices (Device Nos. Example 22-1 to 22-14) being formed in such a manner that the i-layer was formed while making the internal pressure to be 50 mTorr or lower, the microwave energy was used which was smaller than the microwave energy needed to completely decompose the raw material gases, the RF energy to be used simultaneously was made to be larger than the microwave The initial characteristics, the low illuminance characteristics and the durability of the manufactured photovoltaic devices (Device Nos. Examples 23-1 to 23-8) were measured by a method similar to that employed in Example 22. The results are shown in Table 16. As can be understood from Table 16, the photovoltaic devices (Device Nos. 23-1 to 23-8) having the maximum band gap in the region having the thickness of 1 to 30 nm had further excellent characteristics. Thus, the effect of the present invention was confirmed.

EXAMPLE 24

A photovoltaic device (Device No. Example 24) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 22-5) except for that the NO/He gas cylinder 1079 was used and the flow of the NO/He gas was made to be 0.5 sccm at the time of forming the i-layer.

The initial characteristics, the low illuminance characteristics and the durability of the manufactured photovoltaic device (Device No. Example 24) were measured by a method similar to that employed in Example 22. As a result, similar initial characteristics, low illuminance characteristics and durability to those of Device No. Example 22-5 were obtained.

The photovoltaic device (Device No. Example 24) according to Example 24 was analyzed by the secondary ion mass analyzer. As a result, a fact was confirmed that oxygen atoms and nitrogen atoms were contained in the i-layer.

As a result, the effect of the present invention was confirmed.

EXAMPLE 25

A photovoltaic device (Device No. Example 25) was manufactured by, on the substrate, forming a reflecting layer, a reflection enhancing layer, an n-layer, an i-layer, a p-layer, a transparent electrode and a collecting electrode under the same conditions as those employed to manufacture the photovoltaic device (Device No. Example 22-5) according to Example 22 except for that the $Si_2H_6$ gas cylinder was used, the flow of the $Si_2H_6$ gas was made to be 40 sccm, and the flow of the $SiH_4$ gas was adjusted by the mass flow controller 1021 in accordance with the flow pattern shown in FIG. 23 at the time of forming the i-layer.

The initial characteristics, the low illuminance characteristics and the durability of the manufactured photovoltaic device (Device No. Example 25) were measured by a method similar to that employed in Example 22. As a result, similar initial characteristics, low illuminance characteristics and durability to those of Device No. Example 22-5 were obtained.

The distribution of Si atoms and hydrogen atoms in the i-layer of the photovoltaic device according to Example 25 (Device No. Example 25) in the direction of the thickness of the i-layer was analyzed by the secondary ion mass analyzer. As a result, a similar tendency as that shown in FIG. 24 was attained.

As a result, the effect of the present invention was confirmed.

EXAMPLE 26

A photovoltaic device (Device No. Example 26) was manufactured by, on the substrate, forming a reflecting layer, a reflection enhancing layer, an n-layer, an i-layer, a p-layer, a transparent electrode and a collecting electrode under the same conditions as those employed to manufacture Device No. Example 22-5 according to Example 22 except for that the distance from the point at which the $SiH_4$ gas and the $GeH_4$ gas were mixed to the deposition chamber 1001 in the raw material gas supply apparatus 1020 was made as shown in Table 17.

TABLE 17

| Device No. | Distance from Gas Mixing Point to Deposition Chamber (m) | Initial Characteristics | | Low Illuminance Characteristics | Durability Deterioration of |
|---|---|---|---|---|---|
| | | Open Voltage | Curve Factor | Photoelectrical Conversion Efficiency | Photoelectrical Conversion Efficiency |
| Example 26-1 | 1 | 1.03 | 1.03 | 1.05 | 1.07 |
| Example 26-2 | 2 | 1.03 | 1.04 | 1.06 | 1.06 |
| Example 26-3 | 3 | 1.02 | 1.03 | 1.04 | 1.05 |
| Example 26-4 | 5 | 1.02 | 1.02 | 1.04 | 1.05 |
| Example 26-5 | 8 | 1.00 | 1.00 | 1.00 | 1.00 |

(Note) The initial characteristics, the low illuminance characteristics and the durability are relative values with reference to those of Device No. Example 26-5.

The initial characteristics, the low illuminance characteristics and the durability of the manufactured photovoltaic device (Device No. Example 26) were measured by a method similar to that employed in Example 22. As can be understood from Table 17, it was confirmed that an excellent photovoltaic device could be obtained by making the distance from the point at which the $SiH_4$ gas and the $GeH_4$ gas were mixed to the deposition chamber 1001 to be 5 m or shorter.

EXAMPLE 27

A photovoltaic device was manufactured under the same conditions as those employed to manufacture Device No. Example 22-5 according to Example 22, the photovoltaic device being used to form a solar cell module. Then, an analog clock having a circuit structured as shown in FIG. 26 was manufactured.

As a comparative example, a photovoltaic device was manufactured under the same manufacturing conditions employed to manufacture the Device No. Comparative Example 6-6, and an analog clock arranged similarly to Example 27 was manufactured.

The analog clocks according to Example 27 and that according to the comparative example were placed of the wall of a room to illuminate the room for 8.5 hours every day. The analog clock according to Example 27 was able to work for a whole day as contrasted with the analog clock according to the comparative example which was not able to work for a whole day. Thus, an effect of the generating system according to the present invention was confirmed.

EXAMPLE 28

A photovoltaic device (Device No. Example 28) was manufactured by, on the substrate, forming a reflecting layer, a reflection enhancing layer, an n-layer, an i-layer, a p-layer, a transparent electrode and a collecting electrode under the same conditions as those employed to manufacture the device according to Example 22 except for that the flow of the $SiH_4$ gas and that of the $GeH_4$ gas were adjusted by the mass flow controllers 1021 and 1026 in accordance with the flow pattern shown in FIG. 10 at the time of forming the i-layer.

The initial characteristics, the low illuminance characteristics and the durability of the manufactured photovoltaic device (Device No. Example 28) were measured by a method similar to that employed in Example 22. As a result, similar initial characteristics, low illuminance characteristics and durability to those of Device No. Example 22-5 were obtained. Thus, the effect of the present invention was confirmed.

EXAMPLE 29

A photovoltaic device (Device No. Example 29) was manufactured by, on the substrate, forming a reflecting layer, a reflection enhancing layer, an n-layer, an i-layer, a p-layer, a transparent electrode and a collecting electrode under the same conditions as those employed to manufacture the Device No. 22-5 except for that the NO/He gas was adjusted by the mass flow controller 1029 in accordance with the flow pattern shown in FIG. 32 at the time of forming the i-layer.

The initial characteristics, the low illuminance characteristics and the durability of the manufactured photovoltaic device (Device No. Example 29) were measured by a method similar to that employed in Example 22. As a result, similar initial characteristics, low illuminance characteristics and durability to those of Device No. Example 22-5 were obtained.

Further, the distribution of nitrogen atoms and oxygen atoms of the photovoltaic device according to Example 29 (Device No. Example 29) in the i-layer was analyzed by the secondary ion mass analyzing apparatus. The results similar to those shown in FIG. 33 were obtained.

As a result, the effect of the present invention was confirmed.

EXAMPLE 30

Figure 34:
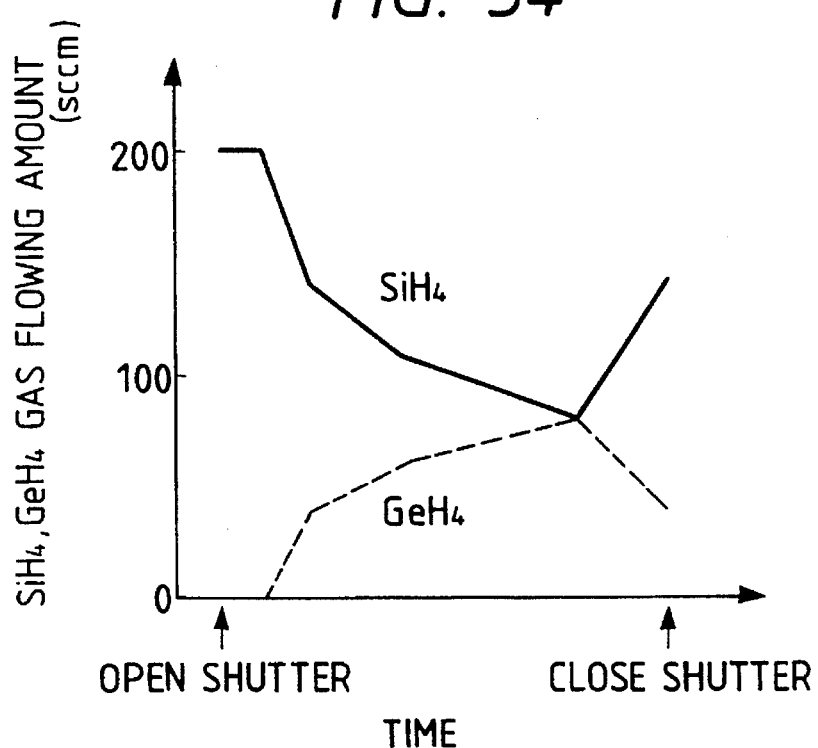
FIG. 34 is a graph which shows the time sequential changes of the flows of the $SiH_4$ gas and the $GeH_4$ gas.

A photovoltaic device (Device No. Example 30) was manufactured by, on the substrate, forming a reflecting layer, a reflection enhancing layer, an n-layer, an i-layer, a p-layer, a transparent electrode and a collecting electrode under the same conditions as those employed to form the Device No. Example 22-5 except for that the flow of the $SiH_4$ gas and that of the $GeH_4$ gas were adjusted by the mass flow controllers 1021 and 1026 in accordance with the flow pattern shown in FIG. 34 at the time of forming the i-layer similarly to Example 22, and the microwave glow discharge was temporarily interrupted and the flow of the $SiH_4$ gas flow was adjusted to be 200 sccm by the mass flow controller 1021 while interrupting the flow of the $GeH_4$ gas. Further, the same manufacturing conditions as those employed in Example 1 were employed except for that the maximum band gap region of 10 nm was formed in the i-layer.

The initial characteristics, the low illuminance characteristics and the durability of the manufactured photovoltaic device (Device No. Example 30) were measured by a method similar to that employed in Example 22. As a result, the initial characteristics, the low illuminance characteristics and the durability similar to that obtained from Device No. Example 22-5 were realized. Thus, the effect of the present invention was confirmed.

EXAMPLE 31

Photovoltaic devices (Device Nos. Examples 31-1 to 31-5) were manufactured by, on the substrate, forming a reflecting layer, a reflection enhancing layer, an n-layer, an i-layer, a p-layer, a transparent electrode and a collecting electrode under the same conditions as those employed to form the Device No. Example 22-5 except for that the thickness of the doping layer A was made to be the value shown in Table 18 at the time of forming the p-layer.

TABLE 18

| Device No. | Thickness of Doping Layer A (nm) | Initial Characteristics Open Voltage | Initial Characteristics Curve Factor | Low Illuminance Characteristics Photoelectrical Conversion Efficiency | Durability Deterioration of Photoelectrical Conversion Efficiency |
| --- | --- | --- | --- | --- | --- |
| Example 31-1 | 0.01 | 1.02 | 1.02 | 1.06 | 1.05 |
| Example 31-2 | 0.03 | 1.02 | 1.03 | 1.06 | 1.06 |
| Example 31-3 | 0.1 | 1.03 | 1.02 | 1.07 | 1.07 |
| Example 22-5 | 0.3 | 1.03 | 1.02 | 1.06 | 1.05 |
| Example 31-4 | 1 | 1.02 | 1.02 | 1.05 | 1.04 |
| Example 31-5 | 3 | 1.00 | 1.00 | 1.00 | 1.00 |

(Note) The initial characteristics, the low illuminance characteristics and the durability are relative values with reference to those of Device No. Example 31-5.

The initial characteristics, the low illuminance characteristics and the durability of the manufactured photovoltaic devices (Device Nos. Examples 31-1 to 31-5) were measured by a method similar to that employed in Example 22. The results are shown in Table 18. As can be understood from Table 18, the photovoltaic devices (Device Nos. 31-1 to 31-4) had further excellent characteristics, the photovoltaic devices having the doping layer A the thickness of which was 0.01 to 1 nm.

EXAMPLE 32

A photovoltaic device (Device No. Example 32) was manufactured by, on the substrate, forming a reflecting layer, a reflection enhancing layer, an n-layer, an i-layer, a p-layer, a transparent electrode and a collecting electrode under the same conditions as those employed to form the device (Device No. Example 22-5) except for that the doping layer A and the doping layer B were formed under the manufacturing conditions shown in Table 19 at the time of forming the n-layer.

TABLE 19

| Conditions for Manufacturing n-layer | | | | | |
|---|---|---|---|---|---|
| Name of Layer | Gas and Flow of Gas (sccm) | Microwave Discharge Power (mW/cm³) | Pressure (mTorr) | Temperature of Substrate (°C.) | Thickness of Layer (nm) |
| Doping Layer B1 in n-layer | SiH₄  5<br>H₂  200<br>PH₃/H₂  20<br>(1%) | 40 | 30 | 350 | 0.5 |
| Doping layer A in n-layer | PH₃/H₂  300<br>(1%) | 50 | 20 | 350 | 03 |
| Doping Layer B2 in n-layer | SiH₄  50<br>PH₃/H₄  200<br>(1%) | 150 | 15 | 350 | 10 |

The initial characteristics, the low illuminance characteristics and the durability of the manufactured photovoltaic device (Device No. Example 32) were measured by a method similar to that employed in Example 22. Similar initial characteristics, low illuminance characteristics and durability to those of Device No. Example 22-5 were obtained. Thus, the effect of the present invention was confirmed.

EXAMPLE 33

A photovoltaic device (Device No. Example 33) was manufactured by, on the substrate, forming a reflecting layer, a reflection enhancing layer, an n-layer, an i-layer, a p-layer, a transparent electrode and a collecting electrode under the same conditions as those employed to form the Device No. Example 22-5 except for that the doping layer A and the doping layer B were formed under the manufacturing conditions shown in Table 20 at the time of forming the p-layer.

TABLE 20

| Conditions for Forming p-layer | | | | | |
|---|---|---|---|---|---|
| Name of Layer | Gas and Flow of Gas (sccm) | Microwave Discharge Power (mW/cm³) | Pressure (mTorr) | Temperature of Substrate (°C.) | Thickness Layer (nm) |
| Doping Layer B1 | SiH₄  1<br>H₂  300<br>BF₃/H₂  2<br>(2000 ppm) | 50 | 25 | 300 | 0.3 |
| Doping layer A1 | B₂H₆/H₂  100 | 50 | 20 | 300 | 0.1 |
| Doping layer B2 | SiH₄  1<br>H₂  300<br>BF₃/H₂  2<br>(2000 ppm) | 50 | 25 | 300 | 0.5 |
| Doping Layer A2 | B₂H₆/H₂  100o | 30 | 30 | 300 | 0.2 |
| Doping Layer B3 | SiH₄  1<br>H₂  300<br>BF₃/H₂  2<br>(2000 ppm) | 50 | 25 | 300 | 03 |
| Doping Layer A3 | B₂H₆/H₂  200 | 50 | 20 | 300 | 0.5 |
| Doping Layer B4 | SiH₄  1<br>H₂  300<br>BF₃/H₂  2<br>(2000 ppm) | 50 | 25 | 300 | 8 |

The initial characteristics, the low illuminance characteristics and the durability of the manufactured photovoltaic device (Device No. Example 33) were measured by a method similar to that employed in Example 22. Similar initial characteristics, low illuminance characteristics and durability to those of Device No. Example 22-5 were obtained. Thus, the effect of the present invention was confirmed.

EXAMPLE 34

A photovoltaic device (Device No. Example 34) was manufactured by, on the substrate, forming a reflecting layer, a reflection enhancing layer, an n-layer, an i-layer, a p-layer, a transparent electrode and a collecting electrode under the same conditions as those according to Example 28 except for that the RF bias of the bias power source 1011 was set to 250 mW/cm$^3$ and the DC bias was set to 50 V via the RF cutting coil as to be applied to the bias rod 1012 at the time of forming the i-layer.

The initial characteristics, the low illuminance characteristics and the durability of the manufactured photovoltaic device (Device No. Example 34) were measured by a method similar to that employed in Example 28. Similar initial characteristics, low illuminance characteristics and durability to those obtained from Example 28 were obtained. Thus, the effect of the present invention was confirmed.

EXAMPLE 35

A photovoltaic device (Device No. Example 35) was manufactured by, on the substrate, forming a reflecting layer, a reflection enhancing layer, an n-layer, an i-layer, a p-layer, a transparent electrode and a collecting electrode under the same conditions as those employed to manufacture Device No. Example 22-5 except for that a $D_2$ gas cylinder (omitted from illustration) was used in place of the $H_2$ gas cylinder to allow the $D_2$ gas to flow by 300 sccm at the time of forming the i-layer.

The initial characteristics, the low illuminance characteristics and the durability of the manufactured photovoltaic device (Device No. Example 35) were measured by a method similar to that employed in Example 22. Similar initial characteristics, low illuminance characteristics and durability to those obtained from Device No. 22-5 were obtained.

The composition of the photovoltaic device according to Example 35 (Device No. Example 35) was analyzed by the secondary ion mass analyzer. As a result, a fact was confirmed that D atoms were contained in the i-layer.

Thus, the effect of the present invention was confirmed.

EXAMPLE 36

A photovoltaic device (Device No. Example 36) was manufactured by, on the substrate, forming a reflecting layer, a reflection enhancing layer, an n-layer, an i-layer, a p-layer, a transparent electrode and a collecting electrode under the same conditions employed to manufacture the Device No. Example 22-5 except for that the DC bias of the bias power source 1011 was changed from 50 V to 80 V at a constant rate simultaneously with opening of the shutter 1013 at the time of forming the n-layer.

The initial characteristics, the low illuminance characteristics and the durability of the manufactured photovoltaic device (Device No. Example 36) were measured by a method similar to that employed in Example 22. Similar initial characteristics, low illuminance characteristics and durability to those obtained from Device No. Example 22-5 were obtained.

Thus, the effect of the present invention was confirmed.

EXAMPLE 37

The manufacturing apparatus used in Example 22, comprising the raw material gas supply apparatus 1020 and the deposition apparatus 1100, adapted to the RF plasma CVD method and shown in FIG. 13 was used to form the n and p-layers of the photovoltaic device according to the present invention.

Referring to the drawing, reference numeral 1104 represents a substrates similar to that according to Example 22. The gas cylinders 1071 to 1079 were filled with the raw material gases similarly to Example 22. By the same operation procedure similar to Example 22, the respective gases were introduced into the mass flow controllers 1021 to 1029.

After the preparation for forming the film had been made, the n-layer was formed on the substrate 1104. The n-layer was formed by heating the substrate 1104 to 350° C. by using the heater 1105 and by gradually opening the discharge valves 1042, 1044, 1045 and the sub-valve 1008 so that the $H_2$ gas, the $PH_3$ (1%)/$H_2$ gas and the $Si_2H_6$ gas were introduced into the deposition chamber 1101 through the gas introduction pipe 1103. At this time, the flow of the $H_2$ gas was made to be 50 sccm, the flow of the $PH_3$ (1%)/$H_2$ gas was made to be 5 sccm and the flow of the $Si_2H_6$ gas was made to be 3 sccm by the regulating operations performed by the corresponding mass flow controllers 1022, 1024 and 1025. The pressure in the deposition chamber 1101 was made to be 1 Torr by adjusting the opening of the conductance valve 1107 while observing the vacuum meter 1106.

Then, the power of the RF power source 1111 was set to 120 mW/cm$^2$ to be supplied to a cathode 1102 via an RF matching box 1112 so that the RF glow discharge was caused to occur. Thus forming of the n-layer on the substrate 1104 was commenced. When the n-layer having a thickness of 10 nm was formed, the RF glow discharge was stopped, the discharge valve 1042, 1044, 1045 and the sub-valve 1108 were closed to stop the gas introduction into the deposition chamber 1101. Thus, forming of the n-layer was completed.

The substrate 1104, on which the n-layer had been formed, was taken out from the deposition chamber 1101, and then the substrate 1104 was placed in a deposition apparatus 1000 adapted to the microwave plasma CVD method similar to that employed to manufacture Device No. Example 22-5 so that an i-layer was formed on the n-layer similarly to Example 22.

The substrate 1004, on which the i-layer had been formed, was taken out from the deposition chamber 1000, and then the substrate 1004 was placed in a deposition apparatus 1100 adapted to the RF plasma CVD method so that a p-layer was formed which was formed by stacking the doping layer A and the doping layer B.

A doping layer B1 was formed by heating the substrate 1104 to 200° C. by using the heater 1105 and by gradually opening the discharge valves 1041 to 1043 and 1108 so that the $SiH_4$ gas, the $H_2$ gas and the $BF_3$ (2000 ppm)/$H_2$ gas were introduced into the deposition chamber 1101 through the gas introduction pipe 1103. At this time, the flow of the $SiH_4$ gas was made to be 0.03 sccm, the flow of the $H_2$ gas was made to be 100 sccm and the flow of the $BF_3$ (2000 ppm)/$H_2$ gas was made to be 1 sccm by the regulating operations performed by the corresponding mass flow controllers 1021, 1022 and 1027. The pressure in the deposition chamber 1101 was made to be 1 Torr by adjusting the opening of the conductance valve 1107 while observing the vacuum meter 1106.

Then, the power of the RF power source 1111 was set to 2 W/cm$^2$ so that the RF power was supplied to the cathode 1102 via the RF matching box 1112 so that the RF glow discharge was caused to occur. Thus, forming of the doping layer B1 on the i-layer was commenced. When the doping layer B1 having a thickness of 0.3 nm was formed, the RF glow discharge was stopped. Then, the discharge valves 1041, 1042, 1047 and the sub-valve 1108 were closed, and the gas introduction into the deposition chamber 1101 was stopped.

The doping layer A was then formed by heating the substrate 1104 to 200° C. by using the heater 1105 and by gradually opening the discharge valves 1043 and 1108 so that the $B_2H_6/H_2$ gas was introduced into the deposition chamber 1101 through the gas introduction pipe 1103. At this time, the flow of the $B_2H_6/H_2$ gas was made to be 50 sccm by the regulating operation performed by the mass flow controller 1023. The pressure in the deposition chamber 1101 was made to be 1 Torr by adjusting the opening of the conductance valve 1107 while observing the vacuum meter 1106.

Then, the power of the RF power source 1111 was set to 3 $W/cm^2$ to be supplied to the cathode 1102 via the RF matching box 1112 so that the RF glow discharge was caused to occur. Thus, forming of the doping layer A on the doping layer B1 was commenced. When the doping layer A having a thickness of 0.1 nm was formed, the RF glow discharge was stopped. Then, the discharge valve 1048 and the sub-valve 1108 were closed, and the gas introduction into the deposition chamber 1101 was stopped.

Then, the doping layer B2 was formed on the doping layer A under the same conditions as those for forming the doping layer B1 except for that the flow of the $SiH_4$ gas was 0.5 sccm, that of the $BF_3/H_2$ gas was 10 sccm and the thickness was made to be 5 nm.

Then, another photovoltaic device (battery No. Example 37) was manufactured by evaporating the transparent electrode and the collecting electrode on the p-layer similarly to Example 22. The conditions for forming the photovoltaic device are shown in Table 21.

As a comparative example, a photovoltaic device (Device No. Comparative Example 7) was manufactured by, on the substrate, forming a reflecting layer, a reflection enhancing layer, an n-layer, an i-layer, a p-layer, a transparent electrode and a collecting electrode under the same conditions as those according to Example 27 except for that the doping layer A was not formed but only the doping layer B was formed at the time of forming the p-layer.

The initial characteristics, the low illuminance characteristics and the durability of the manufactured photovoltaic devices (Device Nos. Example 37 and Comparative Example 7) were measured by a method similar to that according to Example 22. As a result of the measurements, the photovoltaic device according to Example 37 exhibited superior characteristics to the photovoltaic device (Device No. Comparative Example 7) such that a 1.02 times of the open voltage of the initial characteristics, a 1.03 times of the curve factor of the same, a 1.07 times of the photoelectrical conversion efficiency of the low illuminance characteristics and a 1.07 times of the photoelectrical conversion efficiency of the durability characteristics were exhibited. Thus, the effect of the present invention was confirmed.

EXAMPLES 38

A photovoltaic device (Device No. Example 38) was manufactured by forming, on the substrate, a reflecting layer, a reflection enhancing layer, a first n-layer, a first i-layer, a first p-layer, a second n-layer, a second i-layer, a second p-layer, a transparent electrode and a collecting electrode by a method similar to that employed in Example 22 under the manufacturing conditions shown in Table 22.

TABLE 21

| Substrate | SUS430BA 50 mm × 50 mm having a thickness of 1 mm | | | | | |
|---|---|---|---|---|---|---|
| Reflecting Layer | Silver (Ag) thin film 100 nm | | | | | |
| Reflection Enhancing Layer | Zinc Oxide (ZnO) thin film 1 μm | | | | | |

| Conditions for Forming Layers | Name of Layer | Gas and Flow of the Gas (sccm) | RF Discharge Power (W/cm$^2$) | Pressure (Torr) | Temperature of Substrate (°C.) | Thickness of Layer (nm) |
|---|---|---|---|---|---|---|
| | n-layer | $SiH_6$ 3<br>$PH_3/H_2$ 5<br>(diluted to 1%)<br>$H_2$ 50 | 0.12 | 1 | 350 | 10 |
| | i-layer | Same as Device No. Example 22-5 of Example 22 | | | | |
| | Doping Layer B1 in p-layer | $SiH_4$ 0.03<br>$H_2$ 100<br>$BF_3/H_2$ 1<br>(2000 ppm) | 2 | 1 | 200 | 0.3 |
| | Doping Layer A in p-layer | $B_2H_6/H_2$ 50 | 3 | 1 | 200 | 0.1 |
| | Doping Layer B2 in p-layer | $SiH_4$ 0.5<br>$H_2$ 100<br>$BF_3/H_2$ 10<br>(2000 ppm) | 2 | 1 | 200 | 5 |
| Transparent Electrode | ITO ($In_2O_3 + SnO_2$) thin film 70 nm | | | | | |
| Collecting Electrode | Aluminum (Al) thin film 2 μm | | | | | |

TABLE 22

| Substrate | SUS430BA 50 mm × 50 mm having a thickness of 1 mm |
| --- | --- |
| Reflecting Layer | Silver (Ag) thin film 100 nm |
| Reflection Enhancing Layer | Zinc Oxide (ZnO) thin film 1 μm |

| Conditions for Forming Layers | Name of Layer | Gas and Flow of the Gas (sccm) | | Discharge Power | Bias | Pressure (mTorr) | Temperature of Substrate (°C.) | Thickness of Layer (nm) |
| --- | --- | --- | --- | --- | --- | --- | --- | --- |
| | First n-layer | $Si_2H_6$<br>$H_2$<br>$PH_3/H_2$<br>(diluted to 1%) | 1<br>50<br>200 | RF 80 (mW/cm²) | | 1500 | 370 | 20 |
| | First i-layer | $SiH_4$ (see FIG. 35)<br>$H_2$<br>$GeH_4$ (see FIG. 35) | 170<br>500 | Microwave (mW/cm³)<br>(mW/cm³) | RF 350<br>DC0V | 10 | 350 | 300 |
| | Doping Layer B1 in First 1p-layer | $SiH_4$<br>$H_2$<br>$BF_3/H_2$ (2000 ppm) | 0.03<br>100<br>6 | RF 1 (W/cm²) | | 2000 | 250 | 0.5 |
| | Doping Layer A in First 1p-layer | $B_2H_6/H_2$ | 100 | RF 2 (W/cm²) | 20 | 250 | | 0.3 |
| | Doping Layer B2 in First 1p-layer | $SiH_4$<br>$H_2$<br>$BF_3/H_2$ (2000 ppm) | 0.05<br>80<br>25 | RF 1.5 (W/cm²) | | 2000 | 250 | 10 |
| | Second n-layer | $Si_2H_6$<br>$H_2$<br>$PH_3/H_2$ (diluted to 1%) | 1<br>50<br>1 | RF 80 (mW/cm²) | | 1500 | 300 | 10 |
| | Second i-layer | $SiH_4$<br>$H_2$ | 200<br>700 | Microwave 130 (mW/cm³) | RF 250 (mW/cm³)<br>DC0V | 5 | 300 | 150 |
| | Second p-layer | $SiH_4$<br>$H_2$<br>$BF_3/H_2$ (2000 ppm) | 0.05<br>80<br>25 | RF 1.5 (W/cm²) | | 2000 | 200 | 5 |

| Transparent Electrode | ITO ($In_2O_3$ + $SnO_2$) thin film 70 nm |
| --- | --- |
| Collecting Electrode | Aluminum (Al) thin film 2 mm |

A photovoltaic device (Device No. Comparative Example 8) was manufactured by, on the substrate, forming a reflecting layer, a reflection enhancing layer, a first n-layer, a first i-layer, a first p-layer, a second n-layer, a second i-layer, a second p-layer, a transparent electrode and a collecting electrode under the manufacturing conditions employed in Example 38 except for that the doping layer A was not formed but only the doping layer B was formed at the time of forming the first i-layer.

The initial characteristics, the low illuminance characteristics and the durability of the manufactured photovoltaic devices (Device Nos. Example 38 and Comparative Example 8) were measured by a method similar to that according to Example 22. As a result of the measurements, the photovoltaic device according to Example 38 exhibited superior characteristics to the photovoltaic device according to Comparative Example 8 such that a 1.03 times of the open voltage of the initial characteristics, a 1.02 times of the curve factor of the same, a 1.08 times of the photoelectrical conversion efficiency of the low illuminance characteristics and a 1.07 times of the photoelectrical conversion efficiency of the durability characteristics were exhibited. Thus, the effect of the present invention was confirmed.

EXAMPLES 39

A photovoltaic device (Device No. Example 39) was manufactured by forming, on the substrate, a reflecting layer, a reflection enhancing layer, a first n-layer, a first i-layer, a first p-layer, a second n-layer, a second i-layer, a second p-layer, a third n-layer, a third i-layer and a third p-layer, a transparent electrode and a collecting electrode by a method similar to that employed in Example 22 under the manufacturing conditions shown in Table 23.

TABLE 23

| | | | | | | | |
|---|---|---|---|---|---|---|---|
| Substrate | SUS430BA 50 mm × 50 mm having a thickness of 1 mm | | | | | | |
| Reflecting Layer | Silver (Ag) thin film 100 nm | | | | | | |
| Reflection Enhancing Layer | Zinc Oxide (ZnO) thin film 1 μm | | | | | | |

| Conditions for Forming Layers | Name of Layer | Gas and Flow of the Gas (sccm) | | Microwave Discharge Power (mW/cm$^3$) | Bias | Pressure (mTorr) | Temperature of Substrate (°C.) | Thickness of Layer (nm) |
|---|---|---|---|---|---|---|---|---|
| | First n-layer | SiH$_4$<br>PH$_3$/H$_2$ (diluted to 1%) | 50<br>200 | 130 | DC50V | 10 | 350 | 10 |
| | First i-layer | SiH$_4$ (see FIG. 36)<br>H$_2$<br>GeH$_4$ (see FIG. 36) | <br>500<br> | 170 | RF 350 (mW/cm$^3$)<br>DC0V | 10 | 350 | 300 |
| | Doping Layer B1 in 1p-layer | SiH$_4$<br>H$_2$<br>BF$_3$/H$_2$ (2000 ppm) | 1<br>300<br>3 | 50 | | 25 | 300 | 0.5 |
| | Doping Layer A in 1p-layer | B$_2$H$_6$/H$_2$ | 100 | 50 | | 20 | 300 | 0.3 |
| | Doping Layer B2 in 1p-layer | SiH$_4$<br>H$_2$<br>BF$_3$/H$_2$ (2000 ppm) | 1<br>300<br>10 | 50 | | 25 | 300 | 10 |
| | Second n-layer | SiH$_4$<br>PH$_3$/H$_2$ (diluted to 1%) | 50<br>200 | 130 | DC50V | 10 | 350 | 10 |
| | Second i-layer | SiH$_4$ (see FIG. 37)<br>H$_2$<br>GeH$_4$ (See FIG. 37) | <br>500<br> | 210 | RF 280 (mW/cm$^3$)<br>DC0V | 10 | 350 | 200 |
| | Doping Layer B1 in 2p-layer | SiH$_4$<br>H$_2$<br>BF$_3$/H$_2$ (2000 ppm) | 1<br>300<br>1 | 50 | | 25 | 300 | 0.1 |
| | Doping Layer A in 2p-layer | B$_2$H$_6$/H$_2$ | 100 | 50 | | 30 | 300 | 0.3 |
| | Doping Layer B2 in 2p-layer | SiH$_4$<br>H$_2$<br>BF$_3$/H$_2$ (2000 ppm) | 1<br>300<br>0.5 | 50 | | 25 | 300 | 10 |
| | Third n-layer | SiH$_4$<br>PH$_3$/H$_2$ (diluted to 1%) | 50<br>200 | 130 | DC50V | 10 | 300 | 10 |
| | Third i-layer | SiH$_4$<br>H$_2$ | 200<br>700 | 150 | RF 300 (mW/cm$^3$)<br>DC0V | 5 | 300 | 100 |
| | Third p-layer | SiH$_4$<br>H$_2$<br>BF$_3$/H$_2$ (2000 ppm) | 10<br>600<br>150 | 250 | | 25 | 250 | 5 |

| | |
|---|---|
| Transparent Electrode | ITO (In$_2$O$_3$ + SnO$_2$) thin film 70 nm |
| Collecting Electrode | Aluminum (Al) thin film 2 μm |

Another photovoltaic device (Device No. Comparative Example 9) was manufactured by forming, on the substrate, a reflecting layer, a reflection enhancing layer, a first n-layer, a first i-layer, a first p-layer, a second n-layer, a second i-layer, a second p-layer, a third n-layer, a third i-layer and a third p-layer, a transparent electrode and a collecting electrode under the manufacturing conditions similar to that employed in Example 39 except for that the doping layer A was not formed but only the doping layer B was formed at the time of forming the first p-layer and the second p-layer.

The initial characteristics, the low illuminance characteristics and the durability of the manufactured photovoltaic devices (Device Nos. Example 39 and Comparative Example 9) were measured by a method similar to that employed in Example 22. As a result of the measurements, the photovoltaic device (Device No. Example 39) exhibited superior characteristics to the photovoltaic device (Device No. Comparative Example 9) such that a 1.03 times of the open voltage of the initial characteristics, a 1.02 times of the curve factor of the same, a 1.08 times of the photoelectrical conversion efficiency of the low illuminance characteristics and a 1.07 times of the photoelectrical conversion efficiency of the durability characteristics were exhibited. Thus, the effect of the present invention was confirmed.

EXAMPLE 40

Figure 15:
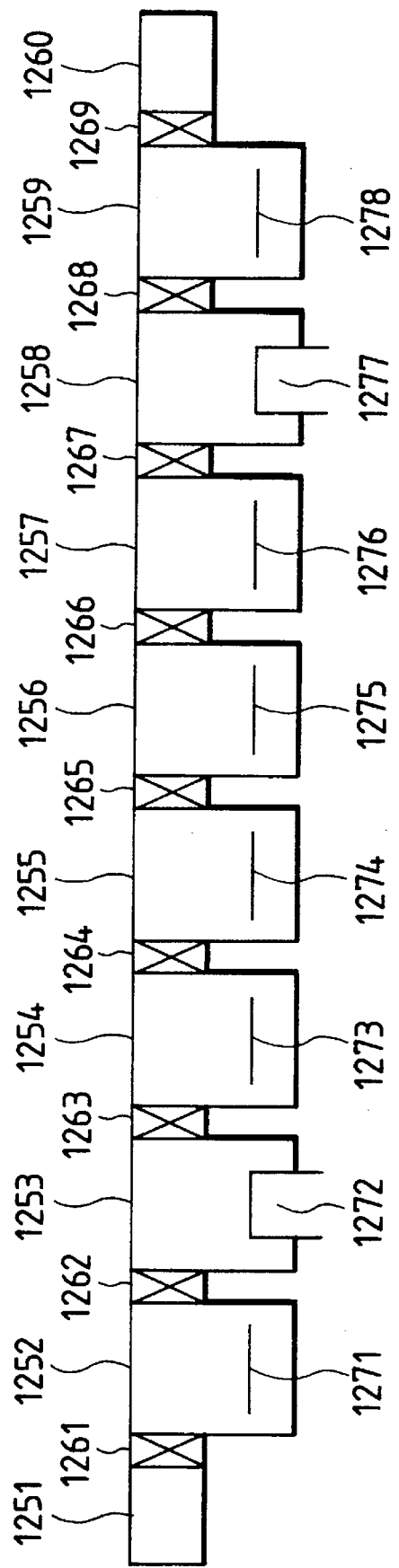
FIG. 15 is a schematic view which illustrates another example of the separated multi-chamber deposition apparatus for manufacturing the photovoltaic device according to the present invention.

A photovoltaic device according to the present invention was manufactured by a separated multi-chamber deposition apparatus shown in FIG. 15. Referring to FIG. 15, reference numerals 1251 and 1260 respectively represent a loading chamber and an unloading chamber, 1252, 1254 to 1257 and 1259 represent deposition chambers for respective layers adapted to the RF plasma CVD method similar to those employed in Example 37, 1253 and 1258 represent deposition chambers for respective layers adapted to the microwave plasma CVD method similar to those employed in Example 22, 1261 to 1269 represent gate valves for insulating the respective chambers, 1271, 1273 to 1276 and 1278 represent cathode electrodes, and 1272 and 1277 respectively represent a microwave guide portion and a dielectric window.

First, the substrate was placed in the loading chamber 1251, and then the loading chamber 1251 was exhausted to realize a vacuum state. Then, the gate valve 1261 was opened to shift the substrate into the first n-layer deposition chamber 1252, and then the gate valve 1261 was closed. Then, the first n-layer was formed on the substrate under the same conditions employed to form the first n-layer according to Example 38. Then, the gate valve 1262 was opened to shift the substrate into the first i-layer deposition chamber 1253, and then the gate valve 1262 was closed. Then, the first i-layer was formed on the first n-layer under the same conditions employed to form the first i-layer according to Example 38. Then, the gate valve 1263 was opened to shift the substrate into the deposition chamber 1254 for the doping layer B1 of the first p-layer, and then the gate valve 1263 was closed. Then, the doping layer B1 of the first p-layer was formed on the first i-layer under the same conditions employed to form the doping layer B1 of the first p-layer according to Example 38. Then, the gate valve 1264 was opened to shift the substrate into the deposition chamber 1255 for the doping layer A of the first p-layer, and then the gate valve 1264 was closed. Then, the doping layer A of the first p-layer was formed on the doping layer B1 of the first p-layer under the same conditions as those employed to form the doping layer A of the first p-layer according to Example 38. Then, the gate valve 1265 was opened to shift the substrate into the deposition chamber 1256 for the doping layer B2 of the first p-layer, and then the gate valve 1265 was closed. Then, the doping layer B2 of the first p-layer was formed on the doping layer A of the first p-layer under the same conditions as those employed to form the doping layer B2 of the first p-layer according to Example 38. Then, the gate valve 1266 was opened to shift the substrate into the second n-layer deposition chamber 1257, and then the gate valve 1266 was closed. Then, the second n-layer was formed on the doping layer B2 of the first p-layer under the same conditions employed to form the second n-layer according to Example 38. Then, the gate valve 1267 was opened to shift the substrate into the second i-layer deposition chamber 1258, and then the gate valve 1267 was closed. Then, the second i-layer was formed on the second n-layer under the same conditions employed to form the second i-layer according to Example 38. Then, the gate valve 1268 was opened to shift the substrate into the second p-layer deposition chamber 1259, and then the gate valve 1268 was closed. Then, the second p-layer was formed on the second i-layer under the same conditions employed to form the second p-layer according to Example 38. Then, the gate valve 1269 was opened to shift the substrate into the unloading chamber 1260, and then the gate valve 1269 was closed. Then, the substrate was taken out from the unloading chamber 1260 so that the photovoltaic device was manufactured (Device No. Example 40).

The initial characteristics, the low illuminance characteristics and the durability of the manufactured photovoltaic device (Device No. Example 40) were measured by a method similar to that employed in Example 22. As a result of the measurements, the photovoltaic device (Device No. Example 40) according to Example 40 exhibited superior characteristics to the photovoltaic device (Device No. Example 38) according to Example 38 such that a 1.02 times of the open voltage of the initial characteristics, a 1.01 times of the curve factor of the same, a 1.03 times of the photoelectrical conversion efficiency of the low illuminance characteristics and a 1.02 times of the photoelectrical conversion efficiency of the durability characteristics were exhibited. The photovoltaic device manufactured by the separated multi-chamber deposition apparatus had excellent characteristics. Thus, the effect of the present invention was confirmed.

EXAMPLE 41

A photovoltaic device was manufactured under the same conditions as those employed in Example 38, the photovoltaic device being used to manufacture a solar cell module to manufacture a ventilating fan to be mounted on a vehicle and having a circuit arranged as shown in FIG. 26.

As a comparative example, a photovoltaic device was manufactured under the same conditions as those according to Comparative Example 8, the photovoltaic device being used to manufacture a ventilating fan arranged similarly to Example 41.

The vehicle to which the ventilating fans according to Example 41 and the comparative example was allowed to stand for 168 hours in an idling state in which the engine was rotated. Then, the engine rotation was stopped and allowed to stand while operating the ventilating fan under the sunshine. The temperature in the compartment of the vehicle was measured. As a result, the vehicle cooling fan according to Example 41 exhibited a temperature which was lower than that realized by the cooling fan according to the comparative example by two degrees. Thus, the effect of the generating system according to the present invention was confirmed.

EXAMPLE 42

A photovoltaic device according to this embodiment is arranged in such a manner that the valence control agent was doped into the i-layer and the p-layer was formed into a stacked structure.

Similarly to Example 1, a reflecting layer, a reflection enhancing layer and an n-layer were formed on a SUS substrate, and then an n-layer, an i-layer and a p-layer were formed as follows.

The i-layer was formed similarly to Example 1 except for that the pressure in the deposition chamber was made to be the level shown in Table 24.

The initial characteristics, the low illuminance characteristics and the durability of the manufactured photovoltaic devices (Device Nos. Examples 42-8 to 42-10 and Com-

TABLE 24

| Device No. | Pressure in Deposition (mTorr) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Example 42-1 | 0.5 | 1.02 | 1.02 | 1.05 | 1.05 |
| Example 42-2 | 1 | 1.02 | 1.03 | 1.06 | 1.05 |
| Example 42-3 | 2 | 1.02 | 1.03 | 1.06 | 1.07 |
| Example 42-4 | 5 | 1.02 | 1.04 | 1.07 | 1.08 |
| Example 42-5 | 10 | 1.03 | 1.03 | 1.07 | 1.07 |
| Example 42-6 | 20 | 1.04 | 1.02 | 1.06 | 1.07 |
| Example 42-7 | 50 | 1.03 | 1.02 | 1.05 | 1.07 |
| Comparative Example 10-1 | 100 | 1.00 | 1.00 | 1.00 | 1.00 |

(Note) The initial characteristics, the low illuminance characteristics and the durability are relative values with reference to those of Device No. Comparative Example 10-1.

Then, a p-layer formed by stacking the doping layer A and the doping layer B was formed similarly to Example 22.

Then, an ITO ($In_2O_3+SnO_2$) thin film serving as a transparent electrode was formed on the p-layer to have a thickness of 70 μm. Further, an aluminum (Al) thin film serving as a collecting electrode was formed by evaporation to have a thickness of 2 μm so that photovoltaic devices (Device Nos. Examples 42-1 to 42-7 and Comparative Example 10-1) were manufactured.

The initial characteristics, the low illuminance characteristics and the durability of the manufactured photovoltaic devices (Device Nos. Examples 42-1 to 42-7 and Comparative Example 10-1) were measured. The results are shown in Table 24.

As can be understood from Table 24, it was found that a further improved photovoltaic device could be obtained by forming it while making the pressure in the i-layer deposition chamber to be 50 mTorr or lower.

Then, photovoltaic devices (Device Nos. Examples 42-8 to 42-10 and Comparative Examples 10-2 to 10-3) were manufactured by, on the substrate, forming a reflecting layer, a reflection enhancing layer, an n-layer, an i-layer, a p-layer, a transparent electrode and a collecting electrode under the same conditions employed to manufacture the Device No. Example 22-5 except for that electric power of the microwave power source was made to be the value shown in Table 25 at the time of forming the i-layer.

parative Examples 10-2 to 10-3) were measured by a method similar to that employed in Example 1. The results are shown in Table 25. As can be understood from Table 25, decomposing of the raw material gases by microwave energy smaller than the microwave energy needed to completely decompose the raw material gases enables a photovoltaic device exhibiting excellent characteristics to be obtained.

Then, photovoltaic devices (Device Nos. Examples 42-11 to 42-14 and Comparative Example 10-4) were manufactured by, on the substrate, forming a reflecting layer, a reflection enhancing layer, an n-layer, an i-layer, a p-layer, a transparent electrode and a collecting electrode under the same conditions employed to manufacture the Device No. Example 42-5 except for that the RF bias made to be the value shown in Table 26 at the time of forming the i-layer.

TABLE 25

| Device No. | Microwave (W/cm³) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Example 42-8 | 0.1 | 1.03 | 1.02 | 1.07 | 1.06 |
| Example 42-9 | 0.2 | 1.02 | 1.03 | 1.09 | 1.08 |
| Example 42-10 | 0.3 | 1.02 | 1.02 | 1.06 | 1.06 |
| Comparative Example 10-2 | 0.4 | 1.00 | 1.01 | 1.02 | 1.01 |
| Comparative Example 10-3 | 0.5 | 1.00 | 1.00 | 1.00 | 1.00 |

(Note) The initial characteristics, the low illuminance characteristics and the durability are relative values with reference to those of Device No. Comparative Example 10-3.

TABLE 26

| Device No. | RF-Bias (mW/cm³) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Comparative Example 10-4 | 150 | 1.00 | 1.00 | 1.00 | 1.00 |
| Example 42-11 | 200 | 1.02 | 1.02 | 1.05 | 1.06 |
| Example 42-12 | 250 | 1.03 | 1.03 | 1.06 | 1.08 |
| Example 42-13 | 300 | 1.02 | 1.02 | 1.07 | 1.07 |
| Example 42-14 | 350 | 1.02 | 1.02 | 1.05 | 1.07 |

(Note) The initial characteristics, the low illuminance characteristics and the durability are relative values with reference to those of Device No. Comparative Example 10-4.

The initial characteristics, the low illuminance characteristics and the durability of the manufactured photovoltaic devices (Device Nos. Examples 42-11 to 42-14 and Comparative Example 10-4) were measured by a method similar to that employed in Example 1. The results are shown in Table 26. As can be understood from Table 26, it was found that an excellent photovoltaic device could be obtained by causing RF energy larger than the microwave energy on the raw material gases.

Then, a photovoltaic device (Device No. Comparative Example 10-5) was manufactured by, on the substrate, forming a reflecting layer, a reflection enhancing layer, an n-layer, an i-layer, a p-layer, a transparent electrode and a collecting electrode under the same conditions employed to manufacture the Device No. Example 42-5 except for that the flow of the $SiH_4$ gas and that of the $GeH_4$ gas were adjusted by the mass flow controllers 1021 and 1026 in accordance with the flow pattern shown in FIG. 17 at the time of forming the i-layer.

The initial characteristics, the low illuminance characteristics and the durability of the manufactured photovoltaic device (Device No. Comparative Example 10-5) were measured by a method similar to that according to Example 1. As a result of the measurements, the photovoltaic device (Device No. Example 42-5) exhibited superior characteristics to the photovoltaic device (Device No. Comparative Example 10-5) such that a 1.02 times of the open voltage of the initial characteristics, a 1.03 times of the curve factor of the same, a 1.07 times of the photoelectrical conversion efficiency of the low illuminance characteristics and a 1.08 times of the photoelectrical conversion efficiency of the durability characteristics were exhibited.

Further, a comparison was made with the characteristics of the photovoltaic device manufactured while omitting the introduction of the $BF_3$(2000 ppm)/$H_2$ gas and the $PH_3$(2000 ppm)/$H_2$ gas at the time of forming the i-layer, resulting in that the photovoltaic device given the Device No. Example 42-5 have excellent characteristics such that a 1.02 times of the open voltage of the initial characteristics, a 1.02 times of the curve factor of the same, a 1.07 times of the photoelectrical conversion efficiency of the low illuminance characteristics and a 1.08 times of the photoelectrical conversion efficiency of the durability characteristics were exhibited.

Then, a photovoltaic device was manufactured by, on the substrate, forming a reflecting layer, a reflection enhancing layer, an n-layer, an i-layer, a p-layer, a transparent electrode and a collecting electrode under the same conditions employed to manufacture the Device No. Example 42-5 except for that the doping layer A was not formed by only the doping layer B was formed at the time of forming the p-layer. The initial characteristics, the low illuminance characteristics and the durability of the manufactured photovoltaic device were measured by a method similar to that according to Example 1. As a result of the measurements, the photovoltaic device (Device No. Example 42-5) exhibited superior characteristics to the foregoing photovoltaic device such that a 1.04 times of the open voltage of the initial characteristics, a 1.02 times of the curve factor of the same, a 1.09 times of the photoelectrical conversion efficiency of the low illuminance characteristics and a 1.06 times of the photoelectrical conversion efficiency of the durability characteristics were exhibited.

As a result of the foregoing measurements, it was found that the photovoltaic devices (Device Nos. Examples 22-1 to 22-14) according to the present invention had superior characteristics to those of the conventional photovoltaic device and the effect of the present invention was confirmed, the photovoltaic devices (Device Nos. Examples 22-1 to 22-14) being formed in such a manner that the i-layer was formed while making the internal pressure to be 50 mTorr or lower, the microwave energy was used which was smaller than the microwave energy needed to completely decompose the raw material gases, the RF energy to be used simultaneously was made to be larger than the microwave energy, the band gap was changed smoothly in the direction of the thickness of the layer, the minimum band gap was positioned concentrically toward the interface between the p-layer and the i-layer from the central position of the i-layer, the valence control agents serving as the donor and the acceptor were doped into the i-layer, and the p-layer and/or the n-layer was formed into a stacked structure consisting of a layer mainly composed of group III element and/or group V element of the periodic table and a layer containing the valence control agent and mainly composed of silicon atoms.

EXAMPLE 43

Photovoltaic devices (Device Nos. Examples 43-1 to 43-8) were manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the flow of the $SiH_4$ gas and that of the $GeH_4$ gas were adjusted by the mass flow controllers 1021 and 1026 in accordance with the flow pattern shown in FIG. 16 at the time of forming the i-layer, then the flow of the $SiH_4$ gas was maintained at 200 sccm and that of the $GeH_4$ gas was maintained at 1 sccm, and then the maximum band gap was positioned in the region having the thickness shown in Table 27.

TABLE 27

| Device No. | Thickness of Region of Maximum Value of Band Gap (nm) | Initial Characteristics | | Low Illuminance Characteristics | Durability Deterioration of |
|---|---|---|---|---|---|
| | | Open Voltage | Curve Factor | Photoelectrical Conversion Efficiency | Photoelectrical Conversion Efficiency |
| Example 43-1 | 1 | 1.02 | 1.02 | 1.04 | 1.04 |
| Example 43-2 | 2 | 1.02 | 1.03 | 1.05 | 1.04 |
| Example 43-3 | 3 | 1.02 | 1.03 | 1.06 | 1.05 |
| Example 43-4 | 5 | 1.02 | 1.03 | 1.07 | 1.07 |
| Example 43-5 | 10 | 1.03 | 1.02 | 1.05 | 1.07 |
| Example 43-6 | 20 | 1.03 | 1.02 | 1.05 | 1.06 |
| Example 43-7 | 30 | 1.02 | 1.01 | 1.05 | 1.06 |
| Example 43-6 | 50 | 1.00 | 1.00 | 1.00 | 1.00 |

(Note) The initial characteristics, the low illuminance characteristics and the durability are relative values with reference to those of Device No. Example 43-8.

The initial characteristics, the low illuminance characteristics and the durability of the manufactured photovoltaic devices (Device Nos. Comparative Examples 43-1 to 43-8) were measured by a method similar to that employed in Example 42. The results are shown in Table 27. As can be understood from Table 27, photovoltaic devices (Device Nos. Examples 43-1 to 43-8) each having the maximum band gap in a region having a thickness of 1 to 30 nm had further improved characteristics. Thus, the effect of the present invention was confirmed.

EXAMPLE 44

A photovoltaic device (Device No. Example 44) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the $ASH_3$(2000 ppm)/$H_2$ gas cylinder was used in place of the $PH_3$(2000 ppm)/$H_2$ gas cylinder and the $AsH_3$/$H_2$ gas was allowed to flow by 0.2 sccm at the time of forming the i-layer.

The initial characteristics, the low illuminance characteristics and the durability of the manufactured photovoltaic device (Device No. Example 44) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 45

A photovoltaic device (Device No. Example 45) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the flow of the $BF_3$(2000 ppm)/$H_2$ gas was adjusted in accordance with the flow pattern shown in FIG. 19 and that of the $PH_3$(2000 ppm)/$H_2$ gas was adjusted in accordance with the flow pattern shown in FIG. 20 by the corresponding mass flow controllers 1027 and 1028 at the time of forming the i-layer.

The initial characteristics, the low illuminance characteristics and the durability of the manufactured photovoltaic device (Device No. Example 45) were measured by a method similar to that employed in Example 42. As a result, similar initial characteristics, low illuminance characteristics and durability to those obtainable from Device No. Example 42-5 were obtained. Thus, the effect of the present invention was confirmed.

Further, distribution of boron and phosphorus atoms in the i-layer was measured by the secondary ion mass analyzer, resulting in a similar tendency to those shown in FIGS. 21 and 22.

EXAMPLE 46

A photovoltaic device (Device No. Example 46) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the NO/He gas cylinder 1079 was used and the flow of the NO/He gas was made to be 0.5 sccm at the time of forming the i-layer.

The initial characteristics, the low illuminance characteristics and the durability of the manufactured photovoltaic device (Device No. Example 46) were measured by a method similar to that employed in Example 42. As a result, similar initial characteristics, low illuminance characteristics and durability to those obtainable from the device (Device No. Example 42-5) were obtained.

Further, the photovoltaic device according to Example 46 (Device No. Example 46) was analyzed by the secondary ion mass analyzer, resulting in that oxygen atoms and nitrogen atoms were contained in the i-layer.

Thus, the effect of the present invention was confirmed.

EXAMPLE 47

A photovoltaic device (Device No. Example 47) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the $Si_2H_6$ gas cylinder was used, the flow of the $Si_2H_6$ gas was made to be 40 sccm and the flow of the $SiH_4$ gas was adjusted by the mass flow controller 1021 in accordance with the flow pattern shown in FIG. 23 at the time of forming the i-layer.

The initial characteristics, the low illuminance characteristics and the durability of the manufactured photovoltaic device (Device No. Example 47) were measured by a method similar to that employed in Example 42. As a result, similar initial characteristics, low illuminance characteristics and durability to those obtainable from the device (Device No. Example 42-5) were obtained.

Further, distribution of Si atoms and hydrogen atoms in the i-layer of the photovoltaic device (Device No. Example 47) according to Example 47 was analyzed by the secondary ion mass analyzer, resulting in a similar tendency to those shown in FIG. 24.

Thus, the effect of the present invention was confirmed.

EXAMPLE 48

A photovoltaic device (Device No. Example 48) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) except for that the distance from a point at which the $SiH_4$ gas and the $GeH_4$ gas were mixed in the raw material gas supply apparatus 1020 to the deposition chamber 1001 was made as shown in Table 8.

The initial characteristics, the low illuminance characteristics and the durability of the manufactured photovoltaic device (Device No. Example 48) were measured by a method similar to that employed in Example 42. The results of the measurements are shown in Table 28. As can be understood from Table 28, it was confirmed that a further excellent photovoltaic device can be obtained by making the distance from the point at which the $SiH_4$ gas and the $GeH_4$ gas were mixed to the deposition chamber 1001 to be 5 m or shorter.

The analog clocks according to Example 49 and that according to the comparative example were placed of the wall of a room to illuminate the room for 8.5 hours every day. The analog clock according to Example 49 exhibited superior performance to that of the analog clock according to the comparative example. Thus, an effect of the generating system according to the present invention was confirmed.

EXAMPLE 50

Figure 31:
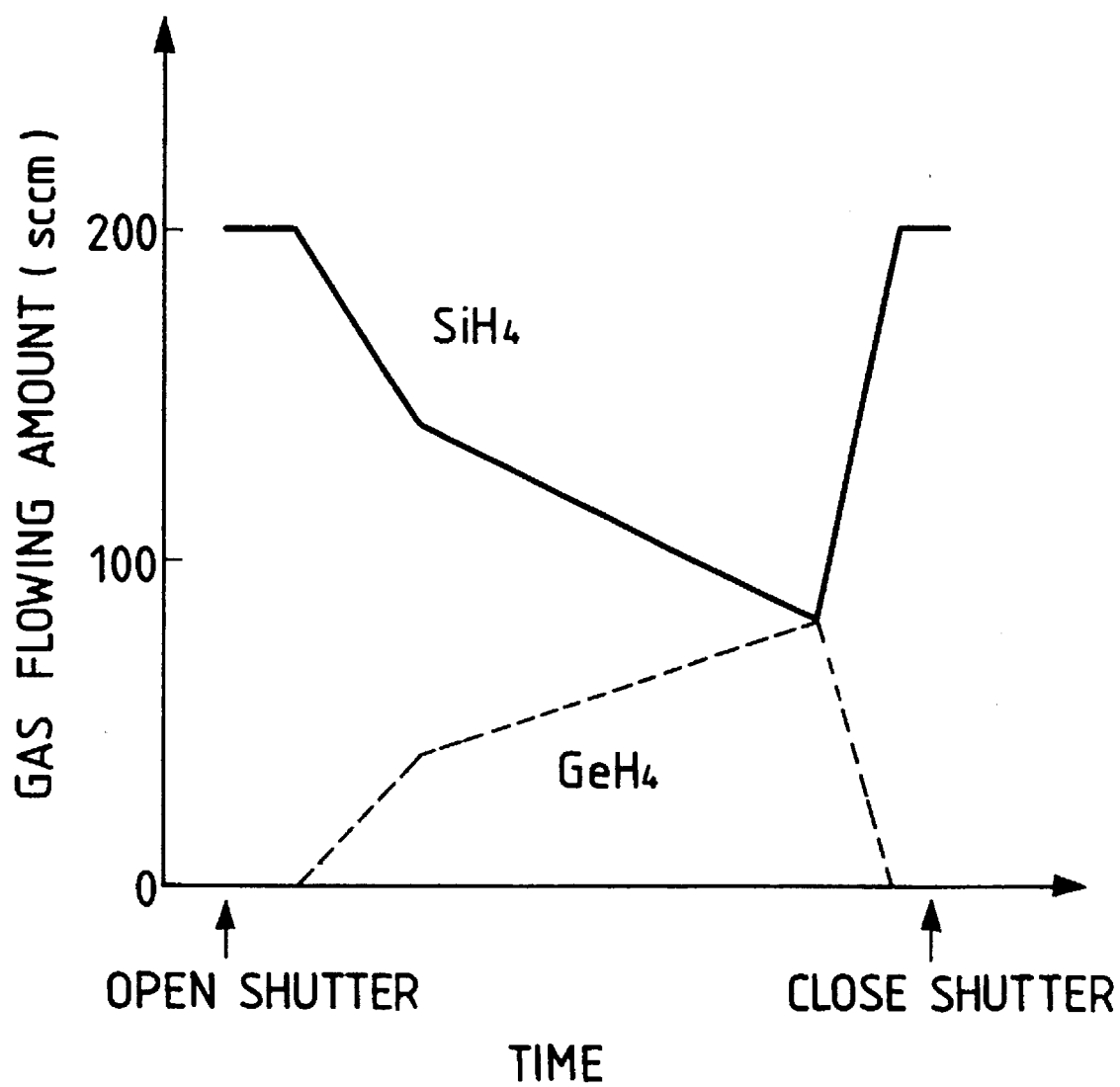
FIG. 31 is a graph which shows the time sequential pattern of the $SiH_4$ gas and the $GeH_4$ gas.

A photovoltaic device (Device No. Example 50) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the flow of the $SiH_4$ gas and that of the $GeH_4$ gas were adjusted by the mass flow controllers 1021 and 1026 in accordance with the flow pattern shown in FIG. 31 at the time of forming the i-layer.

The initial characteristics, the low illuminance characteristics and the durability of the manufactured photovoltaic device (Device No. Example 50) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 51

A photovoltaic device (Device No. Example 51) was manufactured by, on the substrate, forming a reflecting layer, a reflection enhancing layer, an n-layer, an i-layer, a p-layer, a transparent electrode and a collecting electrode under the

TABLE 28

| Device No. | Distance from Gas Mixing Point to Deposition Chamber (m) | Initial Characteristics | | Low Illuminance Characteristics | Durability Deterioration of |
|---|---|---|---|---|---|
| | | Open Voltage | Curve Factor | Photoelectrical Conversion Efficiency | Photoelectrical Conversion Efficiency |
| Example 48-1 | 1 | 1.03 | 1.03 | 1.05 | 1.07 |
| Example 48-2 | 2 | 1.02 | 1.04 | 1.06 | 1.07 |
| Example 48-3 | 3 | 1.02 | 1.03 | 1.06 | 1.05 |
| Example 48-4 | 5 | 1.02 | 1.02 | 1.05 | 1.04 |
| Example 48-5 | 8 | 1.00 | 1.00 | 1.00 | 1.00 |

(Note) The initial characteristics, the low illuminance characteristics and the durability are relative values with reference to those of Device No. Example 48-5.

EXAMPLE 49

A photovoltaic device was manufactured under the same conditions as those employed to manufacture the device (Device No. Example 42-5) according to Example 42, the photovoltaic device being used to form a solar cell module. Then, an analog clock having a circuit structured as shown in FIG. 26 was manufactured.

As a comparative example, a photovoltaic device was manufactured under the same manufacturing conditions employed to manufacture the device (Device No. Example 42-5) except for that boron atoms and phosphorus atoms were not contained in the i-layer, and an analog clock arranged similarly to Example 49 was manufactured.

same conditions as those employed to manufacture the device (Device No. Example 42-5) according to Example 42 except for that the cylinder for $B_2H_6$(2000 ppm)/$H_2$ gas diluted to 2000 ppm by the $H_2$ gas was used in place of the $BF_3$(2000 ppm)/$H_2$ gas cylinder and that the $B_2H_6$(2000 ppm)/$H_2$ gas was allowed to flow by 1 sccm at the time of forming the i-layer.

The initial characteristics, the low illuminance characteristics and the durability of the manufactured photovoltaic device (Device No. Example 51) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 52

A photovoltaic device (Device No. Example 52) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the NO/He gas was adjusted by the mass flow controller 1029 in accordance with the flow pattern shown in FIG. 32 at the time of forming the i-layer.

reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the thickness of the doping layer A was made to be the value shown in Table 29 at the time of forming the p-layer.

TABLE 29

| Device No. | Thickness of Doping Layer A (nm) | Initial Characteristics | | Low Illuminance Characteristics | Durability Deterioration of |
| --- | --- | --- | --- | --- | --- |
| | | Open Voltage | Curve Factor | Photoelectrical Conversion Efficiency | Photoelectrical Conversion Efficiency |
| Example 54-1 | 0.01 | 1.02 | 1.02 | 1.05 | 1.06 |
| Example 54-2 | 0.03 | 1.02 | 1.03 | 1.07 | 1.07 |
| Example 54-3 | 0.1 | 1.03 | 1.03 | 1.06 | 1.07 |
| Example 42-5 | 0.3 | 1.03 | 1.02 | 1.06 | 1.05 |
| Example 54-4 | 1 | 1.02 | 1.02 | 1.05 | 1.04 |
| Example 54-5 | 3 | 1.00 | 1.00 | 1.00 | 1.00 |

(Note) The initial characteristics, the low illuminance characteristics and the durability are relative values with reference to those of Device No. Example 54-5.

The initial characteristics, the low illuminance characteristics and the durability of the manufactured photovoltaic device (Device No. Example 52) were measured by a method similar to that employed in Example 42. As a result, similar initial characteristics, low illuminance characteristics and durability to those obtainable from Device No. Example 42-5 were obtained.

The distribution of nitrogen atoms and oxygen atoms in the i-layer of the photovoltaic device (Device No. Example 52) according to Example 52 in the direction of the thickness of the i-layer was analyzed by the secondary ion mass analyzer. As a result, a similar tendency to that shown in FIG. 33 was attained.

Thus, the effect of the present invention was confirmed.

EXAMPLE 53

A photovoltaic device (Device No. Example 53) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the flow of the SiH$_4$ gas and that of the GeH$_4$ gas were adjusted by the mass flow controller 1021 and 1026 in accordance with the flow pattern shown in FIG. 34 at the time of forming the i-layer.

The initial characteristics, the low illuminance characteristics and the durability of the manufactured photovoltaic device (Device No. Example 53) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 54

Photovoltaic devices (Device Nos. Examples 54-1 to 54-5) were manufactured by, on the substrate, forming a The initial characteristics, the low illuminance characteristics and the durability of the manufactured photovoltaic devices (Device Nos. Examples 54-1 to 54-5) were measured by a method similar to that employed in Example 42. The results are shown in Table 29. As can be understood from Table 29, the photovoltaic devices (Device Nos. Examples 54-1 to 54-4) had further improved characteristics which had the doping layer A having a thickness of 0.01 to 1 nm. Thus, the effect of the present invention was confirmed.

EXAMPLE 55

A photovoltaic device (Device No. Example 55) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the doping layer A and the doping layer B were formed under the manufacturing conditions shown in Table 19 at the time of forming the n-layer.

The initial characteristics, the low illuminance characteristics and the durability of the manufactured photovoltaic device (Device No. Example 55) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 56

A photovoltaic device (Device No. Example 56) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) according to Example 42 except for that the doping layer A and the doping layer B were formed under the manufacturing conditions shown in Table 20 at the time of forming the p-layer.

The initial characteristics, the low illuminance characteristics and the durability of the manufactured photovoltaic device (Device No. Example 56) were measured by a method similar to that employed in Example 42. As a result, similar initial characteristics, low illuminance characteristics and durability to those obtainable from Device No. Example 42-5 were obtained. Thus, the effect of the present invention was confirmed.

EXAMPLE 57

A photovoltaic device (Device No. Example 57) was manufactured by, on the substrate, forming a reflecting layer, a reflection enhancing layer, an n-layer, an i-layer, a p-layer, a transparent electrode and a collecting electrode under the same conditions as those according to Example 50 except for that the RF bias of the bias power source 1011 was set to 250 mW/cm$^3$ and the DC bias was set to 50 V via the RF cutting coil as to be applied to the bias rod 1012 at the time of forming the i-layer.

The initial characteristics, the low illuminance characteristics and the durability of the manufactured photovoltaic device (Device No. Example 57) were measured by a method similar to that employed in Example 50. Similar initial characteristics, low illuminance characteristics and durability to those obtained from Example 50 were obtained. Thus, the effect of the present invention was confirmed.

EXAMPLE 58

A photovoltaic device (Device No. Example 58) was manufactured by, on the substrate, forming a reflecting layer, a reflection enhancing layer, an n-layer, an i-layer, a p-layer, a transparent electrode and a collecting electrode under the same conditions as those employed to manufacture the device (Device No. Example 42-5) except for that a D$_2$ gas cylinder (omitted from illustration) was used in place of the H$_2$ gas cylinder to allow the D$_2$ gas to flow by 300 sccm at the time of forming the i-layer.

The initial characteristics, the low illuminance characteristics and the durability of the manufactured photovoltaic device (Device No. Example 58) were measured by a method similar to that employed in Example 42. Similar initial characteristics, low illuminance characteristics and durability to those obtained from Device No. 58-5 were obtained.

The composition of the photovoltaic device according to Example 58 (Device No. Example 58) was analyzed by the secondary ion mass analyzer. As a result, a fact was confirmed that D atoms were contained in the i-layer. Thus, the effect of the present invention was confirmed.

EXAMPLE 59

A photovoltaic device (Device No. Example 59) was manufactured by, on the substrate, forming a reflecting layer, a reflection enhancing layer, an n-layer, an i-layer, a p-layer, a transparent electrode and a collecting electrode under the same conditions employed to manufacture the device (Device No. Example 42-5) except for that the DC bias of the bias power source 1011 was changed from 50 V to 80 V at a constant rate simultaneously with opening of the shutter 1013 at the time of forming the n-layer.

The initial characteristics, the low illuminance characteristics and the durability of the manufactured photovoltaic device (Device No. Example 59) were measured by a method similar to that employed in Example 42. Similar initial characteristics, low illuminance characteristics and durability to those obtained from the device (Device No. Example 42-5) were obtained. Thus, the effect of the present invention was confirmed.

EXAMPLE 60

A manufacturing apparatus for use in Example 42, comprising the raw material gas supply apparatus 1020 and the deposition apparatus 1100 and adapted to the RF plasma CVD method shown in FIG. 13 was used to form the n-layer and the p-layer under the same conditions as those according to Example 37 while employing the residual conditions which are the same according to Example 42. As a result, a photovoltaic device (Device No. Example 60) was manufactured.

The initial characteristics, the low illuminance characteristics and the durability of the manufactured photovoltaic device according to Example 60 (Device No. Example 60) were measured by a method similar to that employed in Example 42. As a result of the measurements, the photovoltaic device according to Example 60 (Device No. Example 60) exhibited superior characteristics to the photovoltaic device according to Example 37 (Device No. Example 37) such that a 1.04 times of the open voltage of the initial characteristics, a 1.03 times of the curve factor of the same, a 1.07 times of the photoelectrical conversion efficiency of the low illuminance characteristics and a 1.08 times of the photoelectrical conversion efficiency of the durability characteristics were exhibited. Thus, the effect of the present invention was confirmed.

EXAMPLE 61

A photovoltaic device (Device No. Example 61) was manufactured by, on the substrate, forming a reflecting layer, a reflection enhancing layer, a first n-layer, a first i-layer, a first p-layer, a second n-layer, a second i-layer, a second p-layer, a transparent electrode and a collecting electrode under the manufacturing conditions shown in Table 22 except for that the BF$_3$(2000 ppm)/H$_2$ gas was allowed to flow by 0.3 sccm and the PH$_3$(2000 ppm)/H$_2$ gas was allowed to flow by 0.5 sccm at the time of forming the first i-layer.

The initial characteristics, the low illuminance characteristics and the durability of the manufactured photovoltaic device according to Example 61 (Device No. Example 61) were measured by a method similar to that employed in Example 42. As a result of the measurements, the photovoltaic device according to Example 61 (Device No. Example 61) exhibited superior characteristics to the photovoltaic device (Device No. Example 38) manufactured in such a manner that the BF$_3$(2000 ppm)/H$_2$ gas and the PH$_3$(2000 ppm)/H$_2$ gas were not introduced such that a 1.04 times of the open voltage of the initial characteristics, a 1.03 times of the curve factor of the same, a 1.07 times of the photoelectrical conversion efficiency of the low illuminance characteristics and a 1.06 times of the photoelectrical conversion efficiency of the durability characteristics were exhibited. Thus, the effect of the present invention was confirmed.

EXAMPLE 62

A photovoltaic device (Device No. Example 62) was manufactured by, on the substrate, forming a reflecting layer, a reflection enhancing layer, a first n-layer, a first i-layer, a first p-layer, a second n-layer, a second i-layer, a second p-layer, a third n-layer, a third i-layer, a third p-layer, a transparent electrode and a collecting electrode under the manufacturing conditions shown in Table 23 except for that the $BF_3$(2000 ppm)/$H_2$ gas was allowed to flow by 1 sccm, the $PH_3$(2000 ppm)/$H_2$ gas by 0.3 sccm at the time of forming the first i-layer and that the $BF_3$(2000 ppm)$H_2$ gas was allowed to flow by 0.5 sccm and the $PH_3$(2000 ppm)/$H_2$ gas was allowed to flow by 0.1 sccm at the time of forming the second i-layer.

The initial characteristics, the low illuminance characteristics and the durability of the manufactured photovoltaic device according to Example 62 (Device No. Example 62) were measured by a method similar to that employed in Example 42. As a result of the measurements, the photovoltaic device according to Example 62 (Device No. Example 62) exhibited superior characteristics to the photovoltaic device according to Example 39 (Device No. Example 39) such that a 1.03 times of the open voltage of the initial characteristics, a 1.03 times of the curve factor of the same, a 1.08 times of the photoelectrical conversion efficiency of the low illuminance characteristics and a 1.07 times of the photoelectrical conversion efficiency of the durability characteristics were exhibited. Thus, the effect of the present invention was confirmed.

EXAMPLE 63

A photovoltaic device according to the present invention was manufactured by using the separated multi-chamber deposition apparatus shown in FIG. 15 in accordance with the procedure according to Example 39.

The initial characteristics, the low illuminance characteristics and the durability of the manufactured photovoltaic device (Device No. Example 63) were measured by a method similar to that employed in Example 42. As a result of the measurements, the photovoltaic device according to Example 63 (Device No. Example 63) exhibited superior characteristics to the photovoltaic device according to Example 61 (Device No. Example 61) such that a 1.01 times of the open voltage of the initial characteristics, a 1.02 times of the curve factor of the same, a 1.03 times of the photoelectrical conversion efficiency of the low illuminance characteristics and a 1.02 times of the photoelectrical conversion efficiency of the durability characteristics were exhibited. By manufacturing the photovoltaic device according to the present invention in the separated multi-chamber deposition apparatus, an improved photovoltaic device can be obtained. Thus, the effect of the present invention was confirmed.

EXAMPLE 64

A photovoltaic device was manufactured under the same conditions as those employed in Example 61, the photovoltaic device being used to manufacture a solar cell module to manufacture a ventilating fan to be mounted on a vehicle and having a circuit arranged as shown in FIG. 26.

As a comparative example, a photovoltaic device was manufactured under the same conditions according to Example 38, the photovoltaic device being used to manufacture a ventilating fan arranged similarly to Example 64.

The vehicle to which the ventilating fans according to Example 64 and the comparative example was allowed to stand for 168 hours in an idling state in which the engine was rotated. Then, the engine rotation was stopped and allowed to stand while operating the ventilating fan under the sunshine. The temperature in the compartment of the vehicle was measured. As a result, the vehicle cooling fan according to Example 64 exhibited superior performance to that of the cooling fan to be mounted on a vehicle according to the comparative example. Thus, the effect of the generating system according to the present invention was confirmed.

As described above, according to the present invention, there is provided a photovoltaic device in which recombination of the carrier excited by light can be prevented, the open voltage and the carrier range of positive holes can be improved and the photoelectrical conversion efficiency can be improved. Further, the photovoltaic device according to the present invention is able to improve the conversion efficiency in a case of the intensity of irradiation light is weak. In addition, the photoelectrical conversion efficiency of the photovoltaic device according to the present invention cannot easily deteriorate even if it is annealed while being vibrated for a long time.

Further, the power source system using the photovoltaic device according to the present invention is able to exhibit excellent power supply performance in a case of the intensity of irradiation light is weak.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A photoelectrical conversion device comprising:

a p-layer;

an i-layer; and an n-layer, wherein said photoelectrical conversion device is formed by stacking said p-layer, said i-layer and said n-layer, each of said i-layer and said n-layer made of non-single-crystal silicon semiconductor, said i-layer contains germanium atoms, the band gap of said i-layer is smoothly changed in a direction of thickness of said i-layer, the minimum value of said band gap is positioned in said i-layer between (i) a midpoint between an interface between said n-layer and said i-layer and an interface between said i-layer and said p-layer and (ii) said interface between said i-layer and said p-layer, both of a valence control agent serving as a donor and another valence control agent serving as an acceptor are doped into said i-layer, and an area of thickness 1–30 nm and of a constant energy band gap greater than the minimum value of said band gap is provided at at least one of an interface between the p- and i-layers and between the n- and i-layers wherein at least one of (a) and (b) is present, wherein in said (a) said p-layer comprises a stack of a first layer mainly comprising a Group III element and a second layer mainly comprising silicon and containing the Group III element as a valence controlling agent and wherein in said (b) said n-layer comprises a stack of (i) a layer mainly comprising a Group V element and (ii) a layer mainly comprising silicon and containing the Group V element as a valence controlling agent.

2. A photoelectrical conversion device according to claim 1, wherein the thickness of said layer mainly comprised of said at least one of group III elements of the periodic table and group V elements of the periodic table is 1 nm or less.

3. A photoelectrical conversion device according to claim 1, wherein said valence control agent serving as the donor is a group III element of the periodic table and said valence control agent serving as the acceptor is a group V element.

4. A photoelectrical conversion device according to claim 1, wherein said valence control agent serving as the donor and said valence control agent serving as the acceptor are distributed in said i-layer.

5. A photoelectrical conversion device according to claim 1, wherein the maximum value of said band gap of said i-layer is present in at least any one of interfaces among said i-layer, said p-layer and said n-layer, and the region of said maximum value of said band gap is 1 to 30 nm.

6. A photoelectrical conversion device according to claim 1, wherein said i-layer contains at least one of oxygen atoms and nitrogen atoms.

7. A photoelectrical conversion device according to claim 1, wherein the content of hydrogen contained in said i-layer is changed to correspond to the content of silicon atoms.

8. A photoelectrical conversion device according to claim 1, wherein said i-layer is formed by causing microwave energy and RF energy to simultaneously act, at a degree of vacuum of internal pressure of 50 mTorr or lower, on a raw material gas including a silicon-atom-contained gas and a germanium-atom-contained gas, said microwave energy is smaller than microwave energy needed to completely decompose said raw material gas, and said RF energy is larger than said microwave energy.

9. A photoelectrical conversion device according to claim 8, wherein said silicon-atom-contained gas and said germanium-atom-contained gas are mixed at a position of 5 m or shorter away from a deposition chamber.

10. A generating system comprising a photoelectrical conversion device according to claim 1 and a control system that detects at least one of the voltage and an electrical current of said photoelectrical conversion device to control electric power to be supplied to a load.

11. A generating system according to claim 10, wherein said load is a battery for at least one of accumulating the electric power supplied from said photoelectrical conversion device and supplying the electric power to an external load.

12. A photoelectrical conversion device according to claim 3, wherein the contents of said group III atoms and said group V atoms are 1000 ppm or less.

13. A photoelectrical conversion device according to claim 3, wherein said group III atoms and said group V atoms are so contained as to be compensated simultaneously.

14. A photoelectrical conversion device according to claim 5, wherein the quantity of said valence control agent is enlarged in a portion in which said band gap is narrower and the quantity of said valence control agent is reduced in a portion in which said band gap is wider than said narrower portion.

15. A photoelectrical conversion device according to claim 5, wherein said valence control agent is contained by a larger quantity in at least one of an interface region between said p-layer and said i-layer and an interface region between said n-layer and said i-layer in said region in which said band gap is maximum than the quantity of said valence control agent contained in a region in which said band gap is minimum.

16. A photoelectrical conversion device according to claim 1, wherein the minimum value of said band gap of said i-layer containing silicon atoms and germanium atoms is 1.1 to 1.6 eV.

17. A photoelectrical conversion device according to claim 1, wherein at least one of said n-layer and said p-layer containing said valence control agent and mainly comprised of silicon atoms is in contact with said i-layer.

18. A photoelectrical conversion device according to claim 1 further comprising a transparent electrode formed in contact with at least one of said n-layer and said p-layer containing said valence control agent and mainly comprised of silicon atoms.

19. A photoelectrical conversion device according to claim 6, wherein at least one of said oxygen and said nitrogen is contained in a quantity of 100 ppm or less.

20. A photoelectrical conversion device according to claim 1, wherein at least one of said p-layer and said n-layer containing said valence control agent and mainly comprised of silicon atoms contains said valence control agent in amounts of 1500 to 10000 ppm.

21. A photoelectrical conversion device according to claim 2, wherein at least one of said p-layer and said n-layer containing said valence control agent and mainly comprised of silicon atoms contains hydrogen in amount of 5% or less.

22. A photoelectrical conversion device comprising:
a p-layer;
an i-layer; and
an n-layer, wherein said photoelectrical conversion device is formed by stacking said p-layer, said i-layer and said n-layer, each of said i-layer and said n-layer made of non-single-crystal silicon semiconductor, said i-layer contains germanium atoms, the band gap of said i-layer is smoothly changed in a direction of thickness of said i-layer, the minimum value of said band gap is positioned in said i-layer between (i) a midpoint between an interface between said n-layer and said i-layer and an interface between said i-layer and said p-layer and (ii) said interface between said i-layer and said p-layer and an area of thickness 1–30 nm and of a constant energy band gap greater than the minimum value of said band gap is provided at least one of an interface between the p- and i-layers and between the n- and i-layers wherein at least one of (a) and (b) is present, wherein in said (a) said p-layer comprises a stack of a first layer mainly comprising a Group III element and a second layer mainly comprising silicon and containing Group III element as a valence controlling agent and wherein in said (b) said n-layer comprises a stack of (i) a layer mainly comprising a Group V element and (ii) a layer mainly comprising silicon and containing the Group III element as a valence controlling agent.

23. A photoelectrical conversion device according to claim 22, wherein the thickness of said layer mainly comprised of at least one of group III elements of the periodic table and group V elements of the periodic table is 1 nm or less.

24. A photoelectrical conversion device according to claim 22, wherein the maximum value of said band gap of said i-layer is present in at least any one of interfaces among said i-layer, said p-layer and said n-layer, and the region of said maximum value of said band gap is 1 to 30 nm.

25. A photoelectrical conversion device according to claim 22, wherein said i-layer contains at least one of oxygen atoms and nitrogen atoms.

26. A photoelectrical conversion device according to claim 22, wherein the content of hydrogen contained in said i-layer is changed to correspond to the content of silicon atoms.

27. A photoelectrical conversion device according to claim 22, wherein said i-layer is formed by causing microwave energy and RF energy to simultaneously act, at a degree of vacuum of internal pressure of 50 mTorr or lower, on a raw material gas including a silicon-atom-contained gas and a germanium-atom-contained gas, said microwave energy is smaller than microwave energy needed to completely decompose said raw material gas, and said RF energy is larger than said microwave energy.

28. A generating system comprising a photoelectrical conversion device according to claim 22 and a control system that detects at least one of the voltage and an electric current of said photoelectrical conversion device to control electric power to be supplied to a load.

29. A generating system according to claim 28, wherein said load is a battery for at least one of accumulating the electric power supplied from said photoelectrical conversion device and supplying the electric power to an external load.

30. A photoelectrical conversion device according to claim 22, wherein the minimum value of said band gap of said i-layer containing silicon semiconductor and germanium atoms is 1.1 to 1.6 eV.

31. A photoelectrical conversion device according to claim 22, wherein at least one of said n-layer and said p-layer containing said valence control agent and mainly comprised of silicon atoms is in contact with said i-layer.

32. A photoelectrical conversion device according to claim 22 further comprising a transparent electrode formed in contact with at least one of said n-layer and said p-layer containing said valence control agent and mainly comprised of silicon atoms.

33. A photoelectrical conversion device according to claim 25, wherein at least one of said oxygen and said nitrogen is contained in a quantity of 100 ppm or less.

34. A photoelectrical conversion device according to claim 22, wherein at least one of said p-layer and said n-layer containing said valence control agent and mainly comprised of silicon atoms contains said valence control agent in amounts of 1500 to 10000 ppm.

35. A photoelectrical conversion device according to claim 22, wherein at least one of said p-layer and said n-layer containing said valence control agent and mainly comprised of silicon atoms contains hydrogen in amounts of 5% or less.

36. A photoelectrical conversion device comprising:

a p-layer;

an i-layer; and an n-layer, wherein said photoelectrical conversion device is formed by stacking said p-layer, said i-layer and said n-layer, each of said i-layer and said n-layer made of non-single-crystal silicon semiconductor, said i-layer contains a material for varying the energy band gap of said i-layer such that said energy band gap is smoothly changed in a direction of thickness of said i-layer, the minimum value of said band gap is positioned in said i-layer between (i) a midpoint between an interface between said n-layer and said i-layer and an interface between said i-layer and said p-layer and (ii) said interface between said i-layer and said p-layer, both of a valence control agent serving as a donor and another valence control agent serving as an acceptor area doped into said i-layer, and an area of thickness 1–30 nm and of a constant energy band gap greater than the minimum value of said band gap is provided at at least one of an interface between the p- and i- layers and between the n- and i- layers wherein at least one of (a) and (b) is present, wherein in said (a) said p-layer comprises a stack of a first layer mainly comprising a Group III element and a second layer mainly comprising silicon and containing the Group III element as a valence controlling agent and wherein in said (b) said n-layer comprises a stack of (i) a layer mainly comprising a Group V element and (ii) a layer mainly comprising silicon and containing the Group III element as a valence controlling agent.

37. A photoelectrical conversion device according to claim 36, wherein the thickness of said layer mainly composed of said at least one of group III elements of the periodic table and group V elements of the periodic table is 1 nm or less.

38. A photoelectrical conversion device according to claim 36, wherein said valence control agent serving as the donor is a group III element of the periodic table and said valence control agent serving as the acceptor is a group V element.

39. A photoelectrical conversion device according to claim 36, wherein said valence control agent serving as the donor and said valence control agent serving as the acceptor are distributed in said i-layer.

40. A photoelectrical conversion device according to claim 36, wherein the maximum value of said band gap of said i-layer is present in at least any one of interfaces among said i-layer, said p-layer and said n-layer, and the region of said maximum value of said band gap is 1 to 30 nm.

41. A photoelectrical conversion device according to claim 36, wherein said i-layer contains at least one of oxygen atoms and nitrogen atoms.

42. A photoelectrical conversion device according to claim 36, wherein the content of hydrogen contained in said i-layer is changed to correspond to the content of silicon atoms.

43. A photoelectrical conversion device according to claim 36, wherein said i-layer is formed by causing microwave energy and RF energy to simultaneously act, at a degree of vacuum of internal pressure to 50 mTorr or lower, on a raw material gas including a silicon-atom-contained gas and a germanium-atom-contained gas, said microwave energy smaller than microwave energy needed to completely decompose said raw material gas, and said RF energy larger than said microwave energy.

44. A photoelectrical conversion device according to claim 43, wherein said silicon-atom-contained gas and said germanium-atom-contained gas are mixed at a position of 5 m or shorter away from a deposition chamber.

45. A generating system comprising a photoelectrical conversion device according to claim 36 and a control system that detects at least one of the voltage and an electric current of said photoelectrical conversion device to control electric power to be supplied to a load.

46. A generating system according to claim 45, wherein said load is a battery for at least one of accumulating the electric power supplied from said photoelectrical conversion device and supplying the electric power to an external load.

47. A photoelectrical conversion device according to claim 38, wherein the contents of said group III atoms and said group V atoms are 1000 ppm or less.

48. A photoelectrical conversion device according to claim 38, wherein said group III atoms and said group V atoms are so contained as to be compensated simultaneously.

49. A photoelectrical conversion device according to claim 39, wherein the quantity of said valence control agent is enlarged in a portion in which said band gap is narrower and the quantity of said valence control agent is reduced in a portion in which said band gap is wider.

50. A photoelectrical conversion device according to claim 40, wherein said valence control agent is contained by a larger quantity in at least one of an interface region between said p-layer and said i-layer and an interface region between said n-layer and said i-layer in said region in which said band gap is maximum than the quantity of said valence control agent contained in a region in which said band gap is minimum.

51. A photoelectrical conversion device according to claim 40, wherein the minimum value of said band gap of said i-layer containing silicon atoms and germanium atoms is 1.1 to 1.6 eV.

52. A photoelectrical conversion device according to claim 36, wherein at least one of said n-layer and said p-layer containing said valence control agent and mainly comprised of silicon atoms is in contact with said i-layer.

53. A photoelectrical conversion device according to claim 36 further comprising a transparent electrode formed in contact with at least one of said n-layer and said p-layer containing said valence control agent and mainly comprised of silicon atoms.

54. A photoelectrical conversion device according to claim 41, wherein at least one of said oxygen and said nitrogen is contained in a quantity of 100 ppm or less.

55. A photoelectrical conversion device according to claim 36, wherein at least one of said p-layer and said n-layer containing said valence control agent and mainly comprised of silicon atoms contains said valence control agent in amounts of 1500 to 10000 ppm.

56. A photoelectrical conversion device according to claim 36, wherein at least one of said p-layer and said n-layer containing said valence control agent and mainly comprised of silicon atoms contains hydrogen in amounts of 5% or less.

57. A photoelectrical conversion device comprising:

a p-layer:

an i-layer; and an n-layer, wherein said photoelectrical conversion device is formed by stacking said p-layer, said i-layer and said n-layer, each of said i-layer and said n-layer made of non-single-crystal silicon semiconductor, said i-layer contains a material for varying the energy band gap of said i-layer such that said energy band gap is smoothly changed in a direction of thickness of said i-layer, the minimum value of said band gap is positioned in said i-layer between (i) a midpoint between an interface between said n-layer and said i-layer and an interface between said i-layer and said p-layer and (ii) said interface between said i-layer and said p-layer and an area of thickness of 1–30 mm and of a constant energy band gap greater than the minimum value of said band gap provided at at least one of an interface between the p- and i-layers and between the n- and i-layers wherein at least one of (a) and (b) is present, wherein in said (a) said p-layer comprises a stack of a first layer mainly comprising a Group III element and a second layer mainly comprising silicon and containing the Group III element as a valence controlling agent and wherein in said (b) said n-layer comprises a stack of (i) a layer mainly comprising a Group V element and (ii) a layer mainly comprising silicon and containing the Group III element was a valence controlling agent.

58. A photoelectrical conversion device according to claim 57, wherein the thickness of said layer mainly composed of at least one of group III elements of the periodic table and group V elements of the periodic table is 1 nm or less.

59. A photoelectrical conversion device according to claim 57, wherein the maximum value of said band gap of said i-layer is present in at least any one of interfaces among said i-layer, said p-layer and said n-layer, and the region of said maximum value of said band gap is 1 to 30 nm.

60. A photoelectrical conversion device according to claim 57, wherein said i-layer contains at least one of oxygen atoms and nitrogen atoms.

61. A photoelectrical conversion device according to claim 57, wherein the content of hydrogen contained in said i-layer is changed to correspond to the content of silicon atoms.

62. A photoelectrical conversion device according to claim 57, wherein said i-layer is formed by causing microwave energy and RF energy to simultaneously act, at a degree of vacuum of internal pressure of 50 mTorr or lower, on a raw material gas including a silicon-atom-contained gas and a germanium-atom-contained gas, said microwave energy smaller than microwave energy needed to completely decompose said raw material gas, and said RF energy larger than said microwave energy.

63. A generating system comprising a photoelectrical conversion device according to claim 57 and a control system that detects at least one of the voltage and an electric current of said photoelectrical conversion device to control electric power to be supplied to a load.

64. A photoelectrical conversion device according to claim 57, wherein said silicon-atom-contained gas and said germanium-atom-contained gas are mixed at a position of 5 m or shorter way from a deposition chamber.

65. A generating system according to claim 64, wherein said load is a battery for at least one of accumulating the electric power supplied from said photoelectrical conversion device and supplying the electric power to an external load.

66. A photoelectrical conversion device according to claim 57, wherein the minimum value of said band gap of said i-layer containing silicon atoms and germanium atoms is 1.1 to 1.6 eV.

67. A photoelectrical conversion device according to claim 57, wherein at least one of said n-layer and said p-layer containing said valence control agent and mainly comprised of silicon atoms is in contact with said i-layer.

68. A photoelectrical conversion device according to claim 57 further comprising a transparent electrode formed in contact with at least one of said n-layer and said p-layer containing said valence control agent and mainly comprised of silicon atoms.

69. A photoelectrical conversion device according to claim 60, wherein at least one of said oxygen and said nitrogen is contained in a quantity of 100 ppm or less.

70. A photoelectrical conversion device according to claim 57, wherein at least one of said p-layer and said n-layer containing said valence control agent and mainly comprised of silicon atoms contains said valence control agent in amounts of 1500 to 10000 ppm.

71. A photoelectrical conversion device according to claim 57, wherein at least one of said p-layer and said n-layer containing said valence control agent and mainly comprised of silicon atoms contains hydrogen in amounts of 5% or less.

72. A photoelectrical conversion device comprising:

a p-type semiconductor;

an i-type semiconductor comprising silicon; and an n-type semiconductor, stacked to form a p-i-n junction, wherein at least one of (a) and (b) is present, wherein in said (a) said p-type semiconductor comprises a stack of (i) a first layer mainly comprising a Group III element and (ii) a second layer including the Group III element as a valence control agent and mainly comprising silicon and in said (b) said n-type semiconductor comprises a stack of (i) a layer mainly comprising a Group V element and (ii) a layer including the Group V element as a valence control agent and mainly comprising silicon.

73. A photoelectric conversion device according to claim 72, wherein each of said first layer mainly comprising a Group III element and the layer mainly comprising a Group V element is 1 nm or less in thickness.

74. A photoelectric conversion device according to claim 72, wherein the maximum value of said band gap of said i-layer is present in at least any one of the interfaces among said i-layer, said p-layer and said n-layer, and the region of said maximum value of said band gap is 1–30 nm.

75. A photoelectrical conversion device according to claim 72, wherein said i-layer contains at least one of oxygen atoms and nitrogen atoms.

76. A photoelectrical conversion device according to claim 72, wherein the content of hydrogen contained in said i-layer is changed to correspond to the content of silicon atoms.

77. A photoelectrical conversion device according to claim 72, wherein said i-layer is formed by causing microwave energy and RF energy to simultaneously act, at a degree of vacuum of internal pressure of 50 m Torr or lower, on a raw material gas including a silicon-atom-contained gas and a germanium-atom-contained gas, said microwave energy is smaller than microwave energy needed to completely decompose said raw material gas, and said RF energy is larger than said microwave energy.

78. A photoelectrical conversion device according to claim 77, wherein said silicon-atom-contained gas and said germanium-atom-contained gas are mixed at a position of 5 m or shorter away from a deposition chamber.

79. A photoelectrical conversion device according to claim 72 in combination with a control system that detects at least one of the voltage and an electrical current of said photoelectrical conversion device to control electric power to be supplied to a load.

80. A photoelectric conversion device according to claim 79, wherein said load is a battery for at least one of accumulating the electric power supplied from said photoelectrical conversion device and supplying the electric power to an external load.

81. A photoelectrical conversion device according to claim 72, wherein the minimum value of said band gap of said i-layer containing silicon atoms and germanium atoms is 1.1 to 1.6 eV.

82. A photoelectrical conversion device according to claim 72, wherein at least one of said n-layer and said p-layer containing said valence control agent and mainly comprised of silicon atoms is in contact with said i-layer.

83. A photoelectrical conversion device according to claim 72 further comprising a transparent electrode formed in contact with at least one of said n-layer and said p-layer containing said valence control agent and mainly comprised of silicon atoms.

84. A photoelectrical conversion device according to claim 75, wherein at least one of said oxygen and said nitrogen is contained in a quantity of 100 ppm or less.

85. A photoelectrical conversion device according to claim 72, wherein at least one of said p-layer and said n-layer containing said valence control agent and mainly comprised of silicon atoms contains said valence control agent in amounts of 1500 to 10000 ppm.

86. A photoelectrical conversion device according to claim 72, wherein at least one of said p-layer and said n-layer containing said valence control agent and mainly comprised of silicon atoms contains hydrogen in an amount of 5% or less.

87. A photoelectrical conversion device according to claim 22, wherein said silicon-atom-contained gas and said germanium-atom-contained gas are mixed at a position of 5 m or less away from a deposition chamber.

* * * * *

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.          Page 1 of 11

It is certified that error appears in the above-identified patent and that said Letters Patent is hereby corrected as shown below:

On the title page, item:

[56] REFERENCES CITED

Other Publications, under Sato et al.,
"Specialiest" should read --Specialists-- and
under Pawliliewicz et al.,
"Pawliliewicz" should read --Pawlikiewicz--.

COLUMN 1

Line 17, "Hithero" should read --Hither to--.
Line 20, "have" should read --having--.
Line 27, "Specialist" should read --Specialists--.
Line 29, "solor" should read --solar--.
Line 49, "are" should read --is--.

COLUMN 2

Line 28, "even" should read --even when--.
Line 32, "achieve" should read --achieves--.

COLUMN 3

Line 56, "appear" should read --apparent--.

COLUMN 5

Line 13, "concentrate" should read --concentration--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

It is certified that error appears in the above-identified patent and that said Letters Patent is hereby corrected as shown below:

COLUMN 6

Line 60, "unbounded hands" should read --unbounded electron pairs--.

COLUMN 7

Line 1, "hands" should read --electron pairs--.
Line 3, "hands" should read --electron pairs--.
Line 9, "satisfactory" should read --satisfactorily--.
Line 29, "valance" should read --valence--.
Line 64, "must meet" should be deleted.

COLUMN 11

Line 3, "text" should be deleted.
Line 5, "be" should read --been--.
Line 7, "a energy" should read --an energy--.
Line 42, "spark" should read --sparking--.
Line 44, "longtime" should read --time--.
Line 60, "realized" should read --realize--.

COLUMN 13

Line 15, "±2%" should read --±2% of--.
Line 52, "source. 1111," should read --source 1111,--.

COLUMN 14

Line 11, "dement" should read --element--.
Line 42, "or" should read --or BABABABAB.--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

Page 3 of 11

It is certified that error appears in the above-identified patent and that said Letters Patent is hereby corrected as shown below:

COLUMN 15

Line 15, "staging" should read --starting--.
Line 51, "as," should read --as--.

COLUMN 16

Line 25, "NaxWO3." should read --$Na_xWO_3$.--.
Line 59, "by" should read --be--.
Line 67, " hands" should read --electron pairs--.

COLUMN 17

Line 57, "phosphors" should read --phosphorus--.

COLUMN 18

Line 59, "hands" should read --electron pairs--.

COLUMN 19

Line 66, "hand" should read --electron pair--.

COLUMN 20

Line 18, "where-the" should read --where the--.
Line 49, "deposited" should read --deposit--.

COLUMN 21

Line 35, "comprises" should read --comprise--.
Line 36, "comprises" should read --comprise--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

It is certified that error appears in the above-identified patent and that said Letters Patent is hereby corrected as shown below:

COLUMN 22

Line 3, "an" should read --a--.

COLUMN 23

Line 6, "level" should read --level of--.
    Line 15, "formed,by" should read --formed by--.

COLUMN 29

Line 25, "was" should read --were--.

COLUMN 31

Line Table 4, Example 7-6, "so" should read --50--.

COLUMN 32

Line 5, "Coning)" should read --Corning)--.
    Table 5, "$(W/cm^3)$" should read --$(W/cm^3)(\%)$--.

COLUMN 34

Line 19, "can-be" should read --can be--.

COLUMN 38

Line 39, "a substrates" should read --a substrate--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

Page 5 of 11

It is certified that error appears in the above-identified patent and that said Letters Patent is hereby corrected as shown below:

COLUMN 40

Table 9, "Enhaning" should read --Enhancing-- and in p-layer, "$SiH_2$" should read --$SiH_4$--
Line 43, "(200 ppm)/$H_2$" should read --(2000 ppm)/$H_2$--.
Line 66, "was" should read --were--.

COLUMN 41

Table 10, "70 mn" should read --70 nm--.

COLUMN 42

Line 51, "was" should read --were--.

COLUMN 43

Table 11, in First i-layer,
"$P_3/H_2$" should read --$PH_3/H_2$--,
"170 " should read --170--, and
DCOV
"RF 350 " should read --RF 350 (mW/cm$^3$) DCOV--.
(mW/cm$^3$)

in Third p-layer,
"25" should be deleted,
"300" should read --25--,
"5" should read --300--, and
under Thickness of Layer, insert --5--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

It is certified that error appears in the above-identified patent and that said Letters Patent is hereby corrected as shown below:

COLUMN 45

Line 1, "was" should read --were--.
Line 17, "respective" should read --respectively--.

COLUMN 46

Line 10, "was" should read --were--.
Line 34, "to which" should read ---on which--.

COLUMN 49

Table 12, in Reflecting Layer,
"100 mn" should read --100 nm--,
under Gas and Quantity,
"Quantity" should read --Flow--,
"PH/$H_2$" should read --$PH_3/H_2$--,
"BFI$H_2$" should read --$BF_3H_2$--, and
"Correcting" should read --Collecting--.

COLUMN 50

Line 37, "Coning)" should read --Corning)--.

COLUMN 52

Line 24, "Coning)" should read --Corning)--.

COLUMN 53

Line 54, "tile" should read --of the--.

UNITED STATES PATENT AND TRADEMARK OFFICE
CERTIFICATE OF CORRECTION

PATENT NO. : 5,563,425

DATED : October 8, 1996

INVENTOR(S) : KEISHI SAITO ET AL.

It is certified that error appears in the above-identified patent and that said Letters Patent is hereby corrected as shown below:

COLUMN 54

Table 16, "Thickness" should read --Thickness of-- and "Example 23-1" should read --Example 23-8--.

COLUMN 56

Line 50, "of" should read --on--.

COLUMN 58

Table 18, "thosc" should read --those--.

COLUMN 59

Table 19, under Thickness of Layer
"03" should read --0.3-- and
under Gas and Flow of Gas,
"$PH_3/H_4$" should read --$PH_3/H_2$--.

COLUMN 60

Table 20, under Thickness Layer,
"Thickness" should read --Thickness of-- and
"03" should read --0.3--.
under Gas and Flow of Gas,
"100o" should read --100--.

COLUMN 62

Line 2, "substrates" should read --substrate--.

UNITED STATES PATENT AND TRADEMARK OFFICE
CERTIFICATE OF CORRECTION

PATENT NO.  : 5,563,425
DATED       : October 8, 1996
INVENTOR(S) : KEISHI SAITO ET AL.

It is certified that error appears in the above-identified patent and that said Letters Patent is hereby corrected as shown below:

COLUMN 63

Table 21, "(Torr" should read --(Torr)--.

COLUMN 64

Line 22, "Examples 38" should read --Example 38--.

COLUMN 65

Table 22, in First i-layer, under Gas and Flow of the Gas, "SiH$_4$    170" should read --SiH$_4$--,
under Discharge Power,
"Microwave            --Microwave
 (mW/cm$^3$)             170
 (mW/cm$^3$) " should read  (mW/cm$^3$) --.
under Bias,
"RF 350    should read --RF 350
                              (mW/cm$^3$)
 DC0V "                  DC0V        --.
in Doping Layer A, under Bias,
"20" should be deleted,
under Pressure, "250" should read --20--,
under Temperature of Substrate,
"0.3" should read --250--, and
under Thickness of Layer, insert --0.3--.
in Collecting Electrode,
"(AI)" should read --(Al)-- and
"2 mm" should read --2 μm--

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

It is certified that error appears in the above-identified patent and that said Letters Patent is hereby corrected as shown below:

COLUMN 66

Line 51, "EXAMPLES 39" should read --EXAMPLE 39--.

COLUMN 67

Table 23, under Gas and Flow of the Gas,
in Doping Layer B1 in 1p-layer,
"$BF_3H_2$ 3" (2000 ppm) should read --$BF_3/H_2$ 3-- (2000 ppm).
in Doping Layer B1 in 2p-layer,
"$BF_3H_2$ 1" (2000 ppm) should read --$BF_3/H_2$ 1-- (2000 ppm).
in Collecting Electrode,
"Alummum" should read --Aluminum--.

COLUMN 71

Table 24, in (Note), "art" should read --are--.
Line 47, "that" should read --that the--.

COLUMN 73

Line 53, "have" should read --has--.
Line 65, "formed by only" should read --formed. Only--.

COLUMN 75

Table 27, "Example 43-6" should read --Example 43-8--.
Line 37, "$ASH_3$(2000 ppm)/$H_2$ should read --$A_5H_3$(2000 ppm)/$H_2$--.

UNITED STATES PATENT AND TRADEMARK OFFICE
CERTIFICATE OF CORRECTION

PATENT NO. : 5,563,425
DATED : October 8, 1996
INVENTOR(S) : KEISHI SAITO ET AL.

It is certified that error appears in the above-identified patent and that said Letters Patent is hereby corrected as shown below:

COLUMN 78

Line 2, "of" should read --on--.

COLUMN 81

Line 22, "i-layer," should read --i-layer.--.

COLUMN 84

Line 18, "case of" should read --case where--.
Line 25, "case of" should read --case where--.

COLUMN 85

Line 51, "claim 5," should read --claim 4,--.

COLUMN 86

Line 18, "claim 2," should read --claim 1,--.
Line 43, "Group III" should read --the Group III--.

COLUMN 89

Line 33, "p-layer:" should read --p-layer;--.
Line 60, "was" should read --as--.

UNITED STATES PATENT AND TRADEMARK OFFICE
CERTIFICATE OF CORRECTION

PATENT NO.  : 5,563,425
DATED       : October 8, 1996
INVENTOR(S) : KEISHI SAITO ET AL.

It is certified that error appears in the above-identified patent and that said Letters Patent is hereby corrected as shown below:

<u>COLUMN 90</u>

Line 27, "way" should read --away--.

Signed and Sealed this

Twentieth Day of May, 1997

*Attest:*

BRUCE LEHMAN

*Attesting Officer*    *Commissioner of Patents and Trademarks*